United States Patent
Fortney et al.

(10) Patent No.: US 11,762,050 B2
(45) Date of Patent: Sep. 19, 2023

(54) INTEGRATED MEASUREMENT SYSTEMS AND METHODS FOR SYNCHRONOUS, ACCURATE MATERIALS PROPERTY MEASUREMENT

(71) Applicant: Lake Shore Cryotronics, Inc., Westerville, OH (US)

(72) Inventors: Houston Fortney, Columbus, OH (US); Noah Faust, Columbus, OH (US)

(73) Assignee: Lake Shore Cryotronics, Inc., Westerville, OH (US)

( * ) Notice: Subject to any disclaimer, the term of this patent is extended or adjusted under 35 U.S.C. 154(b) by 19 days.

(21) Appl. No.: 17/241,472

(22) Filed: Apr. 27, 2021

(65) Prior Publication Data

US 2021/0333348 A1    Oct. 28, 2021

Related U.S. Application Data

(60) Provisional application No. 63/057,745, filed on Jul. 28, 2020, provisional application No. 63/034,052, (Continued)

(51) Int. Cl.
*G01R 35/00* (2006.01)
*G01R 19/25* (2006.01)
(Continued)

(52) U.S. Cl.
CPC .......... *G01R 35/005* (2013.01); *G01R 19/25* (2013.01); *G01R 31/2841* (2013.01);
(Continued)

(58) Field of Classification Search
CPC .. G01R 35/005; G01R 19/25; G01R 31/2841; H03M 1/0845; H03M 1/121; H03M 1/188
See application file for complete search history.

(56) References Cited

U.S. PATENT DOCUMENTS 3,293,556 A    12/1966    Kotzebue et al.
3,424,981 A    1/1969    Erdman
(Continued)

FOREIGN PATENT DOCUMENTS

EP    119711 A1    9/1984
EP    559657 B1    10/1994
(Continued)

OTHER PUBLICATIONS

International Search Report and Written Opinion from PCT/US2021/029328 dated Jul. 20, 2021.
(Continued)

*Primary Examiner* — Robert H Kim
*Assistant Examiner* — Christopher J Gassen
(74) *Attorney, Agent, or Firm* — Calfee, Halter & Griswold LLP

(57) ABSTRACT

A measurement system includes a source unit to provide a source signal to a sample and a voltage source and/or a current source and a memory. The system also includes a measurement unit configured to acquire from the sample an measurement signal that may be responsive to the source signal and a voltage measuring unit, a current measuring unit, and/or a capacitance measuring unit, and a memory. The system also includes a control unit including a digital signal processing unit; a source converter; a measurement converter. The system further includes a synchronization unit configured to synchronize clocks of the digital signal processing unit, the source converter, the measurement converter, the source unit, and the measurement unit; a calibration unit for calibrating aspects of the system including the control unit; and a reference voltage supply configured to supply a common reference voltage for the control unit.

20 Claims, 39 Drawing Sheets

Related U.S. Application Data filed on Jun. 3, 2020, provisional application No. 63/016,747, filed on Apr. 28, 2020.

(51) Int. Cl.
  *G01R 31/28* (2006.01)
  *H03M 1/08* (2006.01)
  *H03M 1/12* (2006.01)
  *H03M 1/18* (2006.01)

(52) U.S. Cl.
  CPC ......... *H03M 1/0845* (2013.01); *H03M 1/121* (2013.01); *H03M 1/188* (2013.01)

(56) References Cited

U.S. PATENT DOCUMENTS

| | | |
|---|---|---|
| 3,467,958 A | 9/1969 | Mckinney |
| 3,509,558 A | 4/1970 | Cancro |
| 3,626,252 A | 12/1971 | Cath |
| 3,654,560 A | 4/1972 | Cath et al. |
| 3,757,216 A | 9/1973 | Kurtin et al. |
| 3,757,241 A | 9/1973 | Kime et al. |
| 3,820,112 A | 6/1974 | Roth |
| 3,855,589 A | 12/1974 | Solender |
| 3,875,506 A | 4/1975 | Cath |
| 3,979,642 A | 9/1976 | Cath et al. |
| 4,069,479 A | 1/1978 | Carpenter et al. |
| 4,127,811 A * | 11/1978 | Gookin, Jr. .......... G01R 35/005 324/130 |
| 4,129,864 A | 12/1978 | Carpenter et al. |
| 4,383,247 A | 5/1983 | Assard |
| 4,449,120 A | 5/1984 | Rialan et al. |
| 4,542,346 A | 9/1985 | Mcneilly |
| 4,544,917 A | 10/1985 | Lenhoff, Jr. |
| 4,564,018 A * | 1/1986 | Hutchison .......... A61B 8/10 600/452 |
| 4,598,253 A | 7/1986 | Reindel et al. |
| 4,652,882 A | 3/1987 | Shovlin et al. |
| 4,674,062 A | 6/1987 | Premerlani |
| 4,733,217 A | 3/1988 | Dingwall |
| 4,807,146 A * | 2/1989 | Goodrich .......... H03D 1/2254 324/76.47 |
| 4,823,129 A | 4/1989 | Nelson |
| 4,847,523 A | 7/1989 | Schneider |
| 4,868,571 A | 9/1989 | Inamasu |
| 4,914,677 A | 4/1990 | Yamaguchi et al. |
| 4,999,628 A | 3/1991 | Kakubo et al. |
| 5,015,963 A | 5/1991 | Sutton |
| 5,023,552 A * | 6/1991 | Mehlkopf .......... G01R 33/56 324/309 |
| 5,039,934 A | 8/1991 | Banaska |
| 5,111,202 A | 5/1992 | Rivera et al. |
| 5,144,154 A * | 9/1992 | Banaska .......... H03K 17/163 327/384 |
| 5,210,484 A | 5/1993 | Remillard et al. |
| 5,250,948 A | 10/1993 | Berstein et al. |
| 5,353,027 A | 10/1994 | Vorenkamp et al. |
| 5,382,956 A * | 1/1995 | Baumgartner ...... H03F 3/45775 341/126 |
| 5,386,188 A | 1/1995 | Minneman et al. |
| 5,414,348 A | 5/1995 | Niemann |
| 5,422,643 A | 6/1995 | Chu et al. |
| 5,490,325 A | 2/1996 | Niemann et al. |
| 5,491,548 A | 2/1996 | Bell et al. |
| 5,684,480 A | 11/1997 | Jansson |
| 5,687,051 A * | 11/1997 | Seong .......... H02M 1/32 361/18 |
| 5,777,569 A | 7/1998 | Naruki et al. |
| 5,886,530 A | 3/1999 | Fasnacht et al. |
| 5,999,002 A | 12/1999 | Fasnacht et al. |
| 6,031,478 A | 2/2000 | Oberhammer et al. |
| 6,069,484 A | 5/2000 | Sobolewski et al. |
| 6,100,832 A | 8/2000 | Uesugi |
| 6,104,329 A | 8/2000 | Kawano |
| 6,271,780 B1 | 8/2001 | Gong et al. |
| 6,317,065 B1 | 11/2001 | Raleigh et al. |
| 6,333,707 B1 | 12/2001 | Dberhammer et al. |
| 6,445,328 B1 | 9/2002 | Francis |
| 6,501,255 B2 | 12/2002 | Pomeroy |
| 6,621,433 B1 | 9/2003 | Hertz |
| 6,683,552 B2 | 1/2004 | Noll et al. |
| 6,949,734 B2 | 9/2005 | Neff et al. |
| 6,977,502 B1 | 12/2005 | Hertz |
| 7,123,894 B2 | 10/2006 | Hessel et al. |
| 7,167,655 B2 | 1/2007 | Olivier |
| 7,248,199 B2 | 7/2007 | Asano et al. |
| 7,253,680 B2 | 8/2007 | Laletin |
| 7,365,664 B2 | 4/2008 | Caduff et al. |
| 7,590,196 B2 | 9/2009 | Gibbs |
| 7,676,208 B2 | 3/2010 | Hwang et al. |
| 7,903,008 B2 | 3/2011 | Regier |
| 7,923,985 B2 | 4/2011 | Goeke et al. |
| 8,009,075 B2 | 8/2011 | Currivan et al. |
| 8,180,309 B2 | 5/2012 | Kimmig et al. |
| 8,212,697 B2 | 7/2012 | Jansson et al. |
| 8,507,802 B1 | 8/2013 | Knauer |
| 8,571,152 B1 | 10/2013 | Chen et al. |
| 8,797,025 B2 | 8/2014 | Regier et al. |
| 8,841,964 B2 | 9/2014 | Hafizovic et al. |
| 8,860,505 B2 | 10/2014 | Hafizovic et al. |
| 9,244,103 B1 | 1/2016 | Haviland et al. |
| 9,323,878 B2 | 4/2016 | Shepherd et al. |
| 9,324,545 B2 | 4/2016 | Green et al. |
| 9,575,105 B1 * | 2/2017 | Witt .......... A61B 5/0531 |
| 9,645,193 B2 | 5/2017 | Niemann |
| 9,654,134 B2 | 5/2017 | Popovich et al. |
| 9,778,666 B2 | 10/2017 | Sobolewski |
| 10,284,217 B1 * | 5/2019 | Schneider .......... H03M 1/181 |
| 10,404,215 B2 | 9/2019 | Motzkau et al. |
| 2004/0162694 A1 | 8/2004 | Ricca et al. |
| 2005/0218971 A1 | 10/2005 | Elfman |
| 2007/0182429 A1 | 8/2007 | Goeke |
| 2008/0221805 A1 | 9/2008 | Andrews |
| 2009/0273338 A1 | 11/2009 | Goeke et al. |
| 2010/0103016 A1 | 4/2010 | Thomas et al. |
| 2011/0074476 A1 | 3/2011 | Heer et al. |
| 2012/0112949 A1 | 5/2012 | Morgan |
| 2013/0033947 A1 * | 2/2013 | Passedni .......... G11C 29/028 327/146 |
| 2013/0082854 A1 | 4/2013 | Keane |
| 2014/0145729 A1 | 5/2014 | Sobolewski |
| 2014/0354354 A1 | 12/2014 | Goeke |
| 2015/0168529 A1 * | 6/2015 | Regier .......... G01R 35/005 324/601 |
| 2015/0280648 A1 | 10/2015 | Vitali |
| 2016/0344401 A1 | 11/2016 | La Grou |
| 2017/0184415 A1 | 6/2017 | Vitali |
| 2020/0200821 A1 * | 6/2020 | Freidhof .......... G01R 31/31917 |
| 2021/0336628 A1 | 10/2021 | Fortney |
| 2021/0336629 A1 | 10/2021 | Fortney |
| 2023/0039369 A1 | 2/2023 | Fortney |

FOREIGN PATENT DOCUMENTS

| | | |
|---|---|---|
| EP | 1111795 A2 | 6/2001 |
| EP | 1655848 B1 | 11/2008 |
| EP | 3035062 A2 | 6/2016 |
| WO | 03009478 A2 | 1/2003 |
| WO | 2009143635 A1 | 12/2009 |

OTHER PUBLICATIONS

International Search Report and Written Opinion from PCT/US2021/029335 dated Aug. 5, 2021.

International Search Report and Written Opinion from PCT/US2021/029332 dated Aug. 12, 2021.

Edn, "The ABCs of interleaved ADCs," https://www.edn.com/the-abcs-of-interleaved-adcs/, Feb. 17, 2013, 8 pages.

Fifield, "Stretching the Dynamic Range of ADCs—a case study," EE Times, Oct. 9, 2012, 4 pages.

(56) References Cited

OTHER PUBLICATIONS

Gervasoni et al., "A General Purpose Lock-In Amplifier Enabling Sub-ppm Resolution," 30th Eurosensors Conference, EUROSENSORS 2016, Procedia Engineering 168, 2016, pp. 1651-1654.
Ghosh et al., "Mitigating timing errors in time-interleaved ADCs: a signal conditioning approach," 2013 IEEE International Symposium on Circuits and Systems (ISCAS), 2013, 4 pages.
Kester, "ADC Architectures I: The Flash Converter," Analog Devices, MT-020 Tutorial, 2009, 15 pages.
Kumar et al., "Design and Considerations of ADC0808 as Interleaved ADCs," International Journal of Advanced Scientific and Technical Research, Issue 4, vol. 1, Jan.-Feb. 2014, 11 pages.
Lin et al., "Chapter 3: Parallel-Sampling ADC Architecture for Multi-carrier Signals," Power-Efficient High-Speed Parallel-Sampling ADCs for Broadband Multi-carrier Systems, Analog Circuits and Signal Processing, Springer International Publishing, Switzerland, 2015, 28 pages.
Manganaro et al., "Interleaving ADCs: Unraveling the Mysteries," Analog Dialogue 49-07, Jul. 2015, 5 pages.
Reeder et al., "Pushing the State of the Art with Multichannel A/D Converters," Analog Dialogue 39-05, May 2005, 4 pages.
Stanford Research Systems, "About Lock-In Amplifiers, Application Note #3," www.thinkSRS.com, 9 pages.
Stutt, "Low-Frequency Spectrum of Lock-in Amplifiers," Research Laboratory of Electronics, Massachusetts Institute af Technology, Technical Report No. 105, Mar. 26, 1949, 22 pages.
Wikipedia, "Lock-in amplifier," https://en.wikipedia.org/wiki/Lock-in_amplifier, downloaded on Jul. 27, 2021, 5 pages.
Zurich Instruments, "Principles of lock-in detection and the state of the art," White Paper, Nov. 2016, 10 pages.
Office Action from U.S. Appl. No. 17/241,450 dated Feb. 17, 2022.
Notice of Allowance from U.S. Appl. No. 17/241,450 dated Jul. 22, 2022.
Office Action from U.S. Appl. No. 17/962,750 dated Apr. 13, 2023.
Office Action from CN Application No. 202180031617.8 dated Jun. 8, 2023.
Office Action from JP Application No. 2022-565606 dated Jun. 1, 2023.
Office Action from KR Application No. 10-2022-7041608 dated Jul. 3, 2023.

\* cited by examiner

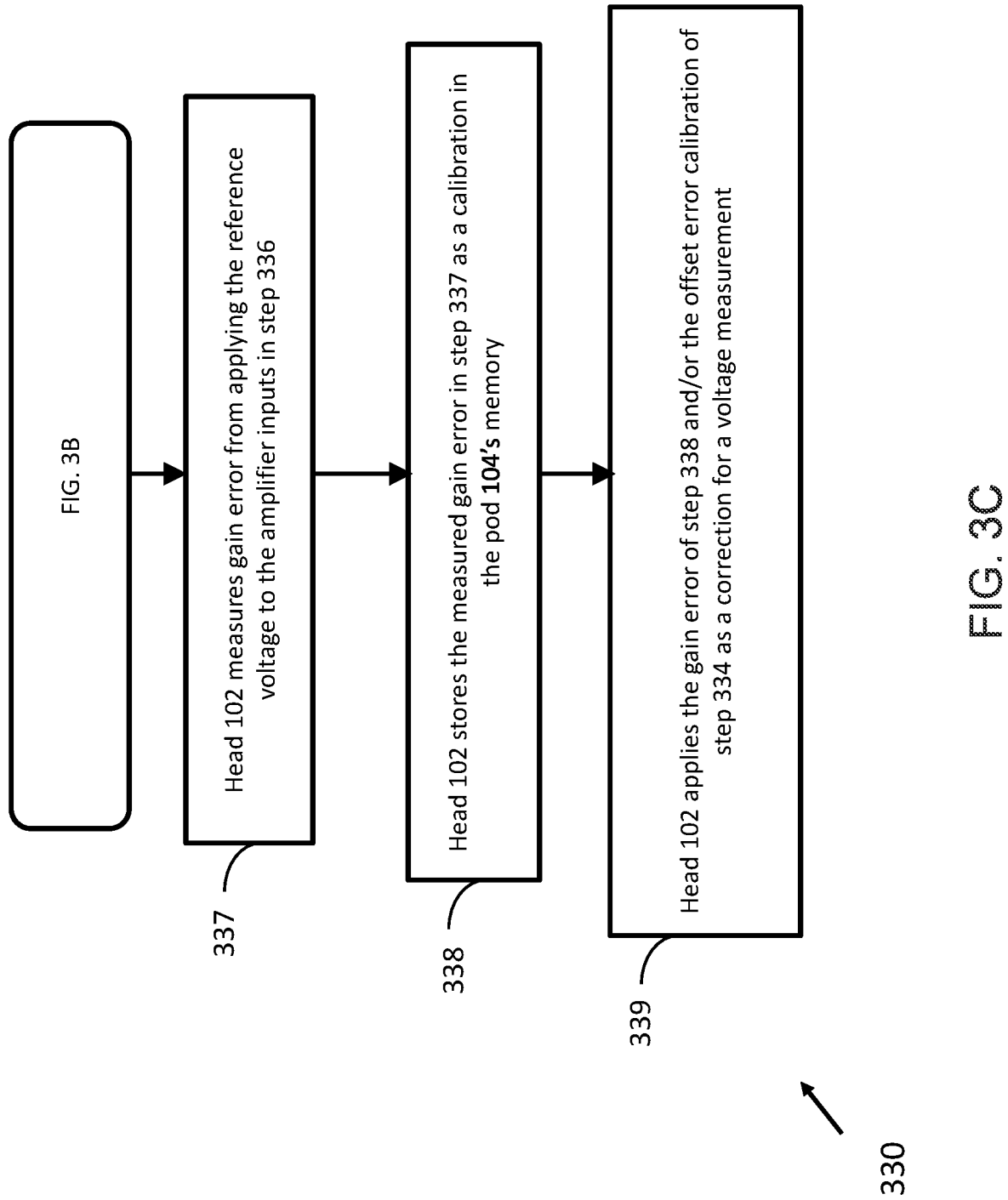

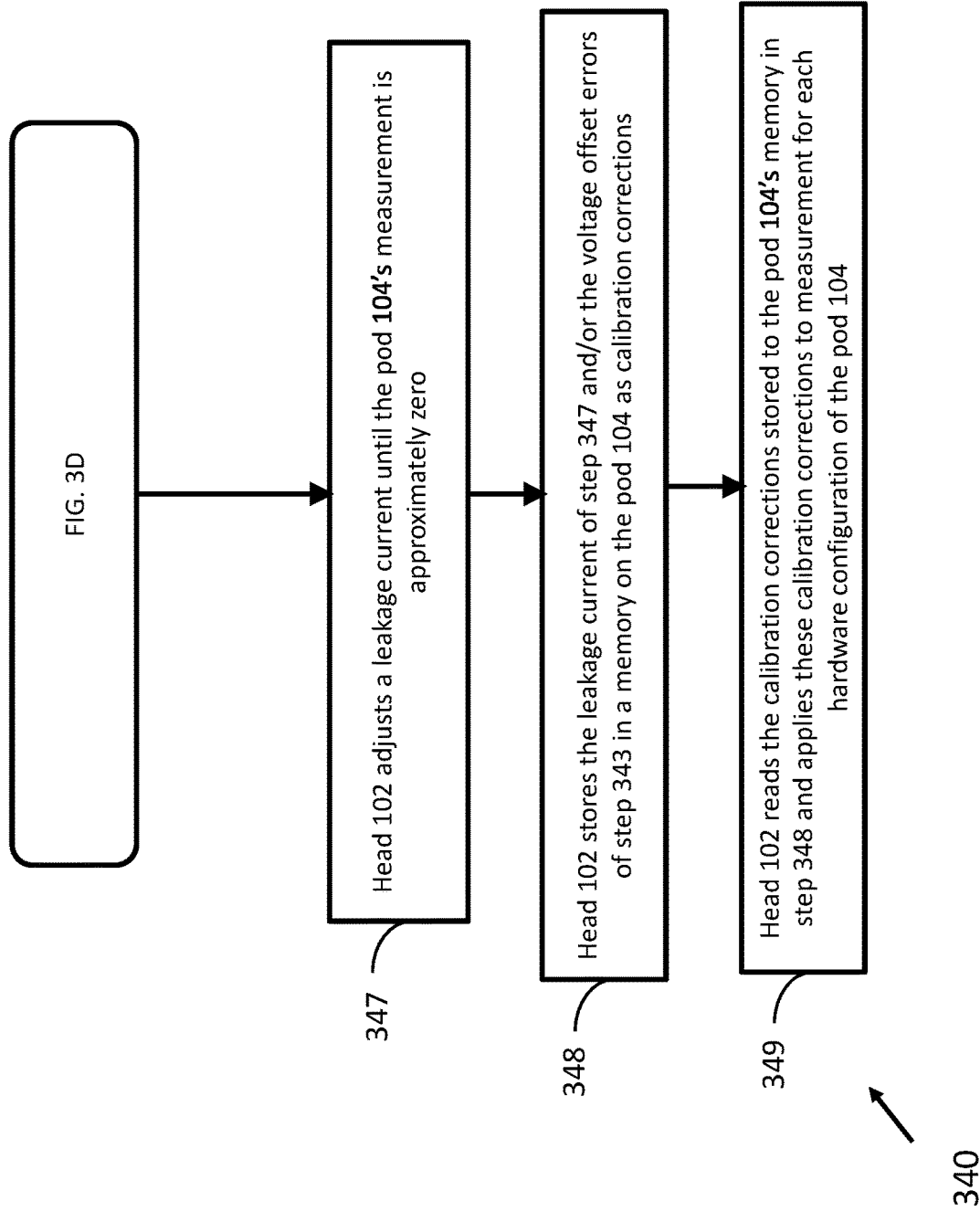

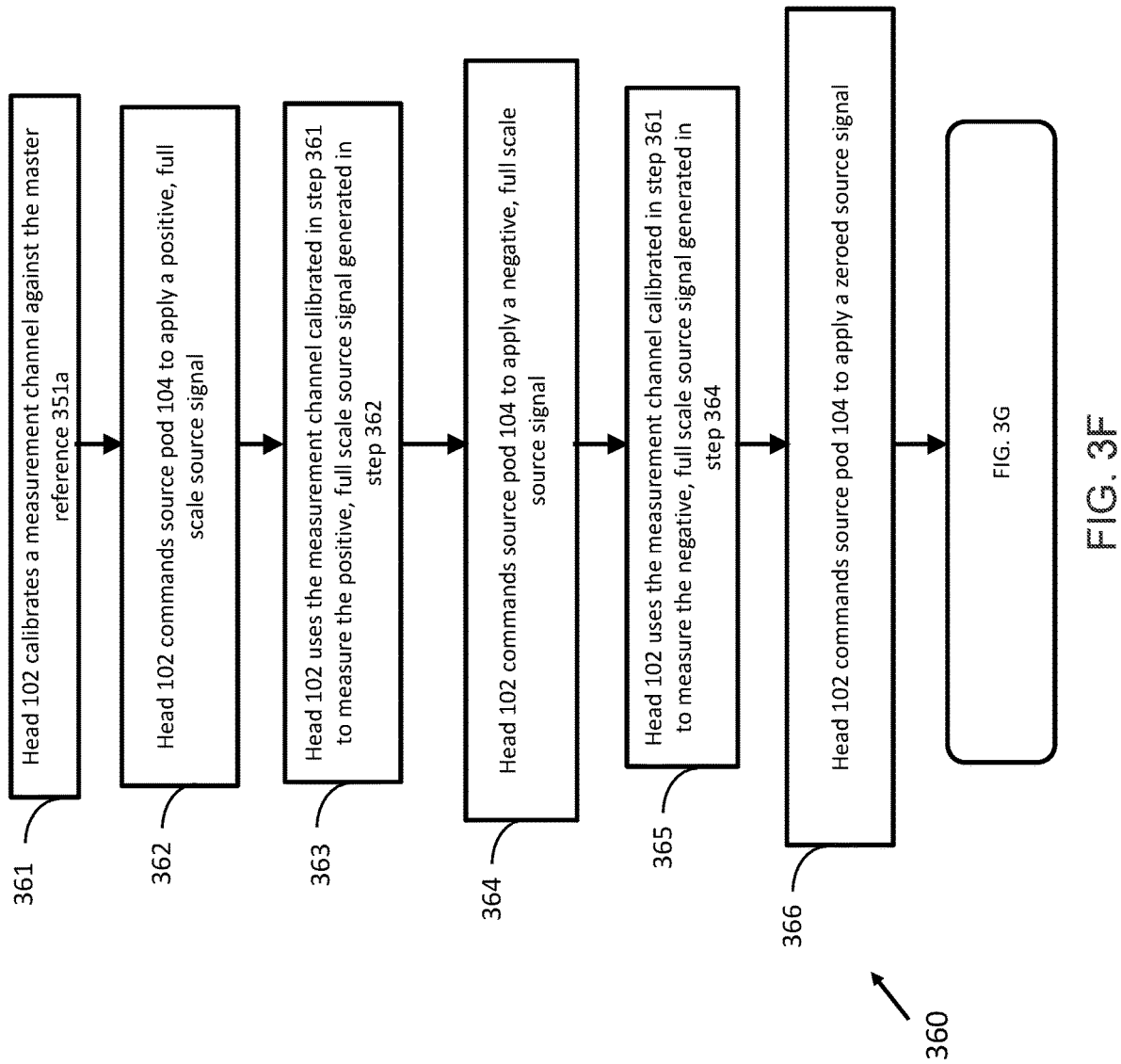

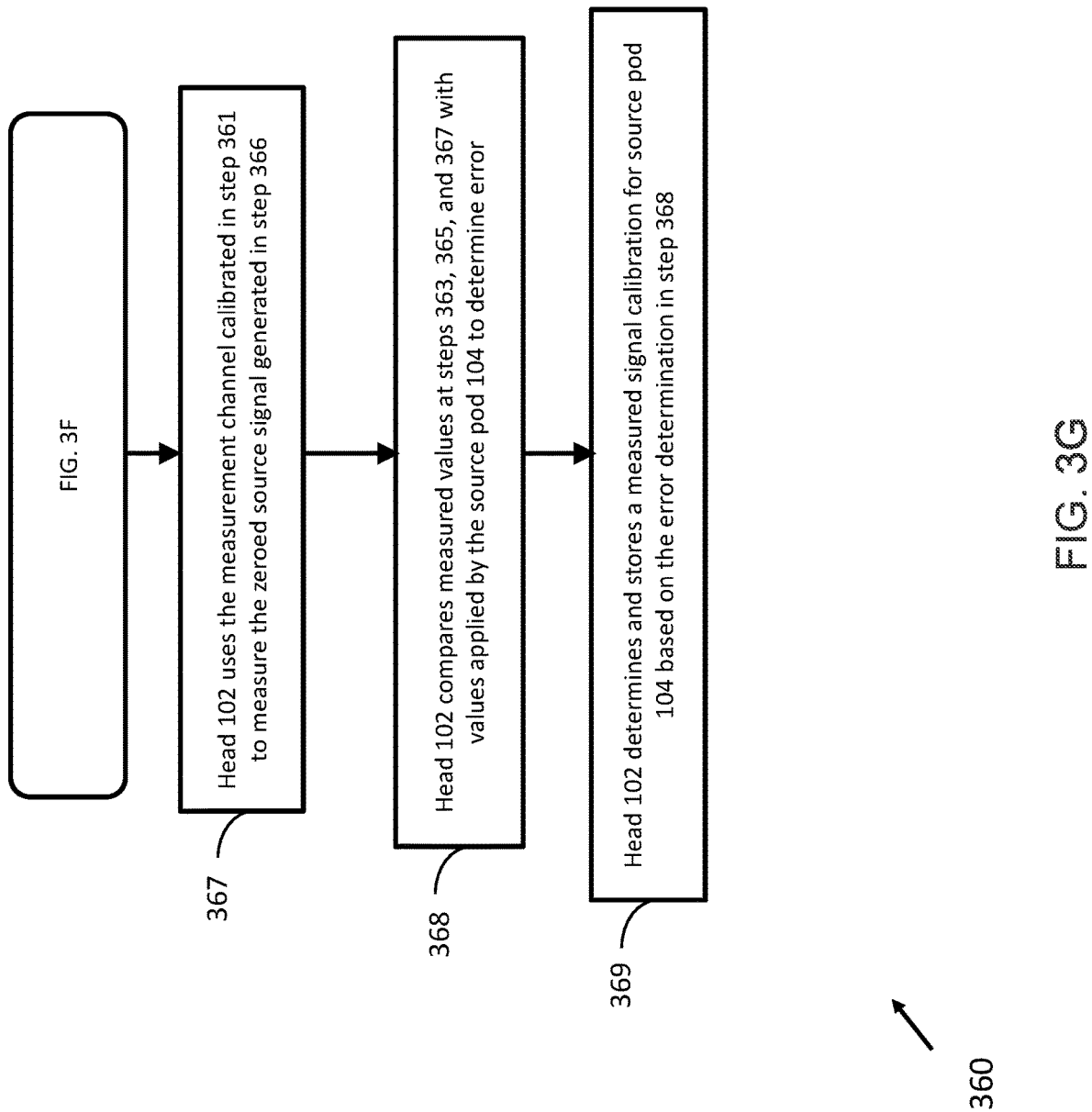

| features | Enhanced Combination Source/Measure Pod | Precision Source Pod | Balanced Current Source Pod |
|---|---|---|---|
| Voltage source | ✓ | ✓ | |
| Current source | ✓ | | ✓ |
| Common mode noise rejection | | | ✓ |
| Hybrid AC/DC sourcing | ✓ | ✓ | |
| DC up to | 10 kHz | 100 kHz | 100 kHz |
| Source span | nV – 10 V or pA – 100 mA | nV – 10 V or pA – 100 mA | pA – 100 mA |

FIG. 4

| Position | Output |
|---|---|
| 0 | 0.000 |
| 1 | 0.500 |
| 2 | 0.866 |
| 3 | 1.000 |
| 4 | 0.866 |
| 5 | 0.500 |
| 6 | 0.000 |
| 7 | -0.500 |
| 8 | -0.866 |
| 9 | -1.000 |
| 10 | -0.866 |
| 11 | -0.500 |

| features | Enhanced Combination Source/Measure Pod | Voltage Measure Pod | Current Measure Pod |
|---|---|---|---|
| Measures voltage | ✓ | ✓ | |
| Measures current | ✓ | | ✓ |
| Lowest noise | | ✓ | ✓ |
| Analog filters | | ✓ | ✓ |
| Seamless ranging | | ✓ | |
| DC up to | 100 kHz | 100 kHz | 100 kHz |
| Measure span | nV – 10 V or pA – 100 mA | nV – 10 V | pA – 100 mA |

FIG. 17

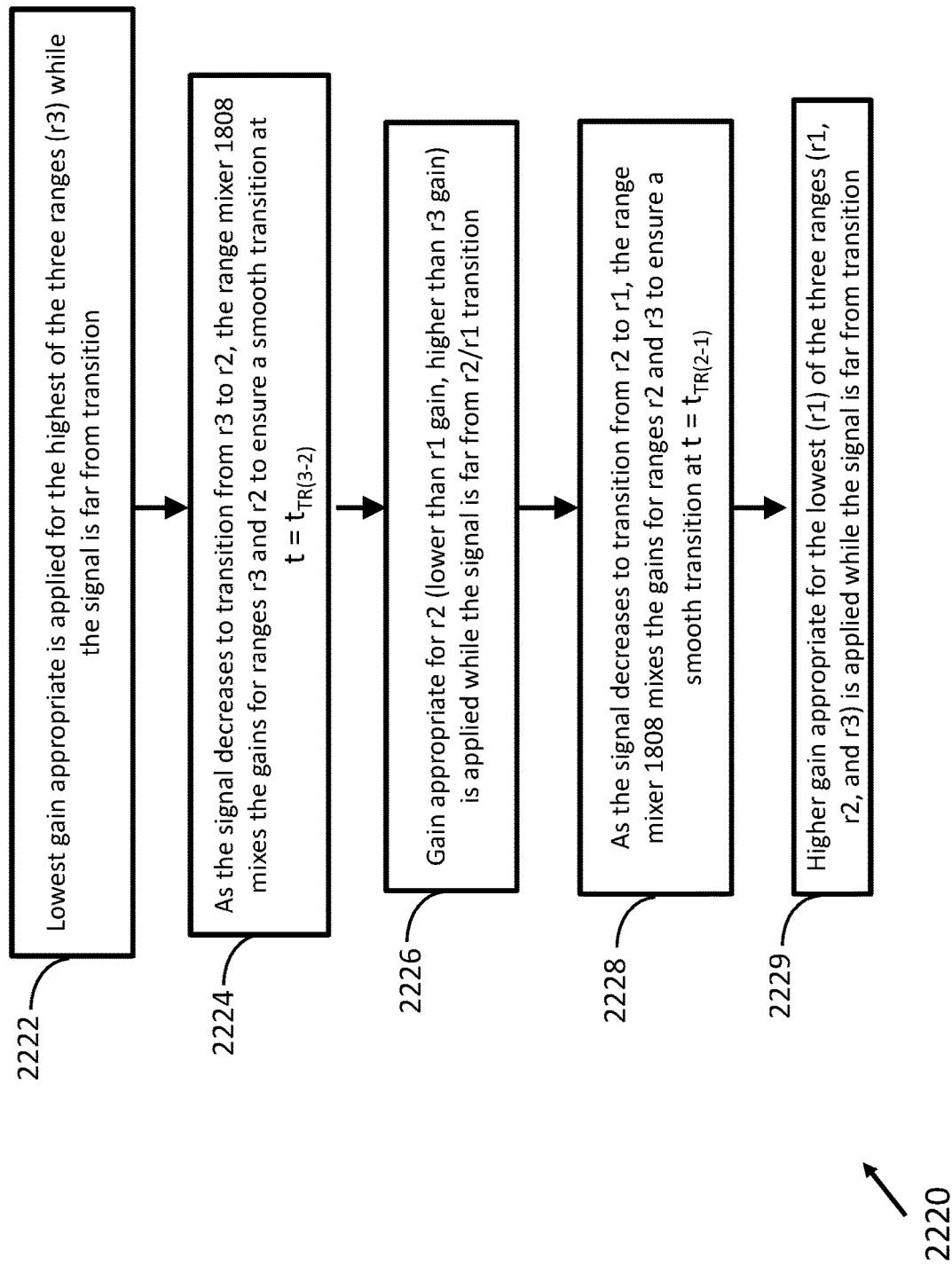

INTEGRATED MEASUREMENT SYSTEMS AND METHODS FOR SYNCHRONOUS, ACCURATE MATERIALS PROPERTY MEASUREMENT

CROSS-REFERENCE TO RELATED APPLICATIONS

This application is claims priority to U.S. Provisional Patent Application No. 63/057,745, to Fortney, "SYNCHRONOUS SOURCE MEASURE SYSTEMS AND METHODS," filed Jul. 28, 2020; U.S. Provisional Patent Application No. 63/016,747, to Fortney, "ADVANCED ANALOG-TO-DIGITAL CONVERSION SYSTEMS AND METHODS," filed Apr. 28, 2020; and U.S. Provisional Patent Application No. 63/034,052, to Fortney, "ADVANCED DIGITAL-TO-ANALOG SIGNAL GENERATION SYSTEMS AND METHODS," filed Jun. 3, 2020, each of which is incorporated herein by reference in its entirety.

This application is related to the following applications being filed concurrently herewith, each of which is incorporated herein by reference in its entirety: U.S. patent application Ser. No. 17/241,458, to Fortney et al., "HYBRID DIGITAL AND ANALOG SIGNAL GENERATION SYSTEMS AND METHODS," filed Apr. 27, 2021; and U.S. patent application Ser. No. 17/241,450, to Fortney et al., "RANGING SYSTEMS AND METHODS FOR DECREASING TRANSITIVE EFFECTS IN MULTI-RANGE MATERIALS MEASUREMENTS," filed Apr. 27, 2021.

FIELD

This disclosure relates to electronics, analytical instrumentation, software, and infrastructure for signal sourcing and signal measuring. More specifically, this disclosure relates to systems that can measure signals for materials and device characterization and other applications under challenging experimental conditions that can cause high levels of noise and interference.

BACKGROUND

Materials and device property measurements (e.g., electron transport properties such as Hall, mobility and carrier concentration, etc.) are often highly sensitive to noise, interference, and stray signals. For example, superconductive properties are typically measured at extremely low temperatures (e.g., lower than 4 K) necessary for observing those properties without excessive noise. These measurements may also require very high field strength (e.g., in excess of 5 T), which can complicate experimental setups. Handling noise, interference, and stray signals under these compromising conditions is critical for obtaining reliable, accurate data.

Experimental setups for measuring these properties currently require several different types of equipment (e.g., lock-in amplifiers, other amplifiers, current sources, voltmeters, ammeters, Analog to Digital (A/D) converters, and other devices). Lock-in amplifiers, for example, are essential for measuring signals under high interference/noise conditions. They extract the measured signals with a known carrier wave, screening out extraneous or interfering signals. Lock-ins are typically sold as separate components designed for installation in a laboratory rack alongside the other devices mentioned above. In fact, each piece of equipment is incorporated into an experimental setup as a separate, free-standing unit. Researchers create the experimental setup by physically and electrically connecting the units.

User creation of experimental setups from disparate units of equipment makes system-wide noise mitigation difficult and ad-hoc, if not impossible. Each unit independently and separately contributes noise. Each unit has a unique, and often unpredictable, interference susceptibility. Each unit contributes different settling or transient effects. These different contributions and susceptibilities must be addressed individually. Calibration must be done individually. Therefore, the complexity of interference/noise mitigation and calibration scales with the number of devices involved in the measurement. That number can easily and quickly grow large, even for relatively modest materials properties experiments. It sets a hard limit on the accuracy of such measurement systems.

Since the equipment units often come from different commercial suppliers, compatibility issues limit system-wide noise and interference mitigation. Mitigation techniques involving one or more units working in concert may be impossible or impracticable. For example, system-wide screening off or shutting down digital electronics may be impossible, even though digital interference confounds sensitive measurements. Since each unit typically has its own clock, precise synchronization may be difficult or impossible. Standard connections (e.g., by BNC connectors and cables and using traditional instrument racks) introduce problems. Each connection brings additional impedance and/or noise. Wires add interference. Stray capacitance from any number of sources frustrates measurements.

These issues degrade repeatability and accuracy of measurements. Different experimental setups may produce different results for the same measurement on the same sample. Therefore, there is an unmet need for an accurate, consistent, and reliable materials measurement system that provides system-wide noise mitigation, interference rejection, source/measure synchronization, as well as calibration. There is also an unmet need to reduce the number of noise and interference sources, including those created by excess connections, wires, and the interference of digital electronics.

SUMMARY

Aspects of the present disclosure include a measurement system comprising a source unit configured to provide a source signal to a sample. The source unit comprises at least one of a voltage source, a current source and a memory configured to store a source calibration. The system comprises a measurement unit configured to acquire from the sample a measurement signal that may be responsive to the source signal. The measurement unit comprises at least one of a voltage measuring unit, a current measuring unit, and a capacitance measuring unit and a memory configured to store a measurement calibration. The system comprises a control unit comprising a digital signal processing unit, a source converter connected between the digital signal processing unit and the source unit. The system comprises a measurement converter connected between the digital signal processing unit and the measurement unit, a synchronization unit configured to synchronize clocks of the digital signal processing unit, the source converter, and the measurement converter, a calibration unit for calibrating the system including the control unit, and a reference voltage supply configured to supply a common reference voltage for the control unit.

The control unit may be configured to obtain at least one of calibration data from a self-calibration performed by the source unit and the measurement unit, calibration data from a stored factory calibration, calibration data from a remote source via the Internet, calibration data from a user input, the source calibration data from the source unit; and the measurement calibration data from the measurement unit. The control unit may be configured to obtain the source and measurement calibrations periodically. The control unit may be configured to obtain at least one of the source calibration from the memory of the source unit when the source unit may be not providing the source signal to the sample and the measurement calibration from the memory of the measurement unit when the measurement unit may be not acquiring an measurement signal from the sample. The control unit may be configured to obtain the source and measurement calibrations concurrently. The digital signal processing unit may store the calibration data for at least one of the control unit, source unit, and measure unit. The current source unit may be configured to measure a source current associated with the source signal via a sensing resistor and vary a resistance range of the sensing resistor according to a magnitude of the source current. The system may comprise a current source protection unit configured to determine whether the source current exceeds a threshold current and when the source current exceeds the threshold current, alter a feedback element of at least one of the source unit and the measurement unit so that the source current falls below the threshold current.

The synchronization unit may be configured to synchronize the digital signal processing unit, the source converter, and the measurement converter with respect to an internal clock signal. The digital signal processing unit may be configured to provide timestamps for data originating from at least one of the measurement unit and the source unit. The data from the measurement unit may comprise the measurement signal. The data from the source unit may comprise the source signal. The source unit may be configured to deactivate non-analog circuitry when providing the source signal. The measurement unit may be configured to deactivate non-analog circuitry when measuring a measurement signal.

The digital signal processing unit may be configured to perform at least one of the following with respect to at least one of the measurement signal and the source signal: a lock-in analysis, an Alternating Current/Direct Current (AC/DC) measurement, an inductance (L), capacitance (C), and resistance (R) (LCR) measurement, a time/scope domain presentation, a frequency domain analysis, a noise analysis, an AC/DC sourcing, a control looping, and providing the source signal from more than one source.

An interface between the source unit and the control unit may comprise low impedance buffered analog signals and an interface between the measurement unit. The control unit may comprise at least one of a voltage mode analog signal interface with low impedance transmitting and high impedance receiving circuitry and a current mode analog signal interface with high output impedance transmitting and low impedance receiving circuitry. The interface signals between at least one of the source unit, the measurement unit, and the control unit may comprise a differential approach for either transmitting or receiving circuitry.

At least one of an interface between the source unit and the control unit may comprise low impedance buffered analog signals and an interface between the measurement unit and the control unit may comprise low impedance buffered analog signals. The measurement and source units may be remotely located from the control unit and the digital signal processing unit. The system may comprise a power supply filter to at least one of the measurement and source units. The system may comprise a first cable connecting the control unit to the measurement unit and a second cable connecting the control unit to the source unit.

Digital signals in at least one of the measurement unit and the source unit may be isolated from the control unit. At least one of the source and measurement converters may comprise a gain chain configured to amplify an analog input signal, a range selector configured to select a gain between the analog input signal and multiple analog-to-digital converter (ADC) outputs, wherein each ADC output has a path, and a gain of each output path may be made up of gain stages in the gain chain, and a mixer configured to combine the multiple ADC outputs into a single mixed output.

The ADC output paths may comprise: two ADC output paths that can independently be configured into either a high range or low range path, the low range path having a first gain for converting the analog input signal, the high range path having a second gain for converting the analog input signal, the second gain being lower than the first gain, a mixing device configured to combine an output of the lower range with an output of the higher range, and a device configured to vary an amount of gain combined from the high range path and the low range path.

The source converter may comprise two or more digital-to-analog converters (DAC) combined to generate two or more frequency components. The source converter may comprise a first path for generating substantially low frequency signals, the first path comprising a first one of the DACs. The source converter may comprise second path for generating substantially high frequency signals, the second path comprising a second one of the DACs. The source converter may comprise: a data processor for processing an input signal, a combining circuit configured to combine outputs of the first and second paths into the source signal, a feedback portion configured to sense the source signal, and a servo loop configured to employ the feedback portion to maintain the source signal substantially in accordance with the input signal.

The system may comprise at least one of a plurality of source units and a plurality of measurement units. The digital signal processing unit may be configured to perform lock-in signal processing. The lock-in signal processing may be synchronized with the synchronization unit. The lock-in signal processing may process at least one of a fundamental frequency and harmonic frequency. The control unit may be configured to set a phase relationship between the source unit and the measurement unit. The lock-in signal processing may comprise providing a lock-in reference for communication between the control unit and at least one of the source unit and the measurement unit. The source unit may be configured to provide DC feedback to the control unit through an analog signal. The digital signal processing unit may be configured to convert the DC feedback to digital and set a DC measurement signal depending on the digital DC feedback value.

The control unit may be configured to measure a parameter of the source signal using a DC signal. The DC feedback signal may be a low frequency AC signal. The control unit may be configured to assess a type of at least one of the measurement unit and the source unit and configure the digital signal processing unit according to the type. The control unit may be configured to output a DC bias as part of the measurement signal. The source unit may be configured to at least one of limit a voltage of the source signal to under a voltage threshold and limit a current of the source signal to under a current threshold. The system may comprise an enclosure for at least one of the source unit and the measurement unit, the enclosure comprising at least one of electrostatic shielding and magnetic shielding.

The control unit may comprise a single interface that conveys the source and measurement signals and control information. The control unit may be configured to perform at least one of: channel calibration, seamless ranging, spectrum analyzer noise analysis, and at least one of square wave or arbitrary wave demodulation for harmonic harvesting. The system may comprise a configurable display. The control unit may be configured to display real time oscilloscope readings. The control unit may be configured to display frequency spectrum readings. The control unit may be configured to perform at least one of a factory and a self calibration by applying a signal to more accurate resistor range, measuring the applied signal across the more accurate range, applying the signal to a less accurate resistor range, measuring the applied signal across the less accurate range, and calibrating the less accurate resistor range using the measured applied signal across the more accurate range and the measured applied signal across the less accurate range.

The control unit may be configured to perform a voltage measure mode calibration for a measurement unit by measuring an offset error at the measurement unit, storing the offset error in the memory of the measurement unit, connecting an amplifier associated with the measurement unit to a reference voltage, measuring, via the control unit, a gain error from applying the reference voltage to the amplifier, storing the measured gain error in the memory of the measurement unit, reading, via the control unit, at least one of the stored gain error from the memory of the measurement unit, and applying at least one of the offset error and the stored gain error to correct a voltage measurement.

The control unit may be configured to perform a current mode measure calibration for the measurement unit by disconnecting input connectors of the control unit, connecting input connectors of the measurement unit to ground, configuring the measurement unit in a voltage measure mode, measuring voltage offset errors of an amplifier via the measurement unit in voltage measure mode, applying an analog correction to decrease the measured voltage offset to approximately zero, switching the measurement unit to a current measure mode and floating inputs to the measurement unit, determining, via the control unit, voltage offset errors between the measurement unit and the control unit by configuring the measurement unit in a high current range and measuring a resultant voltage at the control unit, adjusting a leakage current until a current measurement of the measurement unit is approximately zero, storing, via the control unit, the adjusted leakage current and the voltage offset errors in the memory of the measurement unit, reading, via the control unit, at least one of the adjusted leakage current and the voltage offset errors, and applying at least one of the adjusted leakage current and the voltage offset error to correct a current measurement of the measurement unit.

The source unit may be configured to acquire the measurement signal and the measurement unit may be configured to provide the source signal. The system may comprise a matrix switching control unit configured to provide a set of switches for scanning the source and measurement signals. The power supply may be configured to supply power to the control unit, the source unit, and the measurement unit referenced to a common ground.

Aspects of the present disclosure include a method comprising providing a source signal to a sample via a source unit comprising at least one of a voltage source, and a current source. The source unit comprises a memory configured to store a source calibration. The method comprises acquiring from the sample a measurement signal responsive to the source signal via a measurement unit. The measurement unit comprises at least one of a voltage measuring unit, a current measuring unit, and a capacitance measuring unit and a memory configured to store a measurement calibration. The method comprises receiving the measurement signal from the measurement unit by a control unit. The control unit comprises a digital signal processing unit, a source converter connected between the digital signal processing unit and the source unit, and a measurement converter connected between the digital signal processing unit and the measurement unit. The control unit comprises a synchronization unit configured to synchronize clocks of the digital signal processing unit, the source converter, and the measurement converter. The control unit comprises a calibration unit for calibrating aspects of the system including the control unit and a reference voltage supply configured to supply a common reference voltage for the control unit.

BRIEF DESCRIPTION OF DRAWINGS

FIG. 3C is the continuation of the flowchart 330 of FIG. 3B.

FIG. 3E is the continuation of the flowchart 340 of FIG. 3D.

FIG. 3F is the first part of a flowchart 360 showing an exemplary calibration routine 360 of source pod 104 (or pod 104 in source mode) driven by the head 102.

FIG. 3G is the second part of the flowchart 360 of FIG. 3F.

FIG. 4 illustrates several exemplary features of source pods 104 within the context of the present disclosure.

FIG. 17 describes exemplary features of measure pods 104 within the context of the present disclosure.

FIG. 22D is the second part of a flow chart detailing auto-ranging algorithm 2220.

DETAILED DESCRIPTION

The platform or system, referred to as an "M81," disclosed herein allows systemic noise and interference mitigation that is not possible with conventional ad-hoc, rack-based systems. It provides an all-in-one experimental platform combining source and/or measure amplifier pods, lock-in amplifier capabilities, digital multimeters (DMMs), DC/AC and other signal generators, etc., with time synchronized operation and advanced sourcing and measuring.

Figure 1:
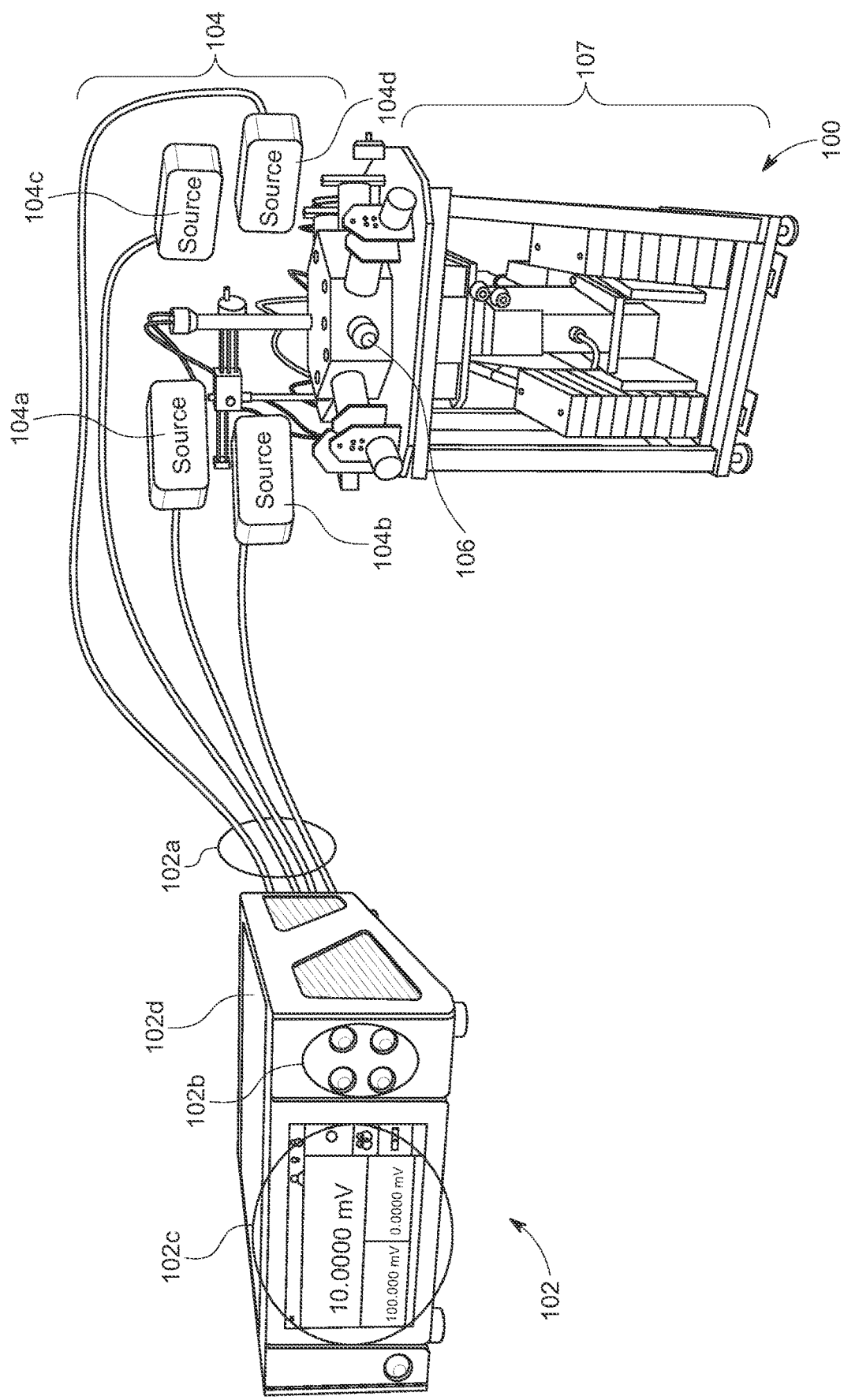
FIG. 1 shows one exemplary M81 platform or system 100 within the context of the present disclosure.
Figure 2:
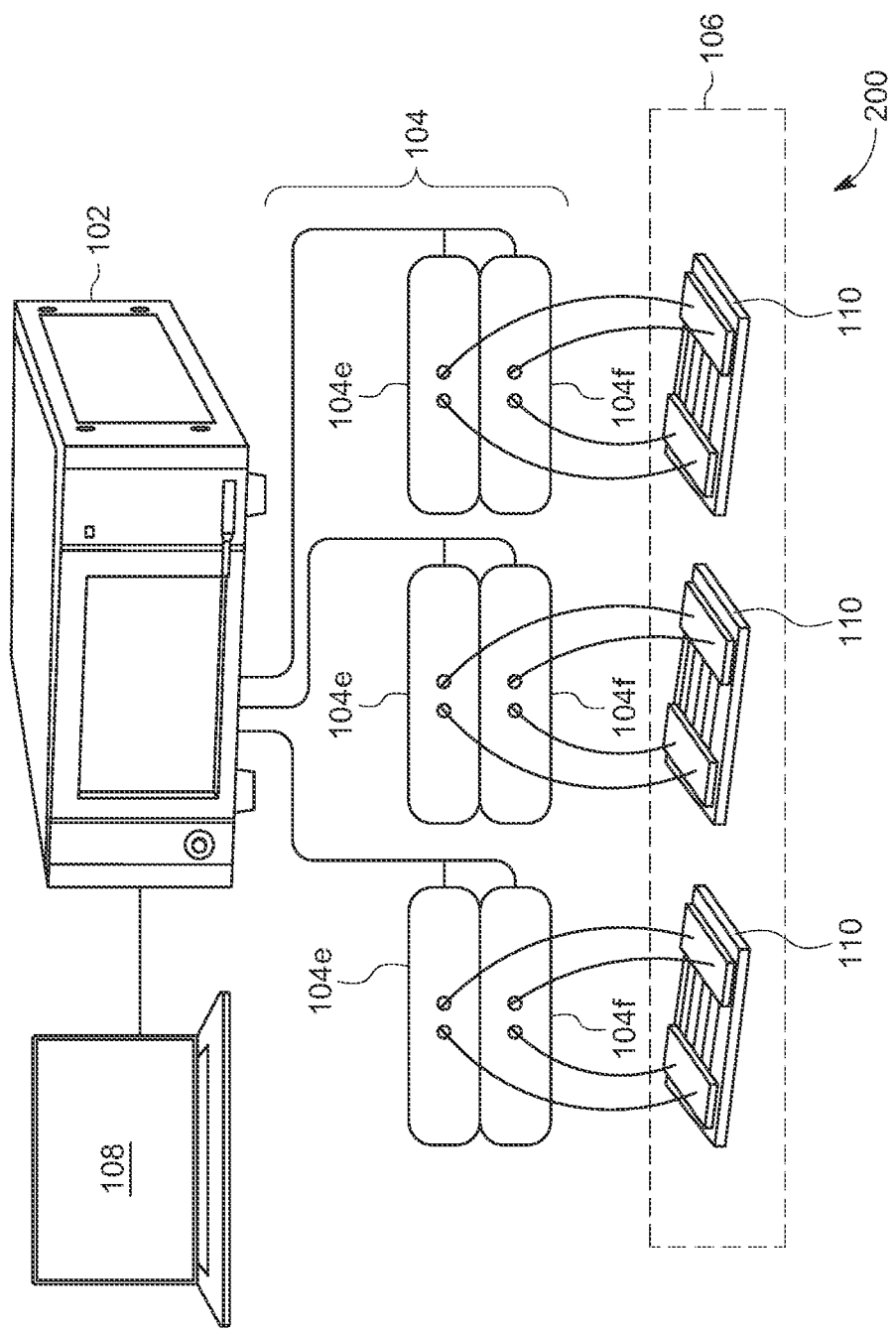
FIG. 2 shows another variation of the M81 platform or system 200 within the context of the present disclosure.

The term "M81" is used interchangeably with the term "system." Therefore, the phrase "systems 100, 200, and 300" referring to the systems shown in FIGS. 1, 2, and 3 is synonymous with the term "M81 100, 200, and 300." The term "M81" will be used generally to describe various systems disclosed herein or otherwise encompassed by the general inventive concepts.

The M81 incorporates numerous innovative solutions to mitigate noise and interference in materials measurement systems. It includes system-wide remote, automatic, and periodic calibration for noise reduction. It calibrates entire, system-wide measurement and signal chains, rather than calibrating each of its individual components separately. This provides a far more accurate calibration than can be achieved in traditional rack based systems. Its system-wide controlled shut down of digital electronics during measurement prevents interference. Its system-wide clock synchronizes sourcing, measuring, and analysis. It provides excitation/input signals from stored digital signal models. It feeds these analog signals to samples via a hybrid signal chain including both AC and DC components, both having separately configured gain. The signal chains can stabilize output based on feedback from the sample stage. The system includes balanced current sourcing that matches input and output current to/from the sample, protecting the sample and system from large fluctuations. Its "seamless ranging" technique protects measurements from glitches and transients as they change over orders of magnitude. These and other solutions are detailed below. Features and capabilities described in the context of one M81 variation apply to other variations of the M81 whether explicitly discussed or implied by the present disclosure.

Measurement System Overview

FIG. 1 shows one exemplary M81 platform or system 100 that includes an instrument "head" or control unit 102 and several exemplary remote "pods" 104. As shown in FIG. 1, pods 104 may source units 104a-104c that can provide probe signals to a sample (not shown) on a sample stage 106. Note that the words "pod" and "unit" are used interchangeably herein such that a reference to a "source pod" is synonymous to a reference to a "source unit" and a reference to a "measurement pod" is synonymous to a reference to a "measurement unit." Similarly, the words "head" and "control unit" are used synonymously. The sample stage 106 may include various components 107, such as a cryostat, a Peltier cooler, power supplies, heat sinks, ancillary electronics, and or mechanical positioning systems, balancing system, a pneumatic table, weights, etc.

The pods 104 may include measurement units 104d configured to measure signals from the sample. In this variation, the system 100 includes three remote pods 104a-c acting signal sources and one remote pod 104d acting as signal measure. It is to be understood that this configuration is merely exemplary. In fact, source pods 104a-c may function as measurement pods (e.g., 104d) and vice versa. In variations, each pod 104 may have a certain type or configuration (e.g., measurement, source, and/or the specific feature sets shown in FIGS. 4 and 17 below). In these variations, the head 102 may be able to detect the type of pod 104 upon connection. Upon pod 104 type detection, the head 102 may then configure itself and the rest of the system in a manner appropriate for the detected pod type. For example, the head 102 may self-calibrate and/or perform a system-wide calibration appropriate for the detected pod type. The head 102 may perform other configurations (e.g., it may configure the digital signal processing unit 326, etc.) according to the detected pod type.

System 100 may include any suitable number of source and measurement pods 104. In other variations, the M81 may include a head unit 102 without requiring pods 104. Note that system 100 may include any of the features described in other variations (e.g., variations 200 and 300) below. These include, for example, the shared synchronizing clock 302, described in the context of FIG. 3A below.

Although FIG. 1 shows head 102 with multiple connections (e.g., four connections 102a to pods 104 and multiple front panel connections 102b), in variations it may have only one interface with the outside world. For example, head 102 may have a single universal serial bus (USB) connection that enables the head to transmit and receive data and control information to/from the pods 104. The data may include data relating to providing a source signal via the pods 104, retrieving measurement signals from the pods 104, processing those signals, obtaining other feedback from measurements, providing processed data, including processed feedback, to the pods 104. The control information may include any calibration, diagnostic, and configuration information disclosed herein. For example, control information may include instructions to provide specific input signals to a sample, extracting a particular output, calibrating a device in the system 100, and/or controlling an aspect of sample stage 106, including cryogenic properties of that stage 106. It may include calibration information from any unit in system 100.

FIG. 1 further shows that the head 102 includes a display 102c. The display 102c may be a touch screen. It may be configurable in the sense that it can be configured to display any of the data, signals, processed information, and control functions described herein. Display 102c may, for example, be configured to display an oscilloscope function when aspects of system 100 are used as an oscilloscope. These oscilloscope readings may be displayed in real time. Display 102c may also display frequency spectra, for example. Display 102c may be configured to display other data including any data collected by measurement pods 104. Display 102c may further be configured to display the status of any unit in system 100, the status of any communication to and from any unit in system 100, and diagnostic information concerning any measurement or signal sourcing to/from the sample 106. The display may be configured to display multiple parameters simultaneously, which can be configured by the user or through the remote interface. Display 102c may also be configured to display signal noise, interference, and/or spectral analysis, among other things. Display 102c may be further configured to display any features of a graphical user interface (GUI) for interacting with any aspect of system 100.

FIG. 1 shows that head 102 may include a case or enclosure 102d. The case or enclosure 102d may comprise materials providing electrostatic shielding (e.g., plastics or rubber). It may further include metallic materials for electromagnetic shielding. The case may be made from any suitable material. It may include any mechanical or electrical interface as needed. For example, the case 102d may include hooks, fasteners, or grooves so that it is laboratory rack compatible. It may include feet, posts, or stands so that it stands alone on a table or desktop. It may include wall or ceiling mounts, etc.

Other variations include any suitable number of heads, source pods and measure pods 104. For example, FIG. 2 shows another exemplary variation 200, where a head unit 102 can have six channels that can support three measure type pods 104e and three source type pods 104f. In this variation, the M81 is also shown connected to an optional computer 108 and three exemplary devices under test (DUTs) 110 in the sample stage 106. Again, this configuration is merely exemplary. There is no requirement for equal numbers of measure 104e and source 104f pods. One source 104f could provide the excitation signal for all three DUTs 110, for example.

Herein the acronym "DUT" will be used interchangeably with "sample." It is to be understood that either a DUT or a "sample" may be a device or a sample of material. Often, in the context of the materials measurements disclosed herein, devices (e.g., transistors) are created for the express purpose of testing a material in the created device (e.g., semiconducting materials).

Figure 3A:
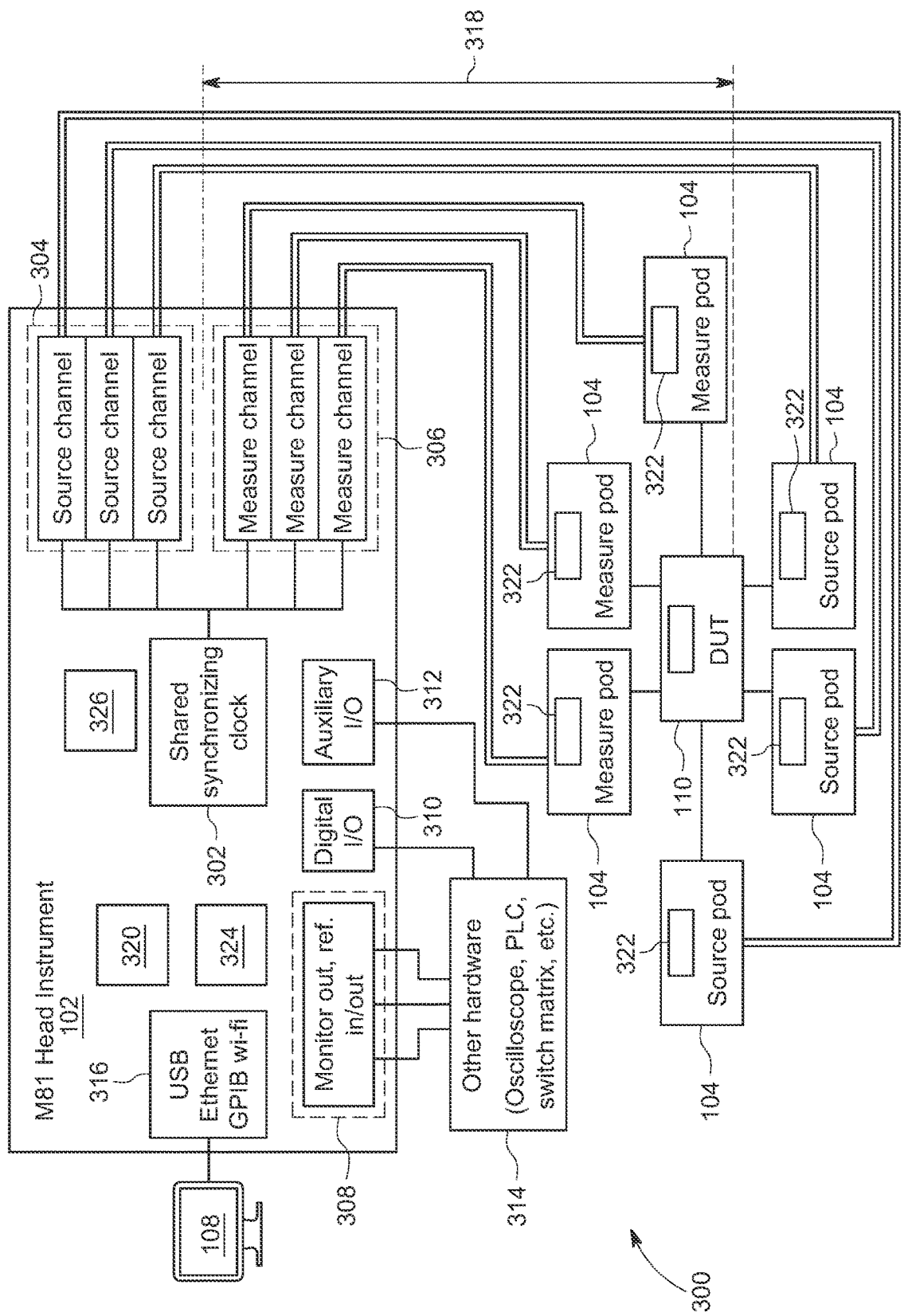
FIG. 3A shows another of the M81 platform or system 300 within the context of the present disclosure.

FIG. 3A shows another variation 300 of an M81 as a high-level diagram. FIG. 3A illustrates information sharing between the variation 300's components. For example, FIG. 3A shows how head or control unit 102 can handle signal conversions from analog to digital and vice versa. Source and measure pods 104 shown in FIG. 3A are not unique. They can be used for different applications.

FIG. 3A also shows a shared synchronizing clock 302 connected to each of the source channels 304 and measurement channels 306. The clock 302 may provide a shared synchronization to each of the signals derived from the measure and source pods 104, any converters or other electronics in the source 304 and measurement 306 channels, as well as the head 102 itself. Having a shared clock allows automatic synchronization of all components in the system 300, avoiding problems created by synchronization glitches or faults between any one of these components. Shared synchronizing clock 302 may be synchronized to an external or internal clock to the head 102. Source 304 and measure 206 channels may also comprise an interface between the pods 104 and head 102 with analog signals that are immune to cable length and external RF noise. All of these functions of the shared synchronizing clock 302, source 304, and measurement 306 channels will be discussed in further detail below.

As also shown in FIG. 3A, the head 102 may have ports (e.g., monitor out, reference input, and reference output ports 308, digital I/O ports 310, and auxiliary I/O ports 312) that enable the head 102 to connect to other hardware 314). The other hardware 314 may include any suitable for collecting and analyzing data from the system 300 and/or supplying input. Examples of other hardware 314 enabled by these connections include laboratory oscilloscopes, programmable logic controllers (PLCs), laptop or other computers, monitors, matrices of switches, reference signal inputs, etc. FIG. 3A also shows how head 102 can be connected to an external computer 108 by a suitable connection mechanism 316, including USB, ethernet, General Purpose Interface Bus (GPM), cellular data, and wireless networking technology (Wi-Fi). A suitable distance 318 can be maintained between the head 102 and the pods 104 such that operation of the head 102, in particular its digital circuitry, causes little or no interference to the measurements at the location of the DUT 110.

FIG. 3A also shows that the head has a calibration memory 320 and the pods have a calibration memory 322 for storing a calibration of any aspect of the system. For example, calibration memories 320 and 322 may store calibration information for the head 102 itself and/or each of the pods 104. The calibration memories 320 and 322 may include the following information: actual voltage of the master reference, gain compensation factor factors (measure source), offset compensation factors (measure and source), bias current compensation factors, voltage compensation, and common mode reduction factors.

The calibration information may be inputted by any suitable means. For example, the calibration information may be factory installed on the calibration memories 320 and 322. It may be downloaded from the Internet and/or provided via user entry. Each of the components, including the head 102 and the pods 104 may provide the information from performing a self-calibration procedure. The head 102 may provide calibration to the pods 104 and vice versa. Calibration information may be further stored in other devices connected to system 300 but not shown (e.g., diagnostic equipment, external computer, multimeters, etc.). Calibration information on any of the calibration memories 320 and 322 may be updated periodically. The calibration information stored on the memory of any device (e.g., the head 102 or pods 104) may be updated (e.g., via calibration) when that device is not in use. The calibrations for the head 102 and the pods 104 may be stored by the digital signal processing unit 324. The calibration may include multiple methods and components for calibration of different ranges. For example, the advantages of resistors with highly different resistance accuracies and temperature dependencies can be exploited to calibrate ranges that use less accurate resistors or resistors that drift more with temperature and time. GΩ resistors can be used for certain calibration aspects advantageously because they provide very low current noise. However, the resistance values of GΩ resistors are not always known with precision and may be somewhat unstable over time. MΩ range resistors are more stable over time, even though their calibrations suffer from more noise associated with greater current. Therefore, MΩ range resistors (100 MΩ) can be used to calibrate the range of GΩ and vice versa, using the low noise advantage of GΩ and the high stability advantage of MΩ. The same can be true of lower value resistors. For instance, a typical 10Ω resistor has better accuracy and drift as compared to a 1Ω resistor. Often use of the 1Ω resistor is advantageous in measuring larger currents either as an external sensing element or as a part of a source or measure circuit.

As discussed above, systems 100, 200, and 300 can be calibrated a number of different ways. Although not shown in FIG. 1, each pod 104 has inputs/outputs that allow connection to a precision signal source and measure device (e.g., external voltmeter, ammeter, current source, voltage source). These inputs/outputs allow local calibration at the pods 104 themselves, much as it is done for individual components on a traditional rack system.

The M81 systems 100, 200, and 300, however, also offer total internal calibration. This allows the use of sensitive electronics in the head 102 to calibrate for measurement offsets/errors/fluctuations to/from the pods 104 throughout in the entire system 100, 200, and 300. That is, total internal calibration calibrates for all the idiosyncrasies in the entire signal chain, from measurement/source to analytical electronics and back. This offers far greater precision. It is also far easier to perform. Calibration functions for the entire system can be initiated via a GUI on screen 102c and/or a button on the case 102d. They can be set up to run automatically and periodically. More specific functioning of total internal calibrating is discussed below.

Figure 3B:
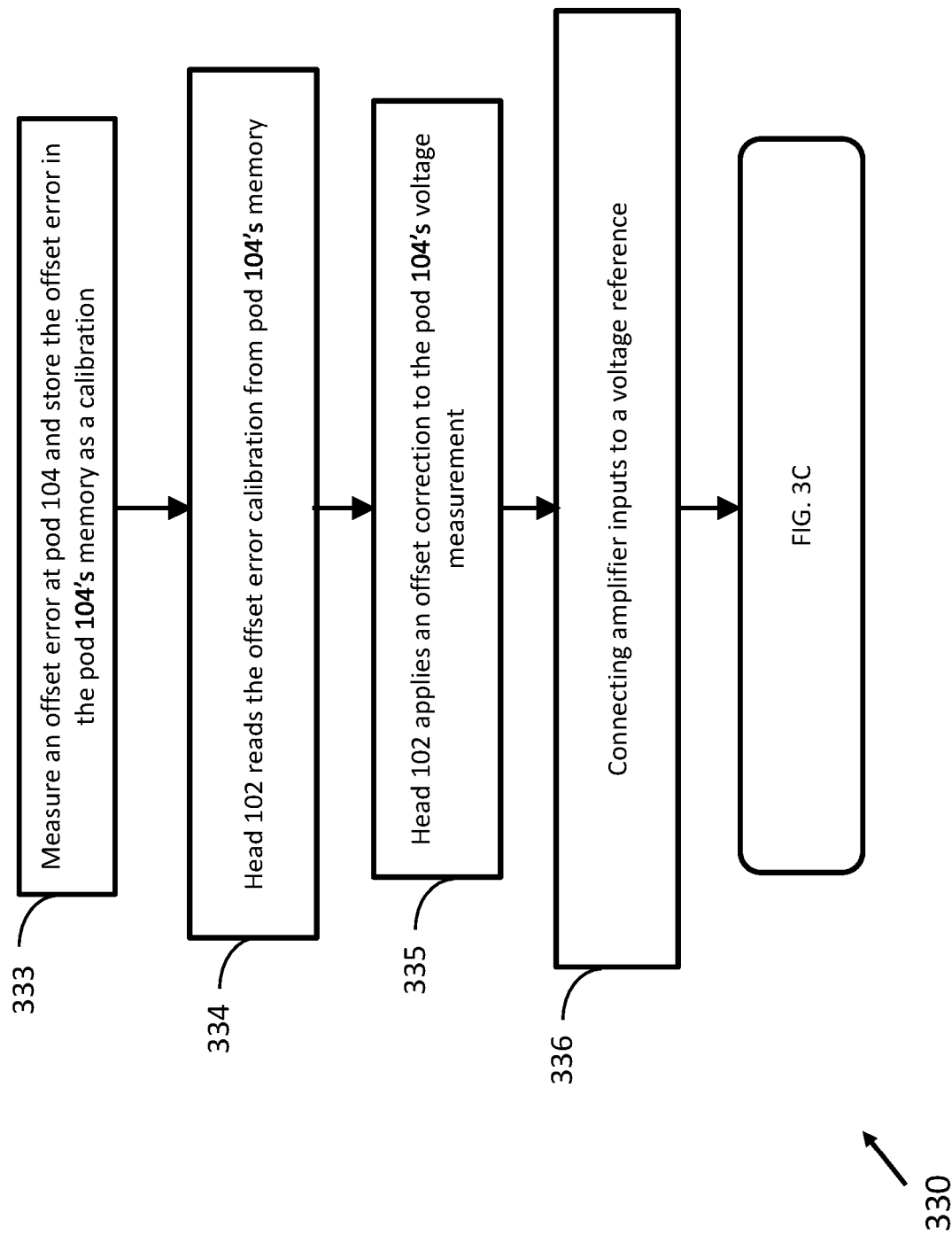
FIG. 3B is the first part of a flowchart 330 showing how the head 102 and pods 104 can work together for calibration of a measurement unit or pod configured to measure voltage.

FIGS. 3B and 3C are a flowchart 330 showing how the head 102 and pods 104 can work together for calibration, both measuring, updating, and storing calibration in memories 320 and 322. Specifically, flowchart, algorithm, or routine (herein used interchangeably) 330 calibrates measurements received at the head 102 from measurement pod 104 when the pod 104 is configured to measure a voltage signal from the sample 110. Routine 330 is driven primarily by the head 102.

Turning to FIG. 3B, in step 333, an offset error is measured at the pod 104 for at least one hardware input configuration of the pod 104. Hardware configurations pertain generally to the type of measurement pod being used and its associated features (see, e.g., the feature list in FIG. 17). Typically, different hardware input configurations contain different components that affect the error being calibrated. For instance, different hardware configurations may call for using different feedback resistors, gain/amplifier configurations, or other components (e.g., DACs) to process signals. The offset error for a particular hardware configuration is the difference between the voltage measured by the hardware configuration and the actual (known) input voltage. In step 333, the inputs to the pod 104 can be disconnected from external measurement and connected to ground to ensure that the actual, known input voltage is zero. Other known input voltages can be used (e.g., a known, stable voltage reference such as a master reference MR). The offset error is then the measured voltage under these conditions. The offset error is stored as a calibration correction in the pod 104's memory. At step 334, the head 102 reads the offset error calibration from the pod 104's memory. At step 335, the head 102 may apply an offset correction, based on the offset error measured in step 334, to a voltage measurement for the hardware configuration. Alternatively, step 334 may be skipped and the correction not applied until step 339. In step 336, the head 102 connects a reference voltage from a master reference MR to the amplifier inputs. The master reference MR can be, for example, a stable and reliable voltage reference that can be anywhere in the system, for example in the head 102. The reference voltage may be a positive full scale, negative full scale, positive mid-scale, and negative mid-scale voltage, for example. The voltage reference chosen is appropriate for the hardware configuration of the pod 104.

Turning to FIG. 3C, at step 337, the head 102 measures a gain error for hardware configuration by applying the reference voltage to the amplifier inputs in step 336. The gain error is measured, for example, by taking a difference between an expected, anticipated, or needed gain and a measured gain. Many factors may contribute to gain errors and the change in gain errors. For instance, feedback resistors in an instrumentation amplifier topology may change slightly with time and temperature. If the amplifier is changed for reasons described below, the new amplifiers will have different gain errors that should be compensated for by routine 330.

The head 102 stores the gain error as a calibration in the pod 104's memory at step 338. At step 339, head 102 reads the gain error stored in the pod 104's memory and applies the gain correction to a voltage measurement for the at least one hardware configuration of pod 104. One common technique to apply the gain correction is to multiply the voltage measurement expected results by the reciprocal of the gain error. Any other suitable method of using the gain error correction is contemplated. After this gain correction or a calibration is completed, the inputs are reconnected to the external signals and measurements may commence. At this stage, the head 102 may also apply the offset error calibration of step 334 as a correction for a voltage measurement. The gain correction and the offset error corrections can be applied to all voltage measurements by the pod 104 until the head 102 re-initiates calibration by re-running algorithm 330.

Figure 3D:
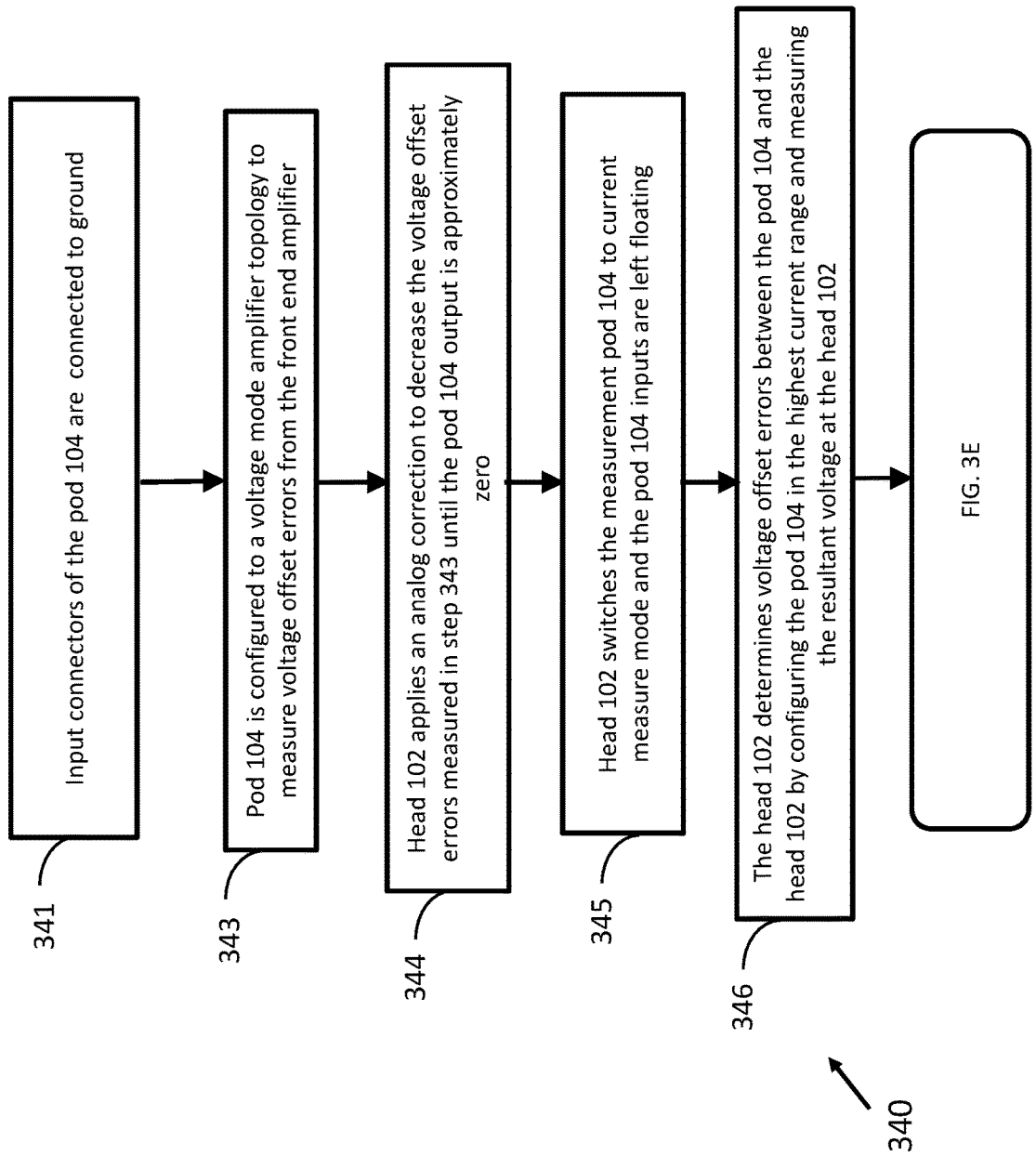
FIG. 3D is the first part of a flowchart 340 showing how the head 102 and pods 104 can work together for calibration of a measurement unit or pod configured to measure current.

FIGS. 3D and 3E are another flowchart 340 showing how the head 102 and pods 104 can work together for calibrating a pod 104 that is configured to measure a current signal from the sample 110. Routine 340 is driven primarily by the head 102.

Turning to FIG. 3D, in step 341, the inputs to the pod 104 are disconnected from the front end amplifier and connected to ground to protect the external sample from possible switching transients. In step 343, the measurement pod 104 is configured to a voltage measurement mode with gain (e.g., a voltage amplifier topology) to read voltage offset errors for the front end amplifier when the front end amplifier inputs are connected to ground. This is analogous to the voltage offset error measurement detailed in step 333. Voltage offset errors are the difference between the measured voltage and zero (since amplifier input is set to ground). This is the voltage offset of the "front end" amplifier, or the amplifier that would connect to the sample. The first amplification stage, or the front end amplifier, is connected to the device under test and is often a major contributor to offsets and leakage currents. Exemplary "front end" amplifiers are amplifiers 720 and 810, 912, 1018, and 1114 (FIGS. 7, 8, 9, 10, 11, and 18). Front end amplifiers may include one or more amplifiers.

In step 344, the head 102 applies an analog correction to decrease the front end amplifier voltage offset errors measured in step 343 until the pod 104 measures approximately zero voltage (e.g., only a few tenths of a volt, a few mV or a few µV). The analog offset correction may include, for example, applying an equal and opposite voltage to decrease, minimize, or eliminate the voltage offset errors. In step 345, the head 102 switches the measurement pod 104 to current measure mode. In step 345, the pod 104 inputs may be disconnected from ground and kept floating. In step 346, the head 102 determines voltage offset errors between the measurement pod 104 and the head 102 by configuring the measurement pod 104 in a high current range or even a highest current range (e.g., by switching to a lower feedback resistor) and measuring the resultant voltage at the head 102. Since the voltage offset error of the front end amplifier has previously been zeroed out at step 344, and the front end amplifier is set to give the lowest offset current. The remaining offsets measured are due to voltage offsets in the gain components between the front end amplifier and the measurement converters. Setting the front end amplifier to a high current range results in a small gain on the current offset, since the offset currents flow through a feedback resistor resulting in small voltages at the output of the front end amplifier. Multi stage amplifier configurations typically are used when large gains or filtering is required to amplify a signal being measured. These include any of the amplifiers dedicated to the head 102 in system 700 of FIG. 7 or in FIGS. 20 and 21, for example. In step 346 the voltage offset error between the front end amplifier of the measurement pod 104 and the head 102 measured in step 346 is determined. This voltage offset error will be used to calibrate errors arising from transmitting the measured signal from the pod 104 to the head 102.

Now turning to FIG. 3E, in step 347, the head 102 adjusts a leakage current (e.g., through the front end amplifier's feedback resistor), for one or more of the current ranges, until the pod 104's measures approximately zero current (e.g., only a few tenths of an Ampere (A), a few mA or a few µA). The leakage current compensation, for one or more of the ranges, is a current applied in the opposite direction of the measured current to decrease, minimize, or zero out that measured current when there is no current flowing into the pod 104. The head 102 may use an analog technique to adjust the leakage current, e.g., place a converter connecting a compensating current into the circuit until the net measured current is zero. The leakage current adjustment may be performed for the hardware input configuration. In step 348, head 102 stores the leakage current of step 347 and/or the voltage offset errors of step 343 in a memory on the pod 104 as calibration corrections. In step 349, head 102 reads the calibration corrections stored to the pod 104's memory in step 348 and applies at least one of the calibration corrections to measurement for each hardware configuration of the pod 104. Note, current measure gain errors may also be calibrated out by using an accurate current source derived from the master voltage reference MR or from stable current source located in the pod 104. Calibration corrections of step 349 can be applied to all current measurements by the pod 104 until the head 102 re-initiates calibration by re-running algorithm 340.

FIGS. 3F and 3G present another flowchart showing an exemplary calibration routine 360 of source pod 104 (or pod 104 in source mode) driven by the head 102. Unlike calibration routine 350, this calibration compares source signals measured by the head 102 via a fully calibrated measurement channel to the actual source signal.

In step 361, the head 102 calibrates a measurement channel against master reference 351a. This is an internal calibration to the head 102 that calibrates its own measurement capabilities.

In step 362, the head 102 commands the source pod 104 to apply a full, positive source signal. This high amplitude signal will be used to calibrate sourcing accuracy. In step 363, the head 102 measures the full positive source signal generated in step 362 using the measure channel calibrated in step 361. In step 364, the head 102 commands the source pod 104 to apply a negative, full scale source signal. In step 365, the head 102 uses the measurement channel calibrated in step 361 to measure the negative, full scale source signal generated in step 364. In step 366, the head 102 commands the source pod 104 to apply a zeroed source signal. This signal is then measured by the head 102 in step 367 using the measurement channel calibrated in step 361.

At step 368, the head 102 compares measurements of the fully positive, fully negative, and zeroed source signals (i.e., the values measured at steps 363, 365, and 367) with the corresponding commanded values of the fully positive, fully negative, and zeroed source signals (in steps 362, 364, and 366, respectively) to determine an error. Finally, at step 369, the head 102 uses the error determined in step 368 to generate and store a measured signal calibration for the source pod 104. The calibration can be used to precisely supply signals to the sample.

Returning to FIG. 3A, the figure shows how head 102 has a digital signal processing unit 324. Although the digital signal processing unit 324 is not shown in FIG. 3A as connected to other aspects of the system 300, it may have multiple, variable connections. For example, it may be connected to the shared synchronizing clock 302 and be synchronized with that clock. It may further accept and process signals from the Digital I/O 310, the source 304 and measurement 306 channels, the Auxiliary I/O, interface 316. Generally, the digital signal processing unit 324 may process signals from, and provide processed signals to, any of these components. The digital signal processing unit 324 may provide timestamps, using synchronization with shared synchronizing clock 302, for data originating from the pods 104 and/or the head 102.

The digital signal processing unit 324 may provide a variety of functions to system 300. For example, it may provide, with respect to a sample 110 measurement signal, any one of a lock-in analysis, an Alternating Current/Direct Current (AC/DC) measure, an inductance (L), capacitance (C), and resistance (R) (LCR) measurement, a time/scope domain presentation, a frequency domain analysis, and a noise analysis. The details of some of these operations will be described below. The digital signal processing unit 324 may also provide, with respect to a sample 110 source signal: AC/DC sourcing, control looping, and providing the source signal from more than one source.

FIG. 3A also shows the head 102 with a power supply 326. Power supply 326 may supply other components of the system than just the head 102. In some applications, for example, it is advantageous for each of the pods 104 and the head 102, and possibly some of the other hardware 314, to all share power supply 326. This can be advantageous for noise and interference mitigation, as well as glitch prevention. Power supply 326 may include be referenced to a common ground in the system (not shown), such as a common ground for the head 102 and pods 104. It may also include a power supply filter to at least one of the pods 104.

Although not explicitly shown in FIG. 3A, the head 102 may supply a single voltage reference to be used by all components in systems 100, 200, and 300. The reference voltage may be used to scale measurements, in the calibrations described herein, in noise determination and mitigation, and for other suitable applications whether described explicitly or implied by this disclosure. Other system-wide references may also be provided for similar purposes.

Any feature described in the context of one of M81 platforms/systems 100, 200, and 300 should be understood to apply and/or be compatible with any of the others. These features endow the M81 platforms/systems 100, 200, and 300 with several advantages over conventional laboratory setups, including, in view of a conventional instrument racks. For example, they can exhibit extremely low noise. It is because sensitive analog circuits in the pods 104 are separated from noisy digital circuits in the head (see, e.g., separation distance 318 in FIG. 3A). M81 platforms/systems 100, 200, and 300 can be highly configurable/reconfigurable. In variations, the combination of pods 104 connected to the head 102 can be configured for a wide variety of experiments. The system is designed so that the digital and power supply circuitry are separated from the sensitive analog circuitry and where digital functions in the sensitive analog circuitry are suspended or shut down while the pods 104 are taking a measurement in order to minimize noise and interference.

M81 systems 100, 200, and 300 can also support multiple ways of communicating between pods 104, head 102, and any other device included in the system. These communication methods include using Standard Commands for Programmable Instruments (SCPI) and queries. In various variations, communication methods can include: USB serial; TCP over ethernet or Wi-Fi; General Purpose Interface Bus (GPIB); etc. Regarding a data streaming buffer, information can be read out from various variations of the M81, for example, at up to 10,000 samples per second. In various variations, for any channel, the buffer can include any combination of the following: Source amplitude; Source offset; Source frequency; Source range; Source compliance; Source sensing errors; DC reading; RMS reading; High peak; Low peak; Peak to peak; In-phase reading (I); Out-of-phase reading (Q); Lock-in magnitude; Lock-in phase difference; Measure range; Overload status; Settling status; Lock; Lock-in reference frequency; etc.

M81 systems 100, 200, and 300 described herein can be utilized in various applications. For example, in solid state electronics: DC and AC resistivity, diode and transistor UV curves, PIN (P-type, intrinsic, and N-type material) diode operating regimes, subthreshold MOSFET characterization, capacitor dielectric absorption, deep-level transient spectroscopy, etc. In quantum and superconducting materials: UV of superconducting materials, thin film kinetic inductance, spin Hall magnetoresistance, anomalous Hall effect, field and angle dependence in magnetic tunnel junctions, spin-torque ferromagnetic resonance, etc.

Variations of the M81 100, 200, and 300 systems have pods 104 capable of hybrid sourcing. This means that, in variations, source pod 104 outputs can combine a DC configured signal chain with an AC configured signal chain. The signal chains can be independent allowing combinations of high-precision AC signals and DC offsets. Variations of the M81 100, 200, and 300 are also capable of seamless ranging while in measurement mode. This means that, in variations, measure pods 104 can have two or more ranging amplifiers and two analog to digital converters. This arrangement can suppress glitches that would otherwise affect measurements as the measured signal traverses measurement ranges across multiple orders of magnitude. Variations of the M81 100, 200, and 300 can also support flexible lock-in, in the sense that each source and measurement pod 104 can be referenced to each other or an external reference. Variations of the M81 100, 200, and 300 can also support external phase relationships. This means that, in variations, the phase shift of each source pod 104 can be independently configured while using the same reference. Each of these advantages will be described in more detail below.

Signal Sourcing

Overview of Features

M81 platforms/systems 100, 200, and 300 can utilize any type of source pod 104 described herein. FIG. 4 illustrates several exemplary source pod configurations with exemplary features. For example, an enhanced combination source/measure pod can combine the capabilities of source and measure pods by using a channel for each. A precision source pod can include an I (current) or V (voltage) source with built-in current or voltage readback. This can assist in rejecting environmental noise that would otherwise confound cryogenic experiments with strict power limitations. Source pods 104 further may include balanced current sourcing (BCS), as described further below, which can ensure the same amount of current is returned as is provided. This helps protect sensitive equipment to surges.

It is to be understood that FIG. 4 illustrates combinations of features that may be practical for certain applications. In some cases, it may be advantageous to include more or fewer features than are shown in FIG. 4. For example, it may be advantageous in some cases for enhanced combination source/measure pods and precision source pods to provide common mode noise rejection. It may be advantageous in some cases for the balanced current source pod to accommodate hybrid AD/DC sourcing. All of these variations should be considered within the context of the present of the current disclosure.

Noise Reduction in Source Signals

Figure 5A:
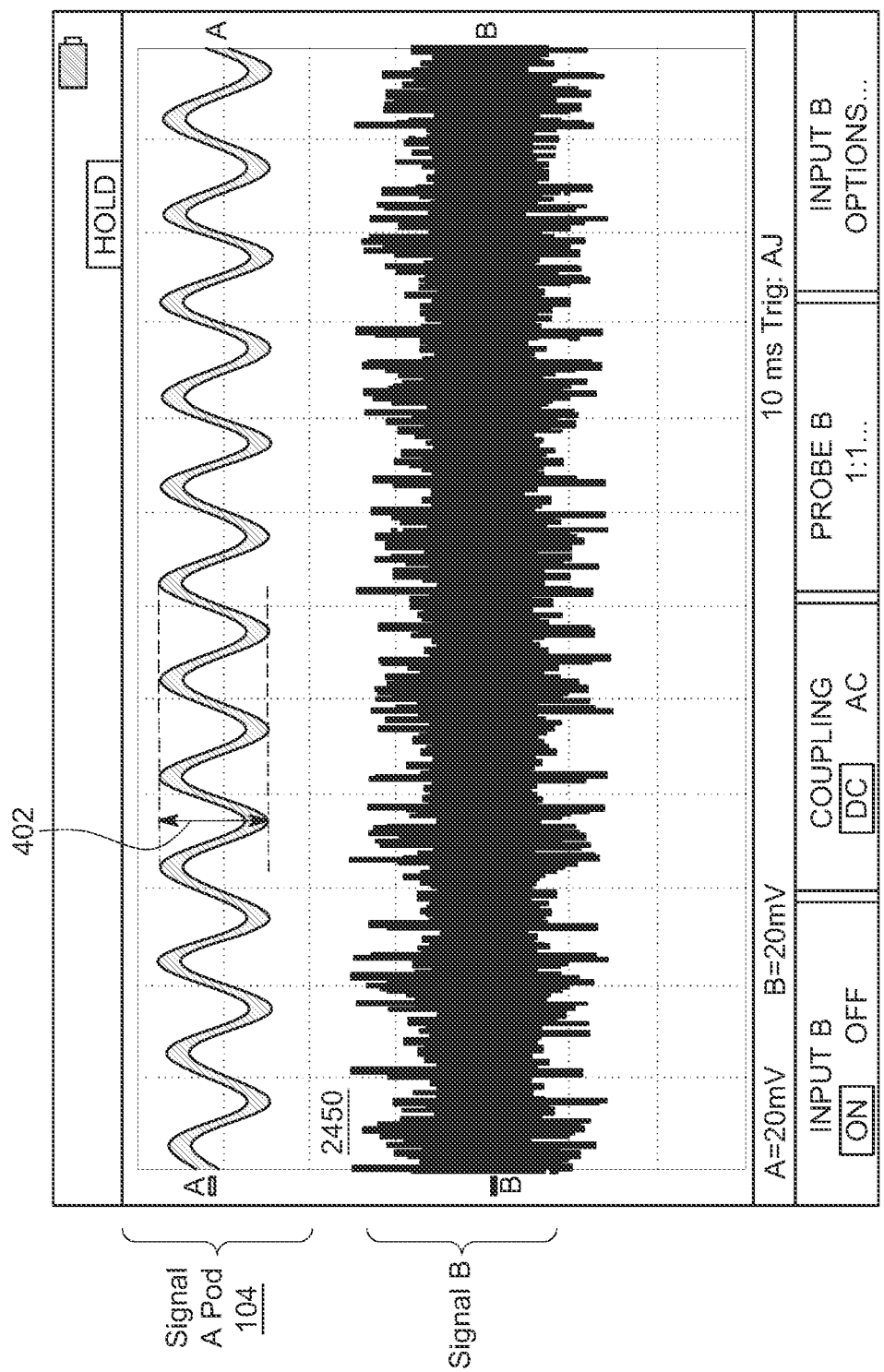
FIG. 5A shows a direct comparison of noise for a 1 μA current source in systems 100, 200, and 300 with noise in a more conventional setup.
Figure 5B:
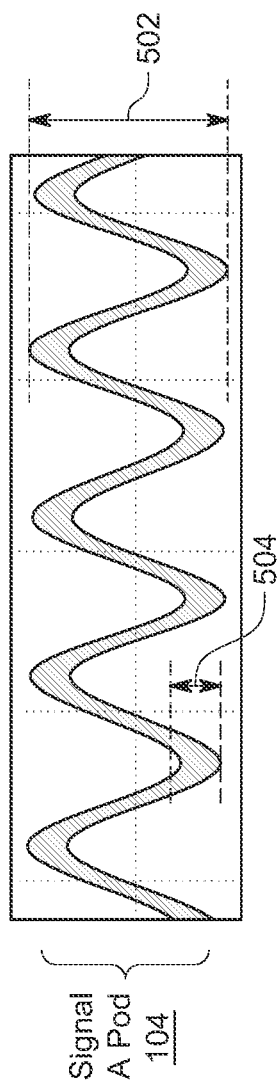
FIG. 5B shows a blowup of the signal A from the pod 104 within the context of the present disclosure.
Figure 5C:
FIG. 5C shows a blow-up signal B from FIG. 5A.

FIG. 5A shows a direct comparison of signaling noise of an M81 (e.g., systems 100, 200, and 300) with a more conventional setup. More specifically, FIG. 5A is a screen capture of noise of an exemplary M81 current source pod 104 (labeled "A" in FIG. 5A) and a more conventional laboratory current source (a conventional commercial current source labeled "B" in FIG. 5A). Both sources are delivering current in the 1 µA range. FIG. 5B shows a blowup of the signal A from the M81 pod 104. FIG. 5C shows a blow up of signal B from the same section of FIG. 5A. Comparison of FIGS. 5B and 5C shows favorable signal to noise ratio for pod 104 signal A. In particular, the 1 µA signal amplitude 502 of signal A is several times larger than an exemplary noise amplitude 504 of signal A. In contrast, the 1 µA signal amplitude of signal B is essentially buried in its noise amplitude 506, which is several times greater than signal amplitude 502 of signal A. It is also many more times the noise amplitude 504 of signal A.

Synchronization

The M81 system 100, 200, and 300 is inherently synchronized via shared synchronizing clock 302 (FIG. 3A). In particular, synchronization allows signals sent to samples 110 from source pods 104 to be synchronized with measurement pods 104, as well as the analytical hardware (e.g., digital signal processor 322) in the head 102 itself.

Figure 6A:
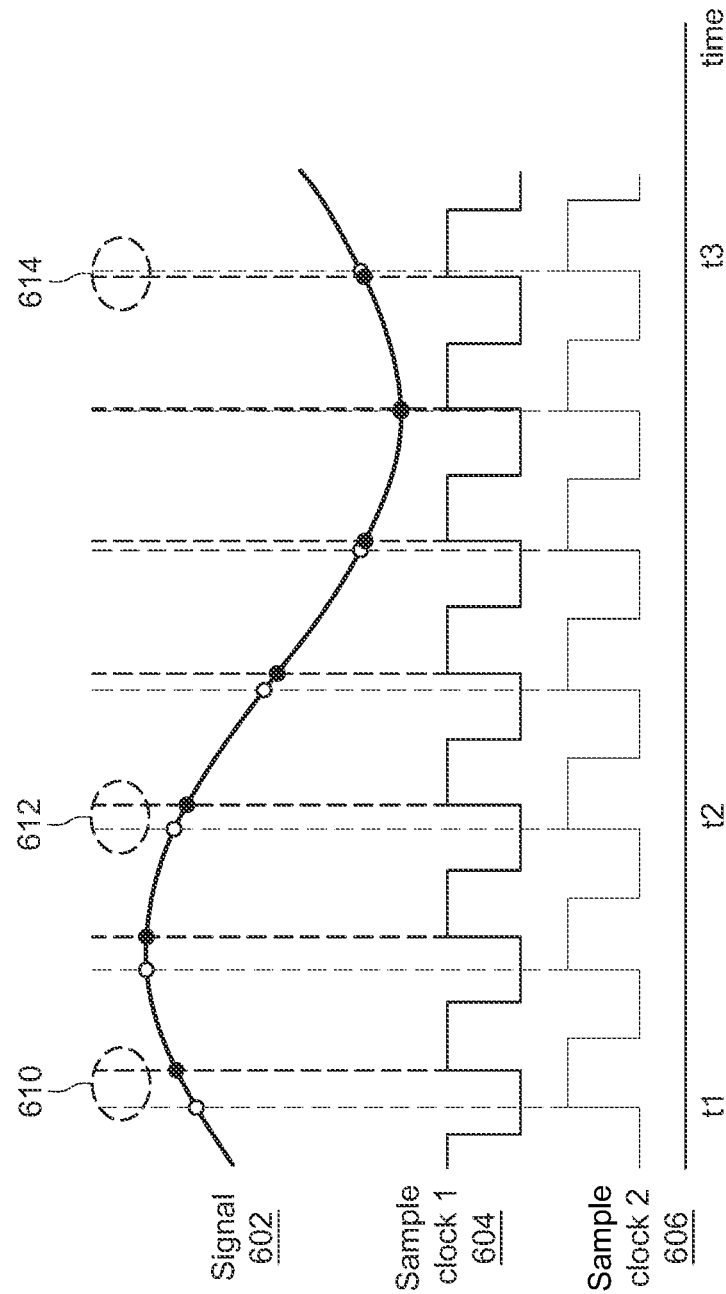
FIG. 6A illustrates the effect of mismatched time bases in a conventional instrument rack, something that can be avoided by using the shared synchronizing clock 302 of the present disclosure.
Figure 6B:
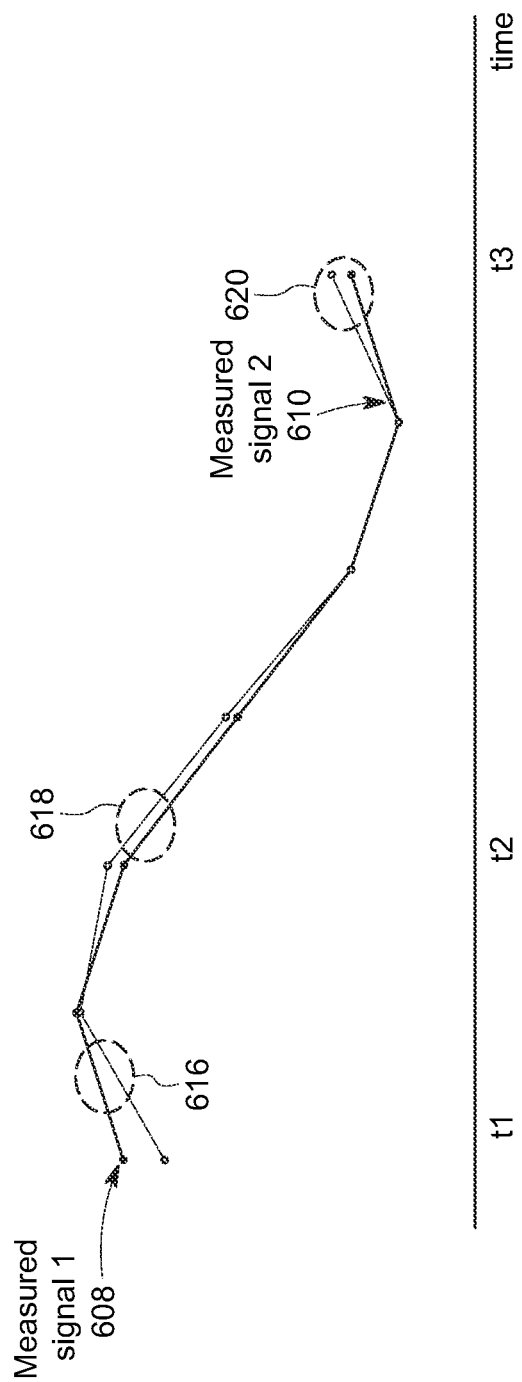
FIG. 6B illustrates other effects of mismatched time bases in a conventional instrument rack.

FIGS. 6A and 6B depict the effect of mismatched time bases in a conventional instrument rack, something that can be avoided by using the shared synchronizing clock 302. With a traditional instrument rack, the clocks and timestamps of the source signal 602, and a sample measurement signal clock 1 604 and sampled measurement signal clock 2 606 may be misaligned as shown in FIG. 6A.

Moreover, the misalignments between clock 604 and 606 may evolve with time. Compare, for example, the different misalignments 610, 612, and 614 and different times t1, t3, and t3. These misalignments result in differences in measured signal 608 shown in FIG. 6B at 616, 618, and 620 at t1, t3, and t3. These frequency and phase differences can create significant problems in data analysis. They lead to imprecision and error. The problem can be insidious and difficult to correct since the time variation can make it appear non-systematic. Although FIGS. 6A and 6B present the synchronization problem in the context of measured and source signals, it is to be understood that this is merely exemplary. A lack of synchronization can plague more than experimental measurements. It can also confuse and confound system-wide instructions, calibrations, and data analysis.

Synchronization problems are avoided by the M81 100, 200, and 300 system sharing one clock sample clock (e.g., clock 302) among all sources and measurement pods 104 and head 102. This inherently and automatically synchronizes all instrumentation, avoiding the inconsistencies between source and measured signals shown in FIGS. 6A and 6B.

Hybrid Sourcing

"Hybrid sourcing" creates analog output source signals from both AC and DC components. The technique can leverage the advantage of both AC and DC sourcing electronics by creating separate gain paths for the AC and DC signals. It can also construct source signals with lower levels of noise, higher resolution, and greater flexibility, than conventional single converter sourcing. Variations of the M81 100, 200, and 300 have the hybrid sourcing capability, as discussed below and in more detail in co-pending U.S. Provisional Patent Application No. 63/034,052, herein incorporated by reference.

Figure 7:
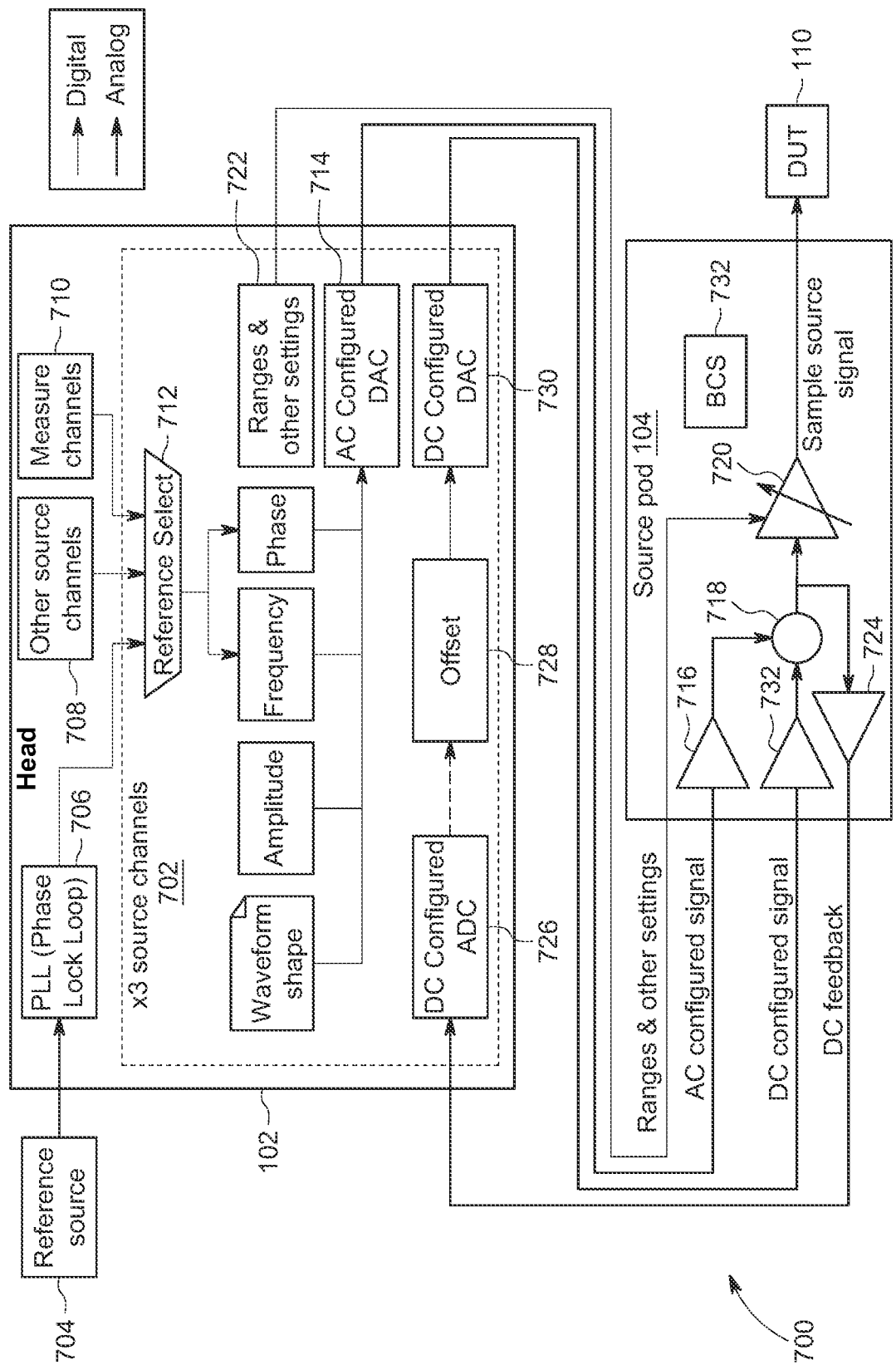
FIG. 7 illustrates a source signal chain 700 between an exemplary head unit 102 and exemplary source pod 104 in variations of systems 100, 200, and 300.

FIG. 7 illustrates a source signal chain[1] 700 between an exemplary head unit 102 and exemplary source pod 104 in variations of systems 100, 200, and 300. The components shown as part of the head 102 in FIG. 7 (i.e., components 702, 706-714, 722, and 726-730) may be part of the digital signal processing unit 324 shown in FIG. 3A.

As shown in FIG. 7, the M81 includes source channels 702. In the exemplary case shown in FIG. 7 there are three source channels 702, however it is to be understood than any suitable number of source channels is possible. The source channels 702 are fed a reference signal 704 via a phase lock loop (PLL) 706. The source channels 702 may also include signals from other source channels 708 as well as measure channels 710 from other pods 104. Input signals 708, 710, and 704 can then be selected for sourcing by reference select 712. Various aspects of the selected signal, including waveform shape, amplitude, frequency and phase, can then be sent an AC Configured Digital to Analog Converter (DAC) 714. The operation of an AC Configured DAC 714 will be further discussed below. The AC configured source signal can be combined with a DC configured signal to the sample 110 via suitable amplification.

[1] The terms "chain" and "path" with respect to signal routing are used herein interchangeably.

Both the AC and DC configured signals can have independent configuration through their respective DACs, as well as separate amplification. The DC configured signal is derived from DC feedback from the combined signal in order to adjust the Sample source signal. Incorporating feedback and independent AC and DC configuration in hybrid sourcing can improve the resolution and update rates of the source signal. Real-time feedback and independent configuration can avoid or minimize error sources, such as offset errors, gain errors, differential non-linearity errors, integral non-linearity errors, calibration errors, output noise, dynamic range, output bandwidth, source impedance, output drive capabilities, switching noise, phase errors, drifts vs. time and drifts vs. temperature, etc.

FIG. 7 shows an exemplary hybrid source 700 configuration. The Sample source signal (i.e., the signal sent by the chain 700 to DUT 110) is a combination of an AC signal ("AC configured signal") and a DC signal ("DC configured signal"). These signals are combined to create the Sample source signal via a variable gain 720 that can be dynamically ranged to avoid glitching in the signal. The DC configured signal is generated based on DC feedback from the combination of the AC configured signal and the DC configured signal.

More specifically, the AC Configured DAC 714 provides the AC configured source signal to amplifier 716 in source pod 104 where it is combined with a DC configured source signal by 718 and provided to ranged amplifier 720, then onto sample (DUT) 110. The waveform shape, amplitude, frequency, and phase of the source provided to the AC Configured DAC 714 may be pre-programmed, selected by the user, and/or selected among options by the head 102 according to user preference and/or protocol (e.g., measurement or diagnostic). The output of 718 is also provide as DC feedback via amplifier 724 to DC Configured ADC 726 of the head 102. The DC feedback signal is then sent to a DC Configured DAC 730 via offset 728, then routed via amplifier 732 to 718.

As shown in FIG. 7, the range of ranged amplifier 720, along with other settings, can be selected by via a "ranges & other settings" signal sent via ranges & other settings element 722 of head 102. Ranges and other settings may be pre-programmed, selected by the user, and/or selected among options by the head 102 according to user preference and/or protocol (e.g., measurement or diagnostic).

Source pod 104 may further include digital (non-analog) circuitry capable of performing various functions, including analysis, communication of data, command information, power regulation, timing, and communication with external devices. In variations, source pod 104 has the capability to de-activate this non-analog circuitry while providing its source signal or performing a measurement. Doing so decreases the amount of interference and noise in the signal or measurement. For the same reason, digital signals in the source pod 104 may be isolated from the measurement pod 104 and the head 102.

Figure 8:
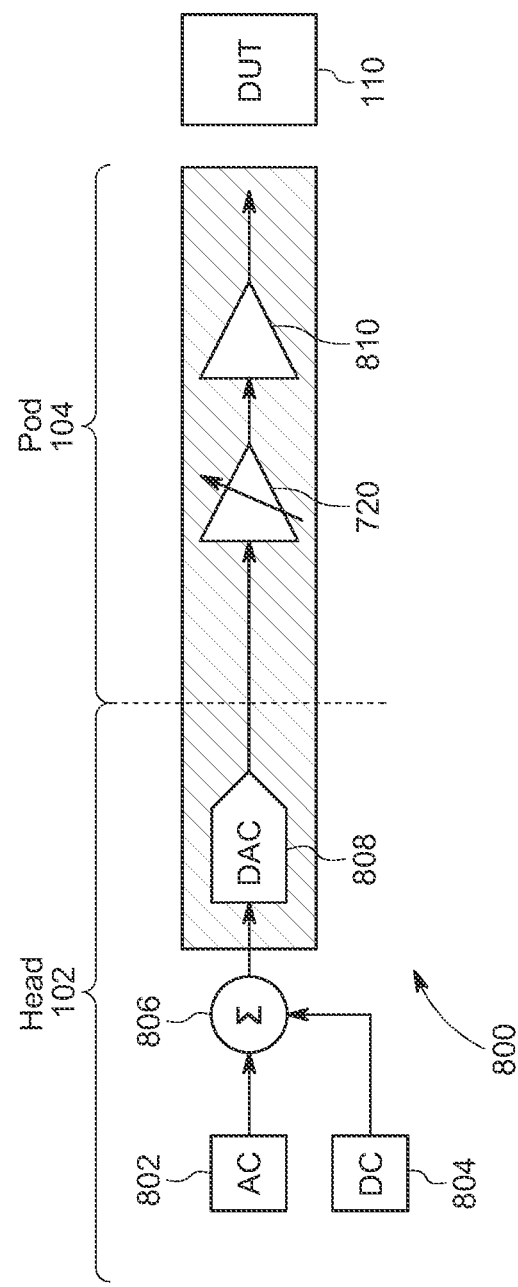
FIG. 8 illustrates an exemplary source signal chain 800 where Alternating Current (AC) 802 and Direct Current (DC) 804 inputs are added together digitally by mixer 806 in variations of systems 100, 200, and 300.

Before delving into hybrid sourcing in more detail, it is useful to consider a more conventional, non-hybrid source. FIG. 8 illustrates one such non-hybrid source signal chain 800 where AC 802 and DC 804 inputs are added together digitally by 806. Chain 800 is suitable for when AC 802 and DC 804 inputs are generally in the same, or similar, range. In this configuration, small AC signals relative to the DC signal have only a few bits of resolution. DAC 808 converts the AC/DC combined signal to analog, provides it to variable amplifier 720, amplifier 810, and then sample 110. Although FIG. 8 does not explicitly show a DC feedback mechanism, as shown in FIG. 7, it is to be understood that it may include such feedback, for example through DC input 804.

Although chain 800 may be included with systems 100, 200, and 300, it has some drawbacks. Chain 800 must provide gain to AC and DC input signals simultaneously. Therefore, there is no opportunity for independent configuration of the AC and DC signal chains. In addition, there is little latitude for gain configuration. The only flexibility in chain 800 comes from variable gain 720 which must be configured for both AC and DC at the same time.

In contrast, FIGS. 9-12 show exemplary alternative approaches to hybrid sourcing that offers much more flexibly and accuracy. Each of these systems can configure DC and AC signal paths independently. They can be uses in conjunction with source signal chain 700 and systems 100, 200, and 300. Other approaches that can be used for hybrid sourcing are laid out in U.S. Provisional Patent Application No. 63/034,052.

Figure 9:
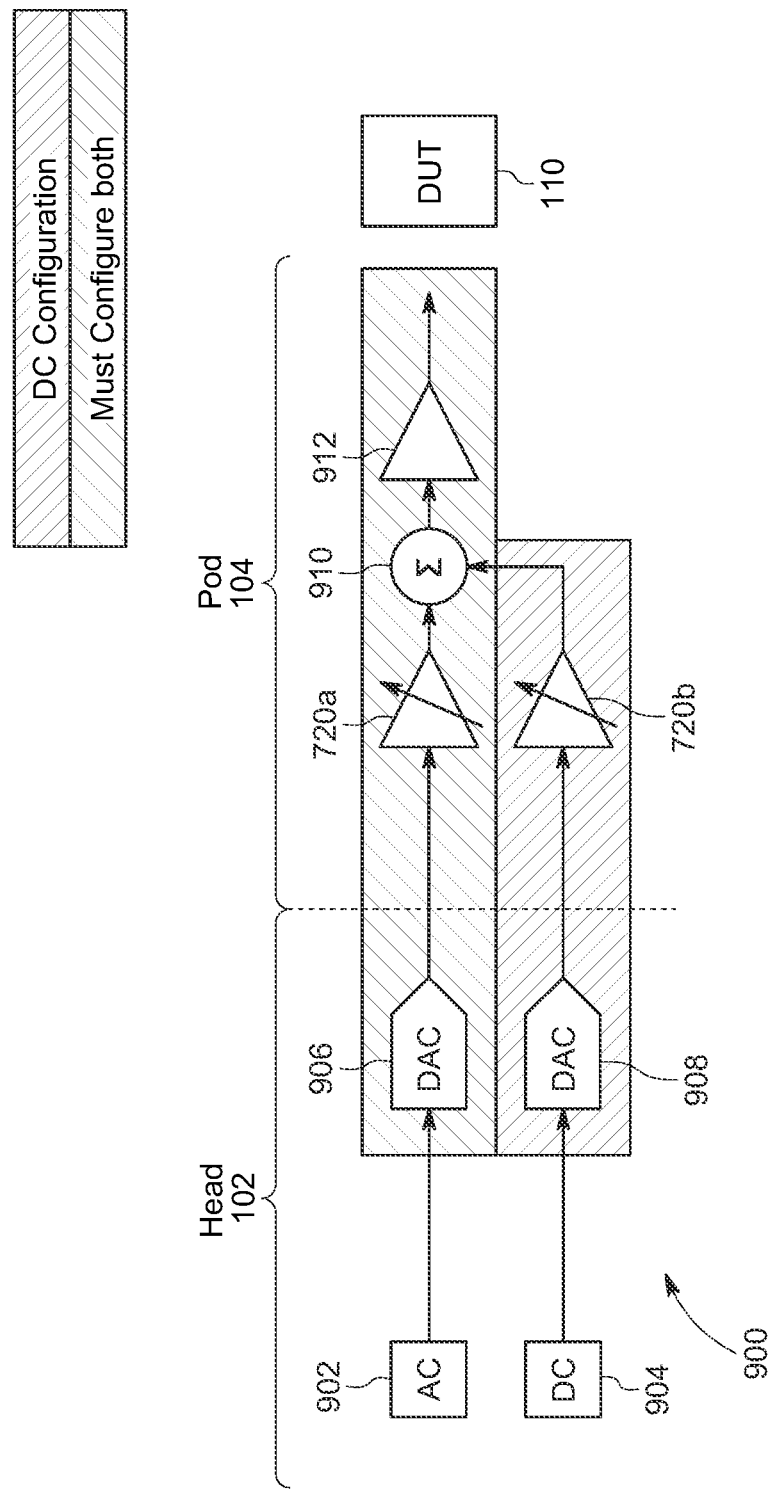
FIG. 9 illustrates an exemplary source signal chain 900 where AC 902 and DC 904 inputs are separately converted by DACs 906 and 908, respectively in variations of systems 100, 200, and 300.

FIG. 9 illustrates an exemplary source signal chain 900 where AC 902 and DC 904 inputs are separately converted by DACs 906 and 908, respectively in a combined configuration ("Must Configure Both") while AC and DC configuration occurs in parallel. This allows AC 902 and DC 904 inputs to be configured and ranged separately and independently, giving greater flexibility in defining ranges for the AC 902 and DC 904 contributions to the signal ultimately sent to sample 110. Each AC 902 and DC 904 input is also separately applied to variable gain 720a and 720b, respectively. The variable gains 720a and 720b may be set by ranges & other settings 722 (FIG. 7), or by user preference, protocol, or may be pre-set. DC Gain 720b may or may not depend on the output to the sample 110, as disclosed in the context of system 700 and FIG. 7. After variable amplification, both AC and DC signals are summed 910, sent to amplifier 912 and onto the sample 110.

Figure 10:
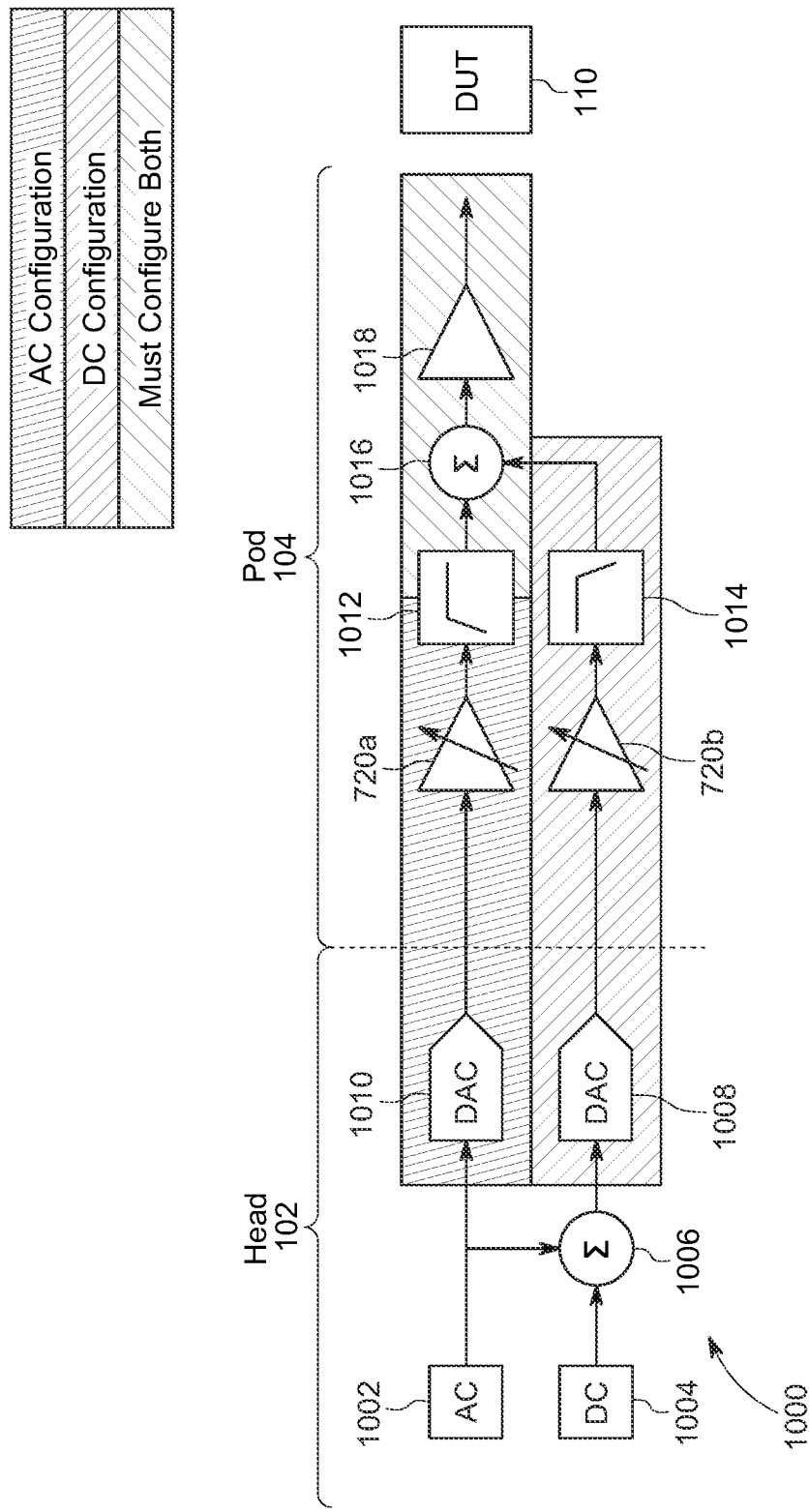
FIG. 10 illustrates another exemplary source signal chain 1000 where the AC circuit ("AC configuration") is prevented from affecting the accuracy of the DC circuit in variations of systems 100, 200, and 300.

FIG. 10 illustrates another exemplary source signal chain 1000 where AC and DC configurations are separate and parallel. In chain 1000, the AC circuit ("AC configuration") is prevented from affecting the accuracy of the DC circuit. In this case, it is advantageous for the bandwidth of AC and DC paths to differ substantially from a transition frequency to obtain a flat frequency response when they are summed and sent to the sample 110.

As shown in FIG. 10, first the summation of the AC 1002 and DC 1004 inputs at 1006 is sent to the DAC 1008 in the DC configuration path. The AC 1002 input is sent to the DAC 1010 in the AC configuration path. Both AC and DC signals are then amplified by a variable amplifier (720a and 720b, respectively). Gains 720a 720b for the DC and AC Configuration circuits are different and can be configured for each. They may be set in the same manner described above for gains 720a and 720b in the context of FIG. 9. Next, the AC Configuration signal is high pass filtered 1012 to remove low frequency components. The DC Configuration signal is low pass filtered 1014 to remove high frequency components. The filtered AC and DC signals are then summed at 1016. The summed signal is amplified at 1018 and sent to the sample 110.

Figure 11:
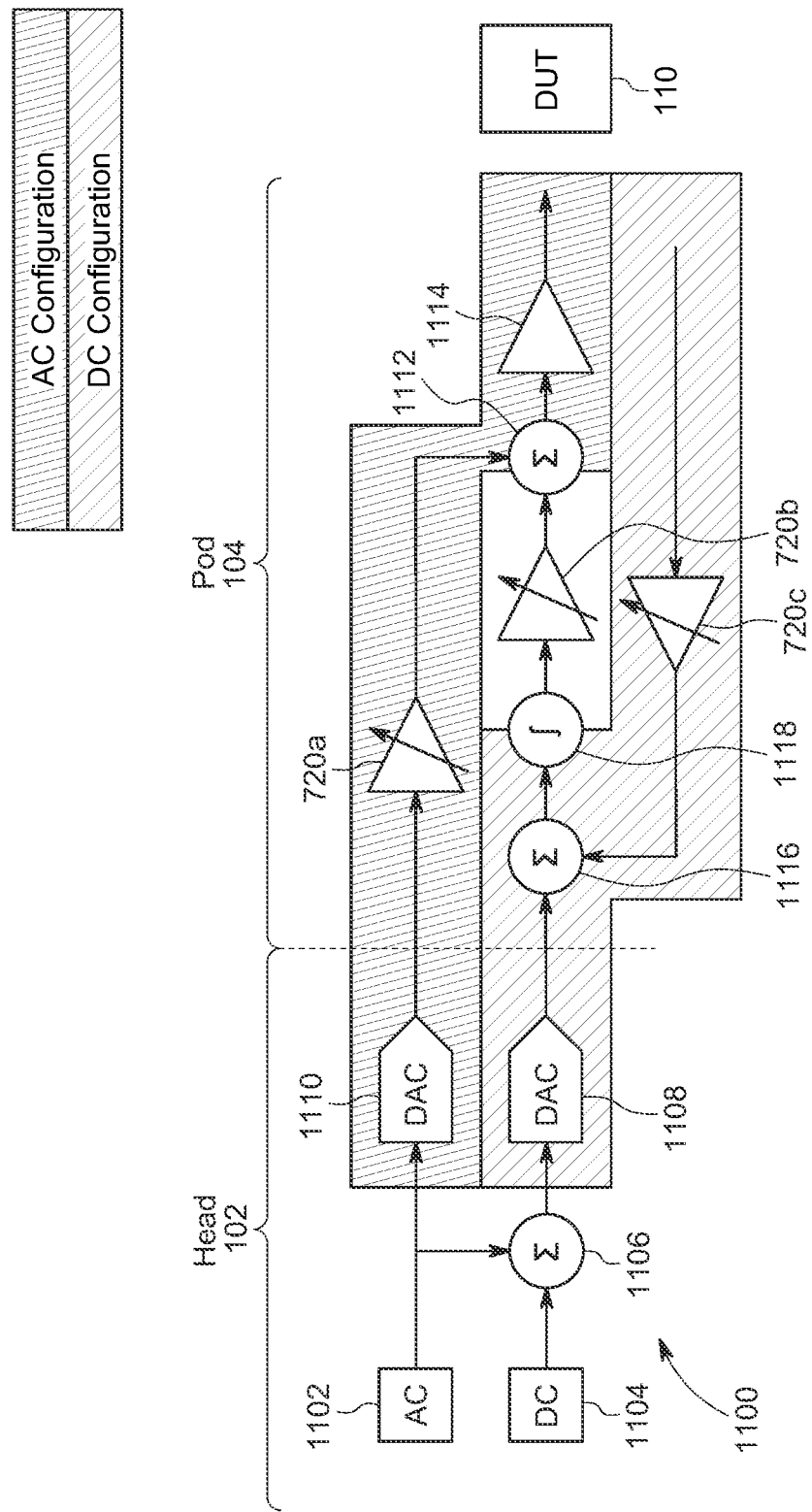
FIG. 11 illustrates another exemplary source signal chain 1100 having a DC feedback loop within the context of the present disclosure.

FIG. 11 illustrates another exemplary source signal chain 1100 having a DC feedback loop. AC and DC inputs 1102 and 1104, respectively, are summed 1106 and sent to the DC Configuration path via DAC 1108. The AC input 1102 is fed to the AC Configuration path via DAC 1110. The AC Configuration path then passes through a variable amplifier 720a before it is summed 1112 with the signal from the DC Configuration path, after it has been amplified by 720b. Gains 720a and 720b may be set, as discussed above, in the context of FIGS. 9 and 10. The sum 1112 is then fed via amplifier 1114 and to sample 110.

DC feedback is accomplished as follows. The DC Configuration path from DAC 1108 is summed 1116 with the DC input signal after DAC 1108 processing, then to variable amplifier 720c via 1118. Gain 720c may be set as discussed above for 720a and 720b. Subsequently, the DC Configuration signal is summed at 1112 with the AC Configuration signal. This feedback loop essentially treats the AC path as a disturbance to the DC path, allowing for a flat frequency output to sample 110.

Figure 12:
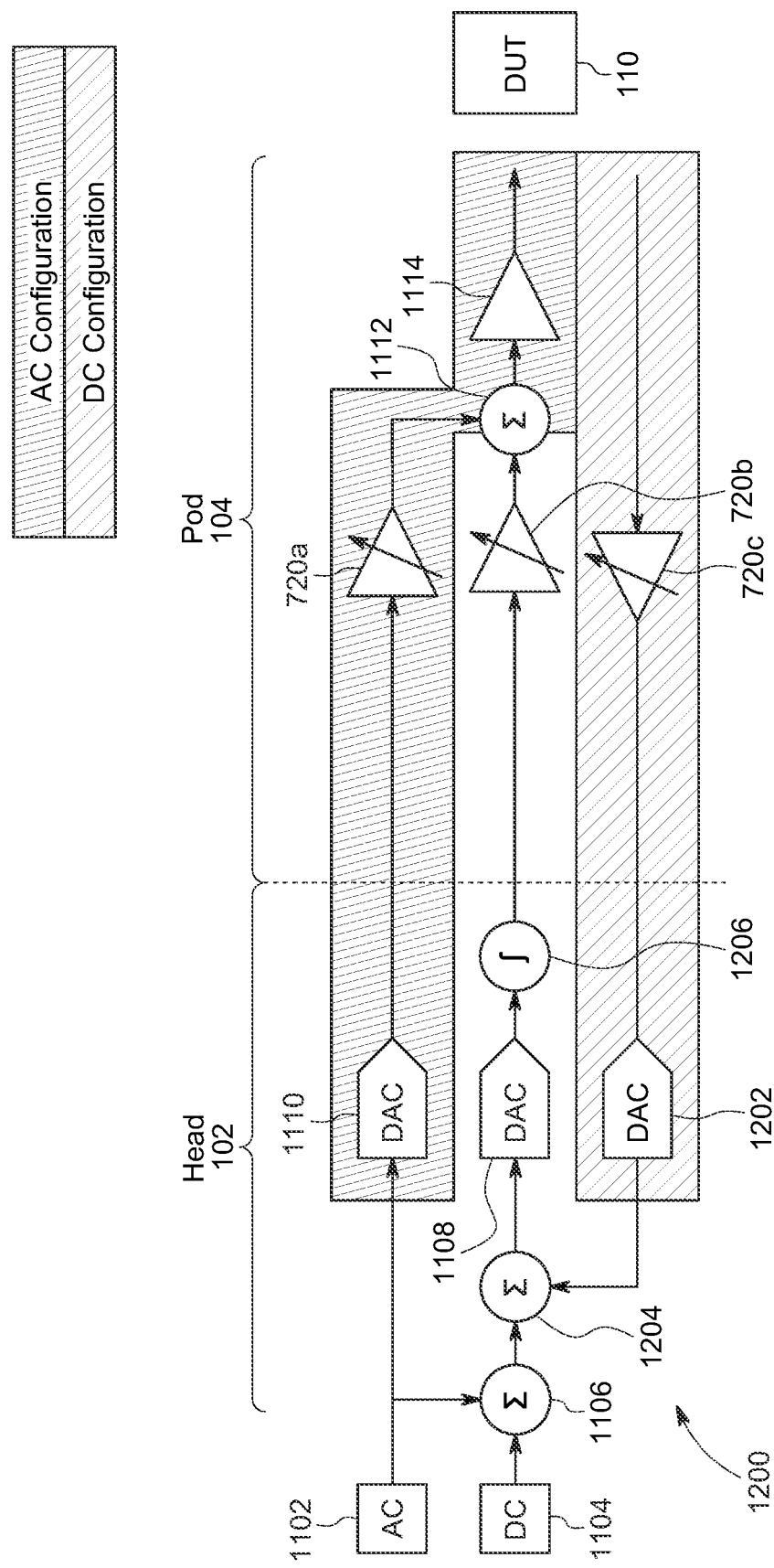
FIG. 12 illustrates another exemplary source signal chain 1200 with digitized feedback within the context of the present disclosure.

FIG. 12 illustrates another exemplary source signal chain 1200 where the DC feedback is digitized feedback using an ADC. This introduces less DC inaccuracy, enhances the DC DAC resolution. Chain 1200 also leverages the fact that ADCs are typically more accurate and offer better control than DACs.

The AC Configuration path in chain 1200 is identical to that in chain 1100 in FIG. 11. The DC Configuration path of chain 1200 differs from that of chain 1100 primarily by including ADC 1202 in DC feedback. However, there are some other subtle differences. Specifically, DC feedback from the sample 110 is fed via variable amplifier 720c to ADC 1202 where it is converted to an analog signal. That signal is then summed 1204 with DC the combined DC input/AC input signal from 1106. Subsequently, the combined signal is fed to DAC 1108, via 1206, amplifier 720b and then summed with the AC Configured signal at 1112. Gains 720a, 720b, and 720c can all be set as described above with respect to FIG. 11.

Balanced Current Source

Turning back to FIG. 7, source pod 104 may further include balanced current sourcing (BCS) capabilities 732. BCS 732 is explained in more detail in U.S. Pat. No. 6,501,255 (the '255 patent) to Pomeroy entitled, "DIFFERENTIAL CURRENT SOURCE WITH ACTIVE COMMON MODE REDUCTION," and filed on Oct. 4, 2001, the entirety of which is herein incorporated by reference.

Briefly, measurement systems (e.g., systems 100, 200, and 300) can be vulnerable to inconsistent loading causing current spikes and/or asymmetries between input/out. These spikes may harm components of those systems. Another problem with single ended current sources is that the output current return is not controlled if the load is grounded to the sources return. The single ended current source also produces a common mode voltage on the load. In such a current source the output and the return have different impedances, which creates an unbalanced load. Common mode noise coupling into leads with different impedances reacts to cause normal mode noise which can negatively affect the desired current excitation. There is a need for current balancing in the materials measurement context where both floating and grounded loads can be addressed without substantially altering or rewiring circuitry. BCS 732 addresses this need.

As discussed in the '255 patent, BCS 732 drives the load with two modified Howland current sources that deliver equal currents in the opposite direction into each side of the load. In the context of systems 100, 200, and 300, BCS 732 uses a sensing resistor to measure a source current associated with a source signal sent to the sample from the source pod 104 ("Sample source signal" in FIG. 7). It then varies a resistance range of the sensing resistor according to the magnitude of the measured source current. BCS 732 can also balance load by altering resistance of either (or both) of the source and measurement pods 104 based on this source signal measure. For example, when the measured source current exceeds a threshold, the BCS 732 can increase or decrease the resistance of one or both pods 104 to lower the current below the threshold. The threshold current may represent, for example, a current above which damage would be done to one or more of the components of systems 100, 200, and 300.

Digital Source Synthesis

Variations of the M81 100, 200, and 300 can create source signals using direct digital synthesis. Direct digital signal gives greater consistency and control over the source signal. A digital signal also tends to have less variability and drift. Since these issues ultimately result in noise or ambiguity in the output signal, using direct digital synthesis can improve the accuracy and reproducibility of measurements. Although certain specific examples are described below, it is to be understood that any suitable mechanism for providing a digital source signal may be used in conjunction with any of the variations described herein.

Figure 13:
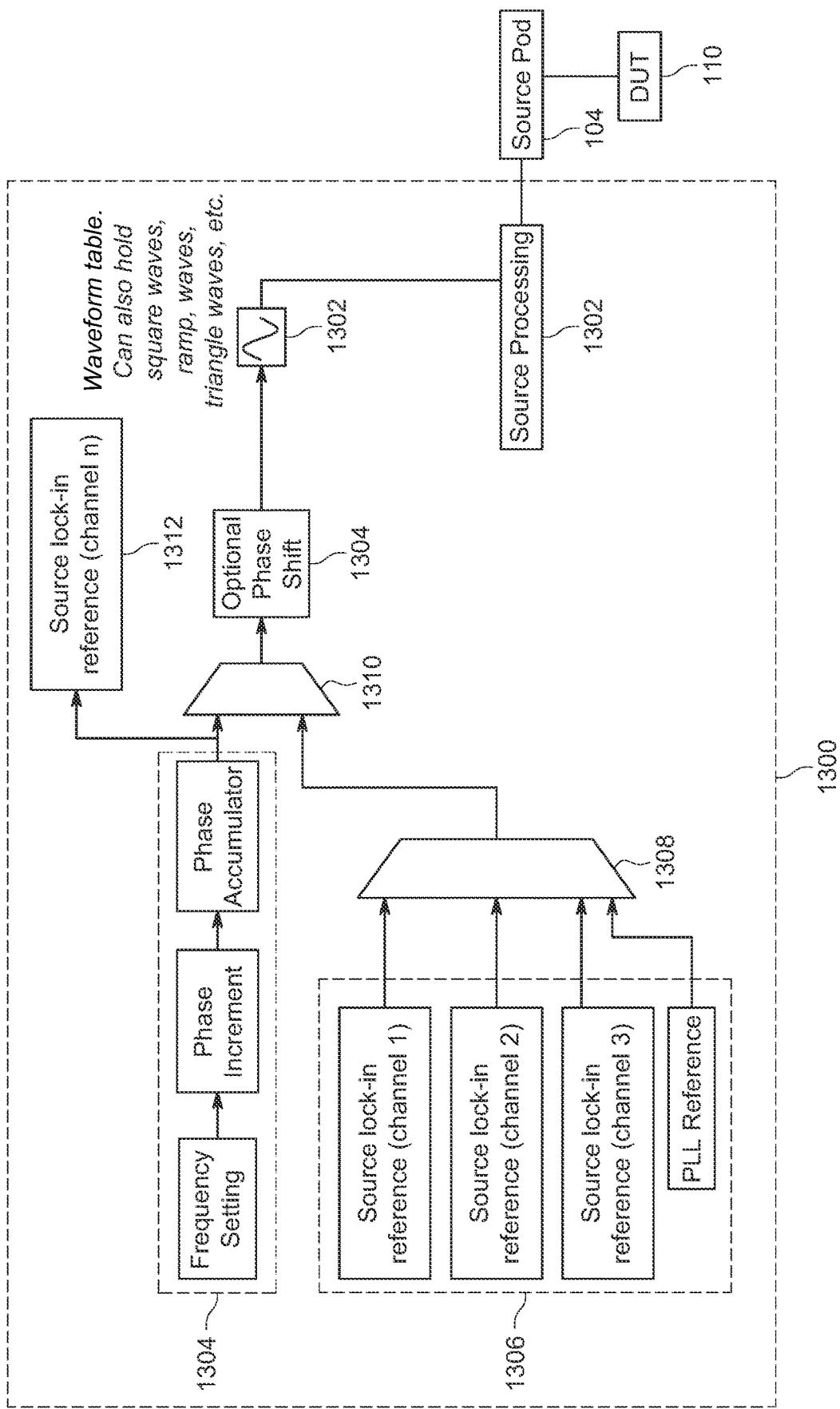
FIG. 13 illustrates one exemplary variation of a digitally synthesized source channel 1300 within the context of the present disclosure.

FIG. 13 illustrates one exemplary variation of a digitally synthesized source channel 1300. Digitally synthesized source channel 1300 may be part of the digital signal processing unit 324 shown in FIG. 3A.

The source may be principally derived from a waveform table 1302. Table 1302 can be an algorithm (software or firmware) that generates the waveform based on a number of inputs 1304 The inputs 1304 may direct the table 1302 to select the particular wave form to source. Inputs 1304 may select frequency, phase shift, and lag, among other things. Each of these inputs 1304 is not necessarily used in every variation. Inputs 1304 may be stored locally, may be input directly by the user, may be generated by other software and/or according to measurement or diagnostic protocols.

Reference signals 1306 may also be included as inputs to the table 1302. References 1306 include source references from lock-in amplifiers (e.g., source lock-in references from channels 1-3) and phase-locked loop (PLL) reference. References 1306 may be selected by mux 1308 and sent to multiplexer (mux) 1310 where they are combined with wave form settings 1304 and additional references 1316. References 1306 may be chosen by the user, other software and/or according to measurement or diagnostic protocols. They are then sent to the table 1302 for selection of the specific waveform to output as a source signal. An output waveform from the table 1302 may then be further processed 1302 by any signal processing method described herein and provided to the source pod 104. Channel 1300 can also use a lock-in reference with optional phase shift 1304, rather than be chosen directly via inputs 1304. In this case, the source's frequency and phase can be determined by a lock-in reference signal (e.g., reference 1312). Optional phase shift 1304 can set the phase relationship with the reference 1312. The external phase relationship can be configured differently for each channel.

Figures 14, 15:
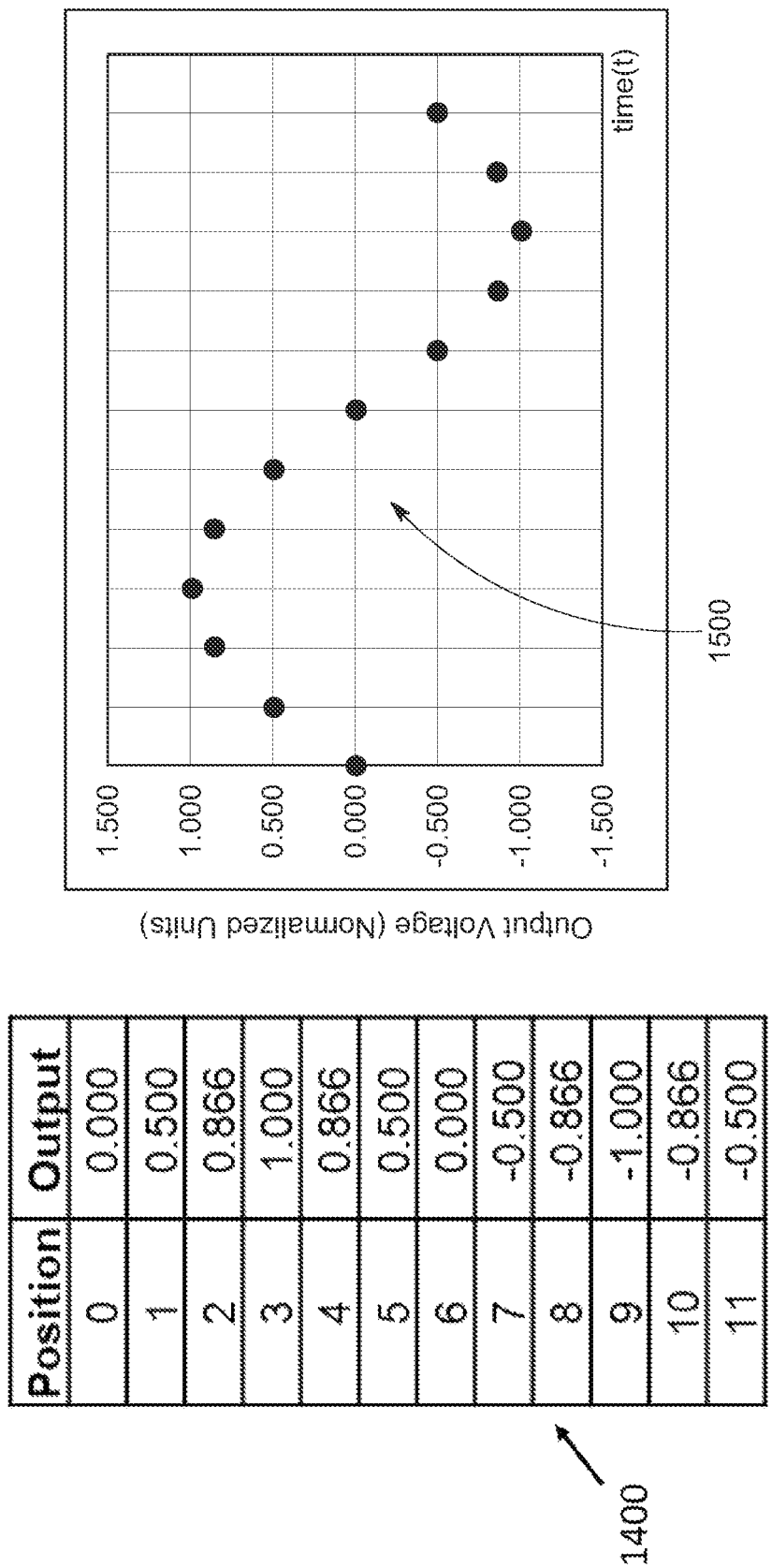
FIG. 14 shows an exemplary variation of a source wave table 1400 that can be used in conjunction with digital source 1300 within the context of the present disclosure.
FIG. 15 is a waveform 1500 generated by plotting source wave table 1400 that can be used in conjunction with digital source 1300 within the context of the present disclosure.

FIGS. 14 and 15 show an exemplary variation of a source wave table 1400 that can be provided by element 1302 of digital source 1300. Waveform 1500 in FIG. 15 is generated by plotting the data in table 1400. FIG. 15 plots a single period of waveform 1500 in relative units.

In one variation, a source signal supply algorithm can repetitively increment through the table 1400 representing one or more periods of a waveform. The table 1400 provides waveform amplitude (Output) vs. time (Position), both in normalized units. Using normalized units is not a requirement. It is convenient for scaling either the voltage or time dependence of the waveform based on inputs 1304. In this way, the table 1400 determines the waveform 1500's shape. The rate at which the algorithm cycles through the table 1400, called the phase increment (element 1304, FIG. 13), determines the waveform 1500's frequency.

The "Position" of the table 1400 need not change by an integer. In certain variations, for example, a higher resolution phase accumulator (element 1304, FIG. 13) can be used to keep track of waveform 1500's phase. The phase accumulator 1304 can increment by non-integer amounts to translate this phase into a Position in the table 1400.

Figure 16A:
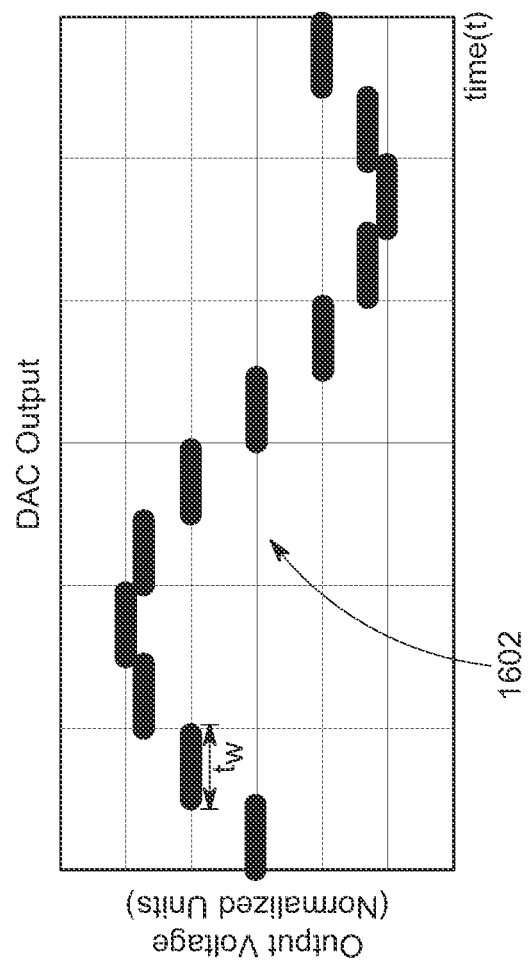
FIG. 16A shows a stepped waveform from low pass filtering the waveform in FIG. 15.
Figure 16B:
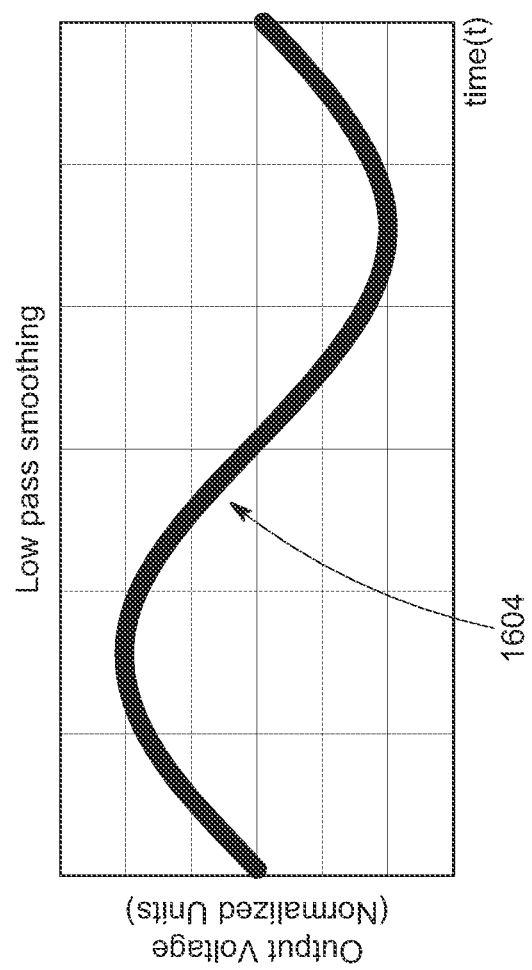
FIG. 16B shows a smoothed version of the waveform in FIG. 16A.

The waveform 1500 in FIG. 15 can be smoothed and/or made continuous, either by the table 1302 itself or in source processing 1302. For low-pass smoothing, discrete output values with a non-zero width in time $t_w$ can replace the values in the table of FIG. 14. As shown in FIG. 16A, this creates a "stepped" output waveform 1602. Applying an analog low pass filter to 1602 creates a smooth waveform 1604 shown in FIG. 16B. AC waveform 1604 can be combined with a DC offset setting (not shown) and fed into a closed loop DC sourcing system in Source Processing 1302. This can be part of the hybrid sourcing variations discussed above in the context of FIGS. 8-13.

Advanced Measurement Technology

M81 platforms/systems 100, 200, and 300 can utilize measure pods 104 with a number of different features. The specific type of pod 104 used and its measurement features may depend on application and/or practical considerations. FIG. 17 presents several exemplary measurement pod 104 variations with their feature sets. An "enhanced combination source/measure pod" can combine the capabilities of source and measure pods by using a channel for each. A "voltage measure pod" can be single ended or have differential voltage measurement with continuity through multiple orders of magnitude. A "current measure pod" can include a transimpedance amplifier measuring current into a virtual ground. It is to be understood that, while FIG. 17 illustrates combinations of features that may be practical for certain applications, in some cases it may be advantageous to include more features than are shown in FIG. 17. For example, it may be advantageous in some cases for enhanced combination source/measure pods to measure voltage, current, have lowest noise, analog filters, seamless and seamless ranging. All of these variations should be considered within the context of the present of the current disclosure.

Figure 18:
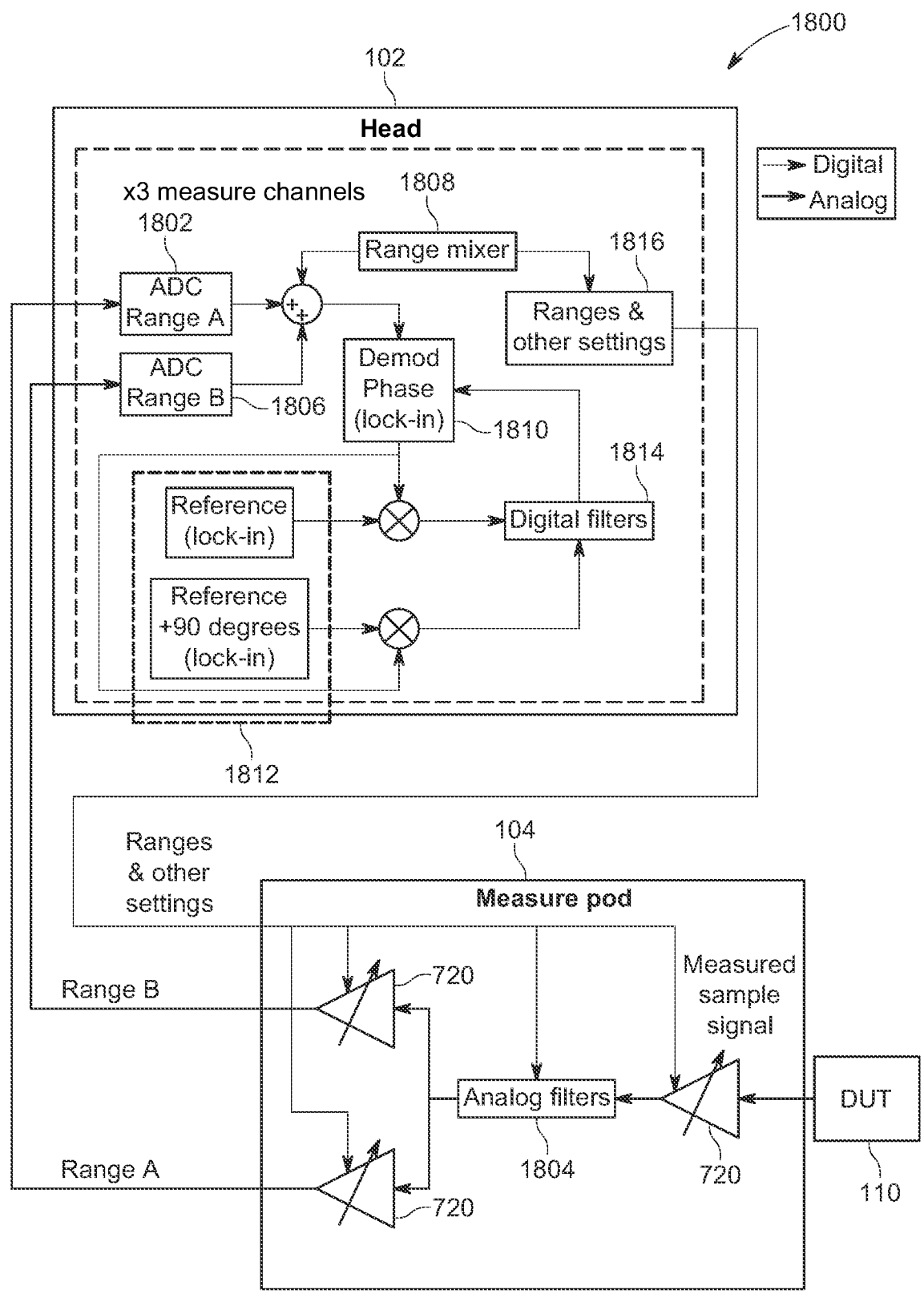
FIG. 18 illustrates the measurement signal chain between an exemplary head unit and exemplary measure pod 104.

FIG. 18 illustrates a measurement signal chain 1800 between an exemplary head unit 102 and exemplary measurement pod 104 in variations of systems 100, 200, and 300. The portions of signal chain 1800 in the head 102 (i.e., 1802, 1806-1816) may part of digital signal processing unit 324 shown in FIG. 3A.

As shown in FIG. 18, the head 102 includes measure channels 1802. In the exemplary case there are two input measure channels, one for a Range A and one for a Range B, each with its associated ADC. It is to be understood than any suitable number of measurement channels is possible, depending on the particular measurement and the number of ranges involved, which may be substantially greater than two (e.g., three, four, or more). The measurement channels 1802 may be obtained from measurement pod 104 via a number of variable amplifiers 720 and analog filters 1804, as shown in FIG. 18. Gain on the amplifiers 720 may be set as described in the context of gains 720a-720c in FIGS. 10-12. Channels 1802 may be combined 1806 with a range mixing signal 1808 and sent to for demodulation 1810 via lock-in, as described in more detail below with regard to FIG. 23. Demodulation may be informed by reference signals (e.g., Reference (lock-in) and Reference +90 degrees (lock-in) 1812) and subject to Digital filters 1814 for signal refinement. The digital filters 1814 can be, for example, a finite impulse response and infinite impulse response.

As shown in FIG. 18, range mixer 1808 may further provide output for Ranges and settings 1816 ultimately fed back to amplifiers 720 and analog filters 1804 to adjust gain and processing of the Measured sample signal, specifically with respect to each of Ranges A and B. This process is referred to as continuous measurement ranging and/or range mixing. Its purpose is to insure against glitches or measurement inconsistencies that might otherwise occur when the measure pod 104 must change its acquisition parameters to adjust for a change in range of the Measured sample signal. The operation of Range mixer 1808 and continuous ranging between Range A and B will be further discussed below.

Measurement pod 104 may further include digital (non-analog) circuitry capable of performing various functions, including analysis, communication of data, command information, power regulation, timing, and communication with external devices. In variations, measurement pod 104 has the capability to de-activate this non-analog circuitry while performing a measurement or providing a source signal. Doing so decreases the amount of interference and noise in the signal or measurement. For the same reason, digital signals in the measurement pod 104 may be isolated from the source pod 104 and the head 102.

Continuous Measurement Ranging

Materials measurements, particularly those performed at cryotronic temperatures and involving properties related to electronic structure, can range over decades and orders of magnitude. These wide ranges can tax traditional measurement equipment. Often different equipment is needed to measure values at different ranges. Switching between the different equipment to cover multiple ranges in a single experiment can cause glitches in measured data. A number of factors cause these glitches, for example, accuracy and gain differences between the different range measurement systems. Also, range changing can result in measurement discontinuities with time, leading to gaps in collected data. Neither case is desirable. Both degrade the overall accuracy of the measurement. To deal with these problems, variations of the M81 100, 200, and 300 have "seamless ranging" capability, as discussed below and in more detail in copending U.S. Provisional Patent Application No. 63/016,745.

Figure 19:
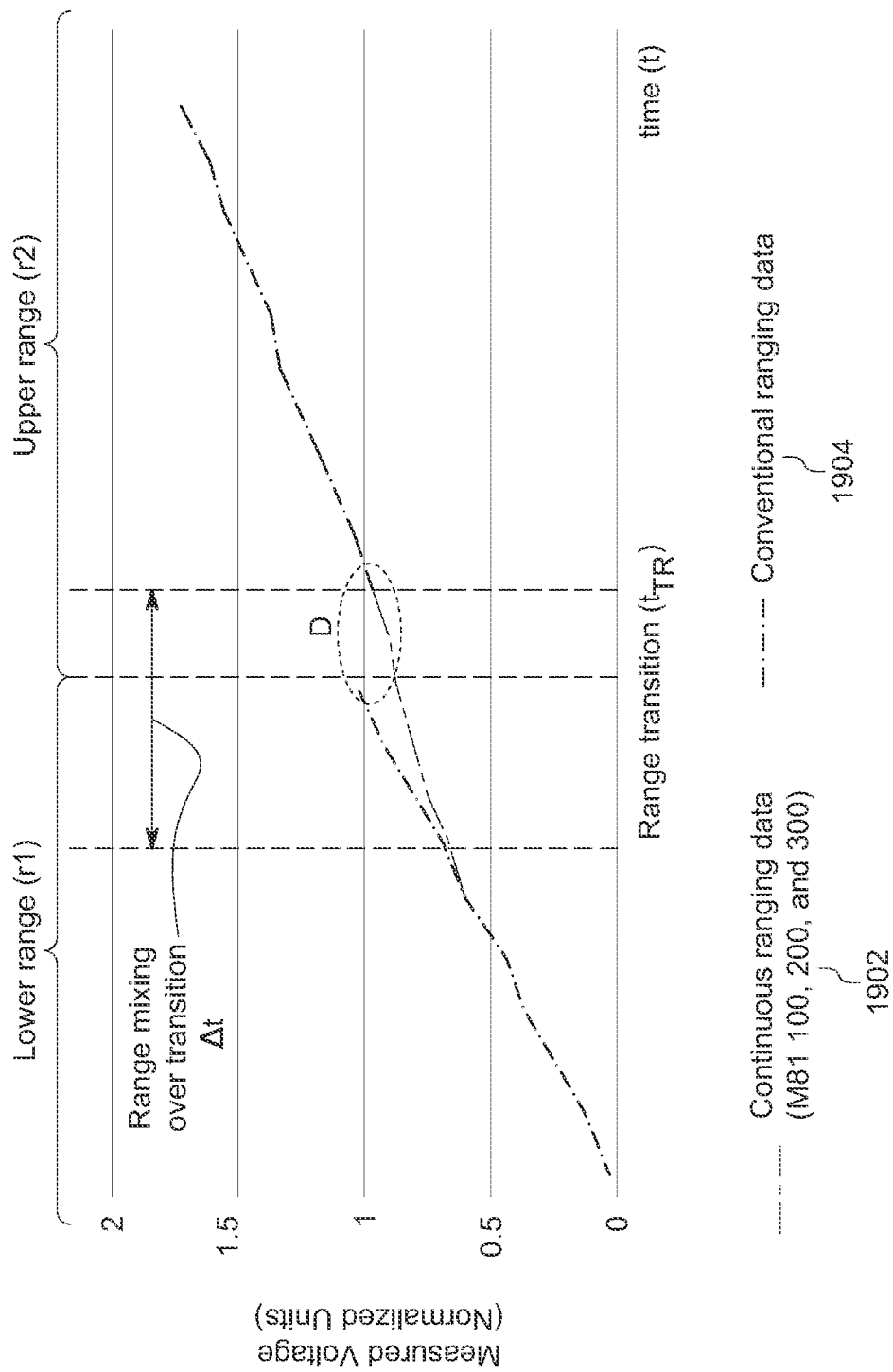
FIG. 19 compares a voltage measurement with seamless (continuous) ranging 1902 with the same measurement made by a conventional setup 1904 within the context of the present disclosure.

FIG. 19 compares a voltage measurement with seamless (continuous) ranging 1902 in M81 100, 200, and 300 with the same measurement made by a conventional setup 1904 lacking seamless ranging capabilities. FIG. 19 shows how conventional ranging 1904 creates a discontinuity D in measured data 1904 over the range transition Δt. This is because a different set of devices with different measurement profiles (e.g., accuracy, gain, etc.) are used to measure data in ranges r1 and r2. In addition, switching between ranges r1 and r2 may involve transient signals, noise, or glitches resulting from "warming up" or initiating use of the equipment dedicated to measuring over the transitioned-to range (r2 in the exemplary case shown in FIG. 19).

FIG. 19 also shows how the transition Δt can be smoothed (continuous ranging measured data 1902) by the seamless ranging capabilities included in M81 platforms/systems 100, 200, and 300. This smoothing effect is represented schematically in FIG. 19 as avoidance of discontinuity D by continuous ranging data 1902. While only two exemplary ranges, r1 and r2, are discussed in the context of FIG. 19, it is to be understood that the continuous ranging technique may apply to any suitable number of ranges relevant to a particular measurement. For example, the number of ranges may be three, four, or more, in some cases. In each of these cases, continuous ranging can be configured to ensure a smooth transition between each range change regardless of the direction of the range change (i.e., regardless of whether the range change involves an increase, as shown in FIG. 19, or decrease in the measured value (not shown)).

Continuous ranging addresses the two ranges r1 and r2 using separate signal amplification/gain chains that may be applied independently and/or concurrently. Specific implementations will be discussed below in the context of FIGS. 20 and 21. Addressing each range r1 and r2 separately and/or concurrently allows for configuration of the amplification chain for the non-active range (i.e., the range not presently employed in the measurement, e.g., range r2 when $t<t_{TR}$ or range r1 when $t>t_{TR}$) based on the data being gathered by the active amplification change. Keeping the amplification chain for the non-active range online concurrently with the active range measurement can avoid startup transients when the non-active range is finally engaged. It also allows for "range mixing," where the gain chains for each range are applied in combination in order to facilitate a smooth change in data over a transition Δt from range r1 to r2 (and vice versa). That is amplification chains from both ranges can be applied simultaneously to smooth the data over range transition Δt. This can be done, for example, via software mixer and/or can then smoothly transition from r1 to r2 and vice versa.

Figure 20:
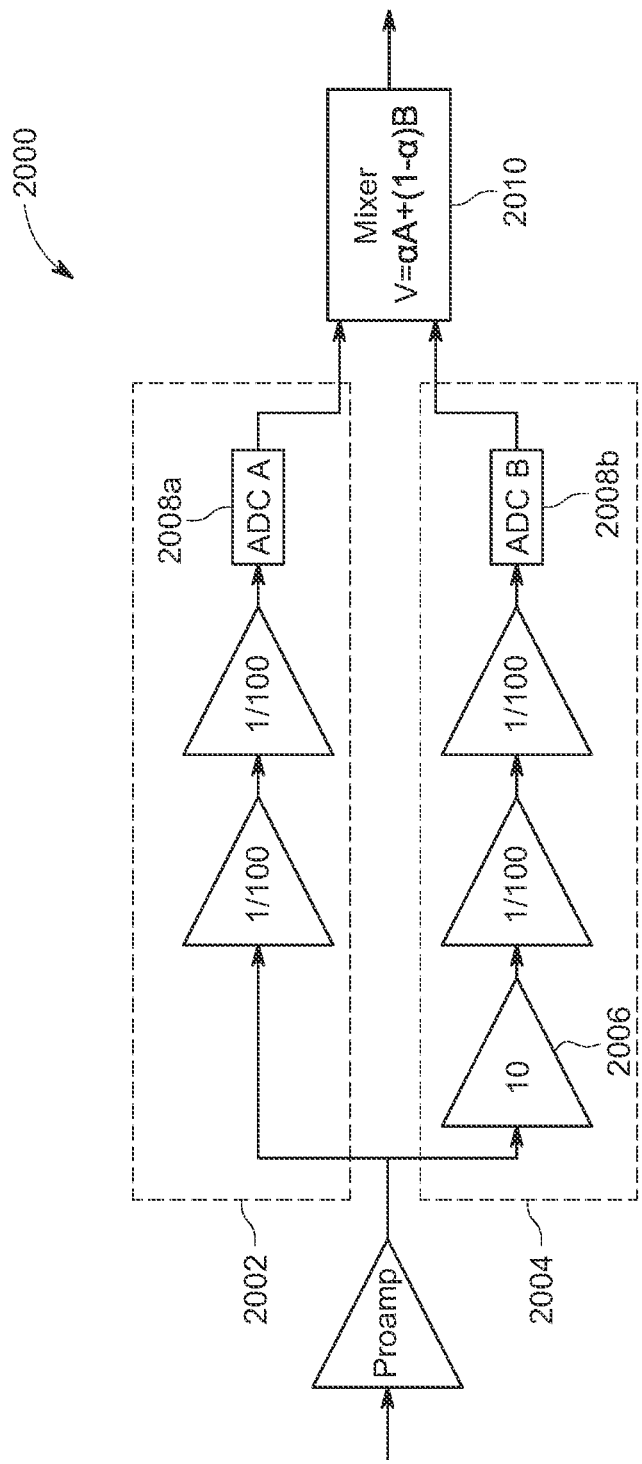
FIG. 20 is a block diagram of one variation of implementing seamless ranging 2000 via dual amplification chains within the context of the present disclosure.

FIG. 20 is one variation 2000 of implementing seamless ranging via dual amplification chains. Variation 2000 may be implemented by, for example, range mixer 1808 shown in FIG. 18.

As shown in FIG. 20, lower gain chain 2002 and higher gain chain 2004 are identical apart from 1) different ADCs (2008a and 2008b, respectively) and 2) an additional amplifier 2006 in the higher gain chain 2004, giving it a higher gain than lower gain chain 2002. Outputs from ADCs 2008a and 2008b are combined by mixer 2010 and used in the measurement pod's 104 acquisition routine for ranging measurements. In chain 2000, the combination can be weighted by a factor α. α can be chosen dynamically in order to ensure a smooth transition over ranging transition Δt (e.g., using range mixing to avoid discontinuity D in FIG. 19. α can be set by the user, but is often set by a ranging algorithm (e.g., algorithm 2200 shown in FIG. 22A).

Figure 21:
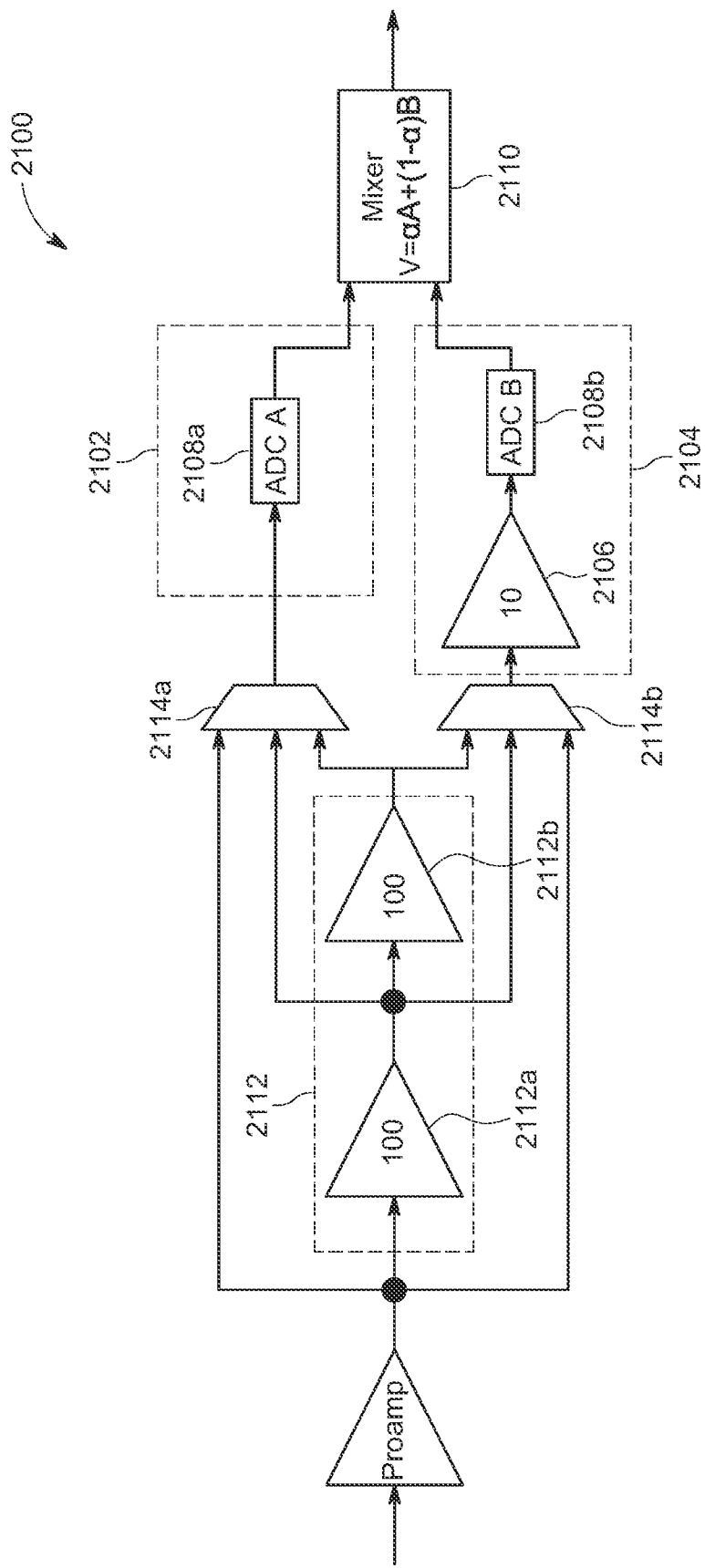
FIG. 21 shows a block diagram of another exemplary amplification chain 2100 used in seamless ranging within the context of the present disclosure.

FIG. 21 shows another exemplary amplification chain 2100 used in seamless ranging. Variation 2100 may be implemented by, for example, Range mixer 1808 shown in FIG. 18.

Chain 2100 includes lower gain portion 2102 and higher gain portion 2104, which are identical apart from 1) different ADCs (2108a and 2108b, respectively), 2) an additional amplifier 2106 in the higher gain portion 2104 giving it a higher gain that lower gain portion 2102, and 3) and lower gain portion 2102 and higher gain portion 2104 are connected to gain stages 2112 via muxes 2114a and 2114b, respectively.

As shown in FIG. 21, the amplification supplied to lower and higher gain portions 2102 and 2104 from gain stages 2112a and 2112b can be selected via muxes 2114a and 2114b, respectively. In this way, chain 2100 may use fewer dedicated amplifiers to provide the combination to mixer 2110 than chain 2000. Using the same gain stages 2112a and 2112b (and amplifiers) for lower and higher gain portions 2102 and 2104 is not just more efficient. It also introduces less noise in the system that can arise due to glitches or incompatibilities between different amplifiers. For example, each amplifier may have transients that are avoided when they are in constant use regardless of which range is being applied.

Figures 22A, 22B:
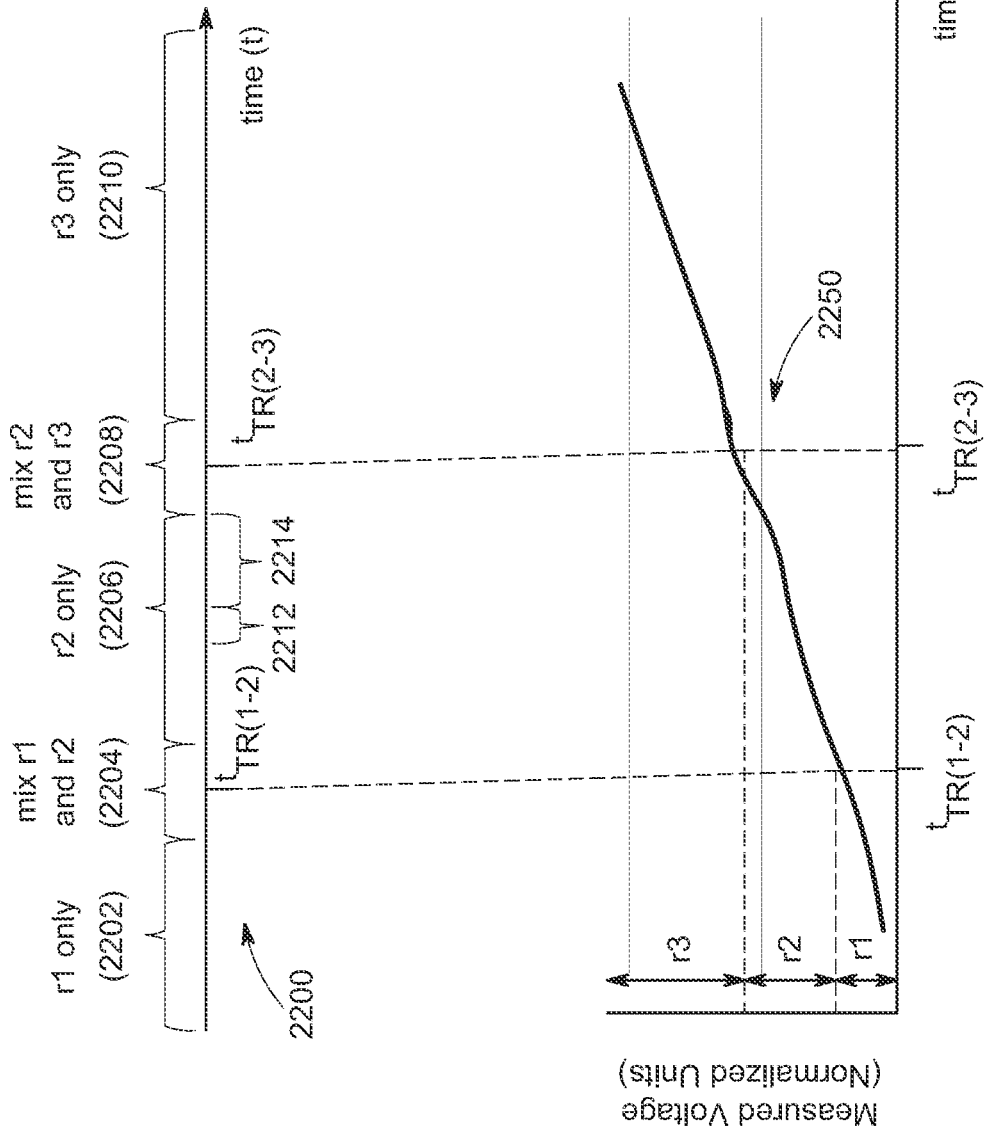
FIG. 22A provides a schematic example of an auto-ranging algorithm 2200 that may be used in conjunction with seamless ranging within the context of the present disclosure.
FIG. 22B shows exemplary experimental data used by auto-ranging algorithm 2200.

As in the case of chain 2000, the combination in chain 2100 can be weighted by a factor α. α can be chosen dynamically in order to ensure a smooth transition over ranging transition Δt (e.g., using range mixing to avoid discontinuity D in FIG. 19). α can be set by the user, but is often set by a ranging algorithm (e.g., algorithm 2200 shown in FIG. 22A).

Figure 22C:
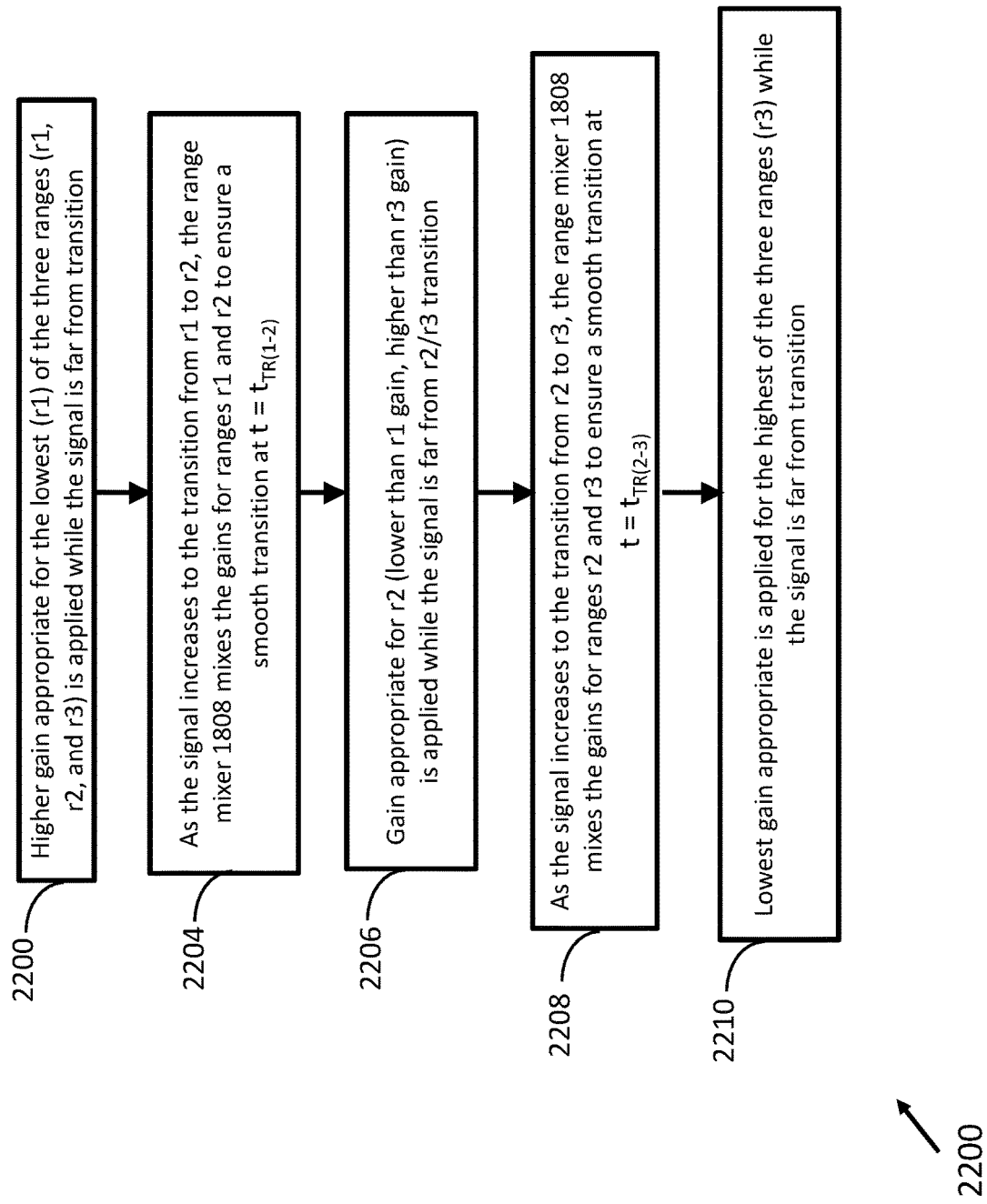
FIG. 22C is the first part of a flow chart detailing auto-ranging algorithm 2220.

In variations including chains 2000 and 2100, as well as others, seamless ranging may include auto-ranging. FIG. 22A provides a schematic example of an auto-ranging algorithm 2200 that may be used in conjunction with seamless ranging. FIG. 22C shows algorithm 2200 in the form of a flowchart. It can be implemented by range mixer 1808 in FIG. 18, among other components in digital signal processing unit 324.

The algorithm 2200 changes range as the measured signal 2250 shown in FIG. 22B changes increases from range r1, r2, and r3. Signal 2250 transitions from range r1 to r2 at t=$t_{TR}$(1-2) and from range r2 to r3 at $t_{TR(3-4)}$. FIG. 22A shows the response of the algorithm 2200, in terms of applying gain chains dedicated to ranges r1, r2, and r3, over those transitions.

As shown in FIGS. 22A and 22C, the algorithm 2200 provides a gain configured for 100% r1 (e.g., drawing from higher gain portion 2004 in chain 2000 of FIG. 20 to provide higher gain to the lower of the two ranges) during the period 2202, prior to the transition from r1 to r2 ($t_{TR(1-2)}$). FIGS. 22A and 22C also show that algorithm 2200 mixes the gain profiles for r1 and r2 as the measured signal approaches the transition $t_{TR(1-2)}$ (e.g., drawing from higher gain portion 2004 and lower gain portion 2004). This pre-transition, r1/r2 mixing period is labeled 2204. As discussed above, mixing avoids glitches and/or gaps in the data during the r1/r2 range transition. After the r1/r2 transition at $t_{TR(1-2)}$, the algorithm 2200 applies r2 gain without mixing (e.g., drawing from lower gain portion 2002 in chain 2000 of FIG. 20). FIGS. 22A, 22B, and 22C show that the algorithm changes from r2 to r3 at $t_{TR(3-4)}$ in the same way, i.e., first by mixing gain profiles for r2 and r3 during period 2208, then by providing r3 configured gain only during period 2210.

FIG. 22A also shows a region of hysteresis 2212 during period 2206 (r2 only). During hysteresis 2212, there is no anticipated ranging (i.e., only one gain portion of the gain chain is active, in this case the gain chain for r2). This avoids switching back and forth between ranges due to noise or signal variation. Once the measured signal 2250 edges closer to r3, the hysteresis period 2212 ends. Period 2214 represents a period in which a range change from r2 to r3 is anticipated by engaging the gain chain (not shown) for r3. The gain chain corresponding to r3 is engaged during 2214 both for the purposes of calibration and to avoid transients, as discussed above. Although no hysteresis or anticipation of range up portions are shown for the r1/r2 transition, it is to be understood that they may be applied to that transition as well.

Though FIG. 22A shows operation of algorithm 2200 as the measured signal increases, it is to be understood that the algorithm applies the same way with the measurement signal decreases (e.g., from higher range r3 to lower range r2, then to lowest range r1). This is shown via flowchart 2220 in FIG. 22D. In this case, the algorithm 2200 would have anticipate range down periods rather than anticipate range up periods (e.g., transitioning downward from r3 to r2 at $t_{TR(2-3)}$ (step 2224 in chart 2220), etc.). Although FIGS. 22A, 22B, and 22C show algorithms 2200 and 2220 handling range changes among three exemplary ranges r1, r2, and r3, it is to be understood that it may handle range changes among any number of ranges suitable for the experiment in the same manner. Other variations of algorithms 2200 and 2220 can include many other algorithms and/or range/parameter settings and any suitable number of range transitions.

Lock-in Measurement

Figure 23:
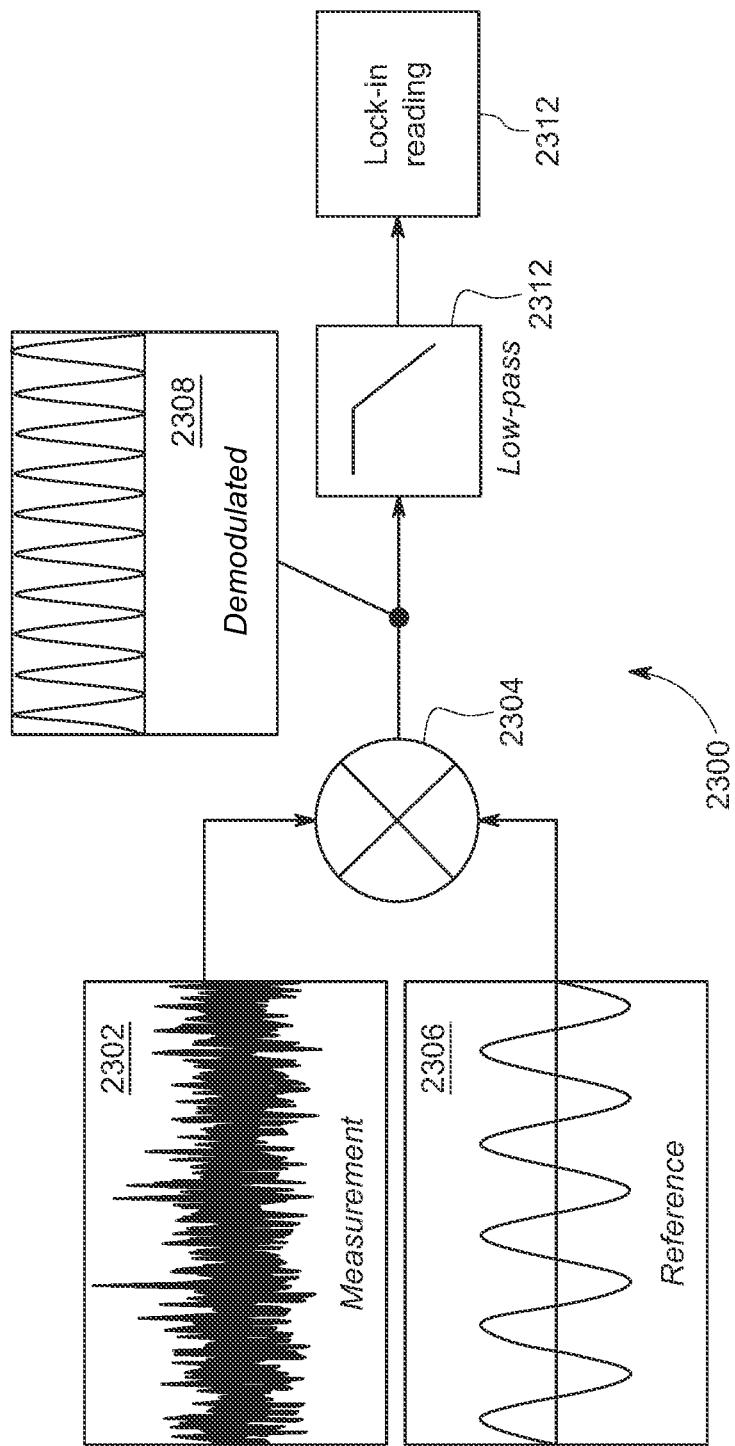
FIG. 23 illustrates lock-in technique for multiplying 2304 a measured signal 2302 by a known reference source 2306 to create demodulated signal 2308 within the context of the present disclosure.

M81 100, 200, and 300 variations can include heads 102 with lock-in measurement capabilities to, among other things, accurately extract measurements from noisy measurement signals. FIG. 23 shows one exemplary variation 2300 that may be implemented by the digital signal processing unit 324. In variation 2300, a measured signal 2302 can be multiplied 2304 by a known reference source 2306 to create demodulated signal 2308. After demodulation, a low pass filter 2310 can remove noise and generate reading 2312.

In one exemplary implementation, sample 110 resistance R1 can be measured by sourcing AC current and measuring voltage 2302. Multiplying 2304 the measured voltage readings 2302 by the current source 104 output as a reference signal 2306 can allow extraction of only the voltage produced by the current through the resistance R1 via the lock-in technique of FIG. 23.

The lock-in technique 2300 takes advantage of the following signal processing concepts. Signal multiplication lends itself to signal extraction in this case because multiplying two repeating signals with different frequencies ($\omega_r \neq \Omega_m$) averages to zero:

$$\int \sin(\omega_r t) * \sin(\omega_m t) = 0, \omega_r \neq \omega_m$$

When the multiplied signals have the same frequency ($\omega_r = \omega_m$), however, the product of the signals will average to half of the signal amplitude:

$$\int \sin(\omega_r t) * \sin(\omega_m t) = \frac{1}{2}, \omega_r = \omega_m$$

Therefore, the lock-in technique 2300 of FIG. 23 can be used to isolate measurement signals 2302 from interference and noise that does not include the reference 2306 signal.

Figure 24:
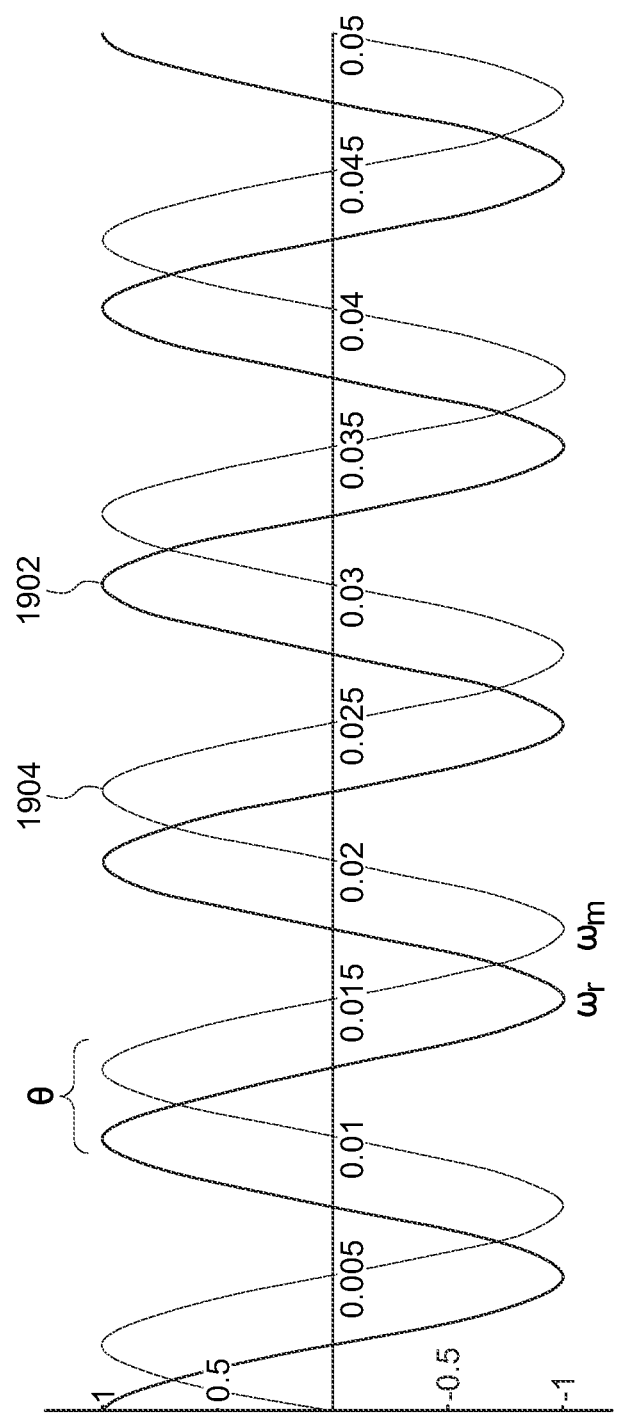
FIG. 24 shows a phase difference (θ) between multiplied signals.

M81 100, 200, and 300 variations can also demodulate harmonics (i.e., multiples of the reference frequency) for signal extraction. This is particularly useful when there is a phase difference (θ) between signals, as shown in FIG. 24 for signals 1902 and 1904.

If a phase difference θ exists between the reference signal and the measured signal (FIG. 24), the value of a single lock-in reading depends on θ:

$$\int \mathrm{Sin}(\omega_r t) * \sin(\omega_m t + \theta) = \frac{1}{2}\cos(\theta), \omega_r = \omega_m$$

M81 100, 200, and 300 variations can interpret this phase dependence by using a demodulation phase shift that matches θ. The demodulation phase shift proceeds as follows. First, a two-phase measurement determines the amount of phase difference. The measured signal can be multiplied by both the reference and a 90-degree phase shifted reference. This produces an in-phase (I) and out-of-phase (Q) signal portion:

$$I = \int \sin(\omega_r t) * \sin(\omega_m t + \theta) = \frac{1}{2}\cos(\theta), \omega_r = \omega_m \quad (1)$$

$$Q = \int \sin(\omega_r t + 90°) * \sin(\omega_m t + \theta) = \frac{1}{2}\sin(\theta), \omega_r = \omega_m \quad (2)$$

The amount of phase difference can then be calculated using (1) and (2):

$$\theta = \arctan\left(\frac{I}{Q}\right) \quad (3)$$

The phase difference calculated via (3) can be applied as a demodulation phase φ to the reference signal. This brings the reading in-phase and the zeros the out-of-phase component:

$$\int \sin(\omega_r t + \varphi) * \sin(\omega_m t + \theta) = \frac{1}{2}, \omega_r = \omega_m, \varphi = \theta \quad (4)$$

M81 100, 200, and 300 variations can automatically calculate and apply the demodulation phase.

Figure 25:
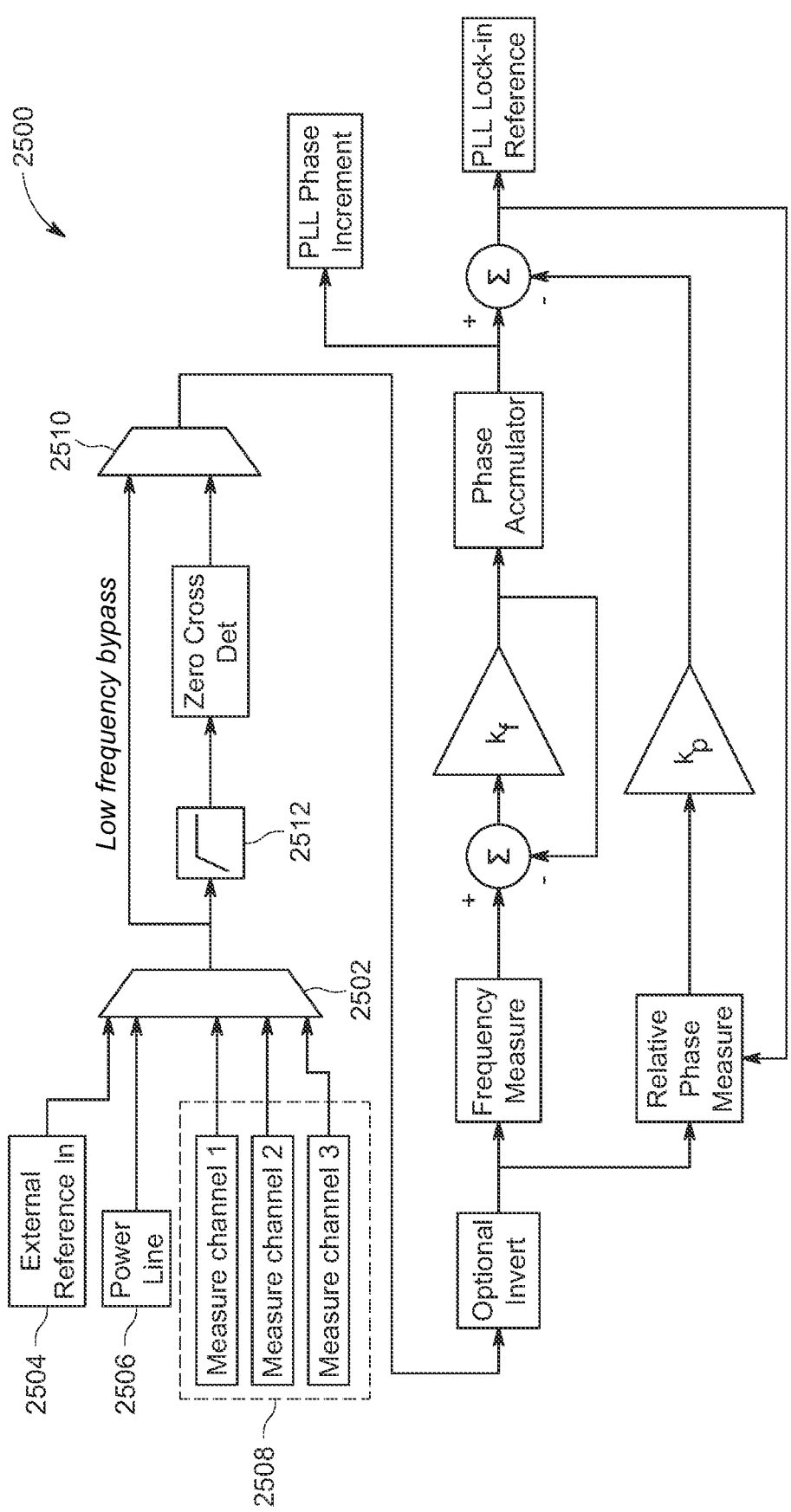
FIG. 25 shows how the M81 100, 200, and 300 variations can also utilize a phase lock loop (PLL) 2500.

FIG. 25 shows how the head 102 can also use a phase lock loop (PLL) 2500 for attaining the reference to be supplied to 2300. PLL 2500 may be part of digital signal processing unit 324.

A reference is selected (either by a user or algorithm) via mux 2502 from one of an external signal 2504, a power line frequency 2506, and/or one of the three measure channel signals 2508. In some variations, the user can bypass 2510 the high pass filter 2512 to apply low frequency signals. The user can choose to invert (180° shift) the incoming signal.

In variations of PLL 2500, one signal can be used to generate a reference at a given time. PLL 2500 can ensure that the frequency and phase of the reference matches that of the incoming signal. Independent frequency ($k_f$) and phase control loops ($k_p$) can track changes with the incoming signal. High pass filter 2512 can allow locking in on a reference square wave or an AC signal+/−5V. Mux 2502 can choose one of the measurement channels as a reference.

Figure 26:
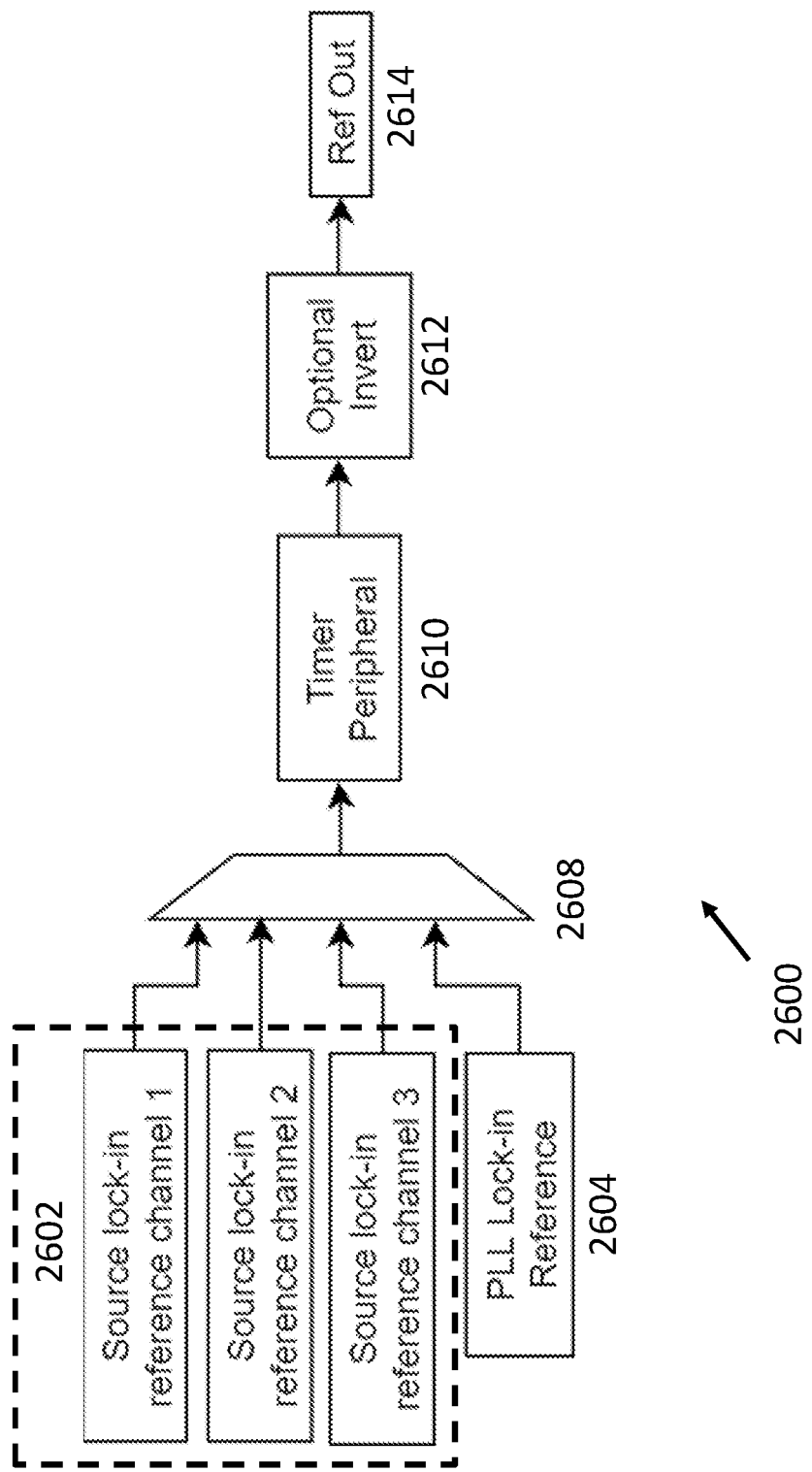
FIG. 26 shows an exemplary reference out 2600 within the context of the present disclosure.

M81 100, 200, and 300 variations can utilize a reference out. One exemplary reference out 2600 is shown in FIG. 26. Reference out 2600 may be implemented by digital signal processing unit 324.

A user can choose to output one of the source references 2602 or the PLL reference 2604 via mux 2608. A timer peripheral 2610 (e.g., a trigger after a certain amount of time or clock cycles) or other timing device can generate the signal synchronized with the sampling clock (e.g., shared synchronizing clock 302 in FIG. 3A). In some variations, the user can also choose to invert the signal via optional inverter 2612. In variations, one reference signal can be sent out at a time.

Figure 27:
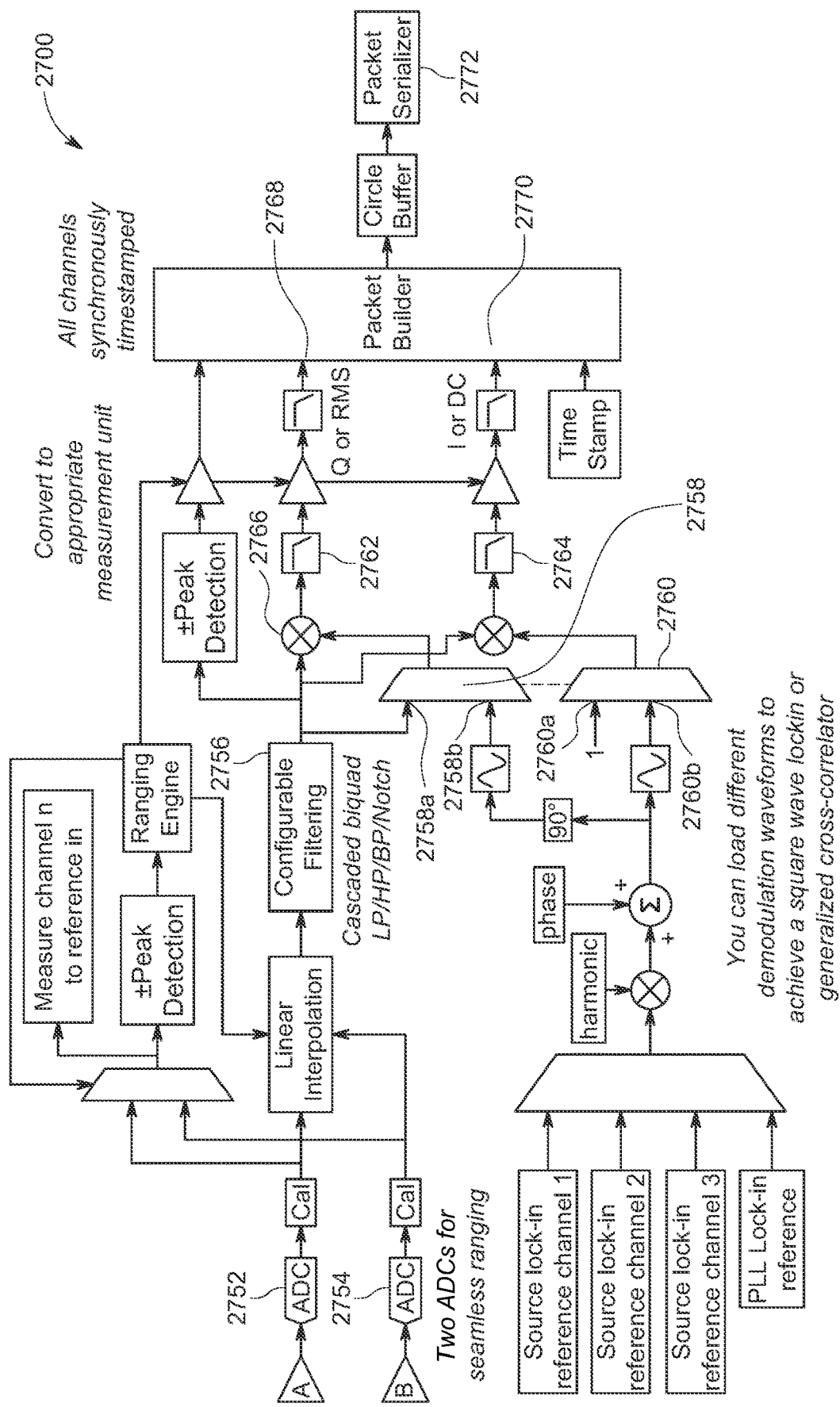
FIG. 27 shows how M81 100, 200, and 300 variations can utilize a measure digital signal processor (DSP) 2700.

M81 100, 200, and 300 variations can utilize a measure digital signal processor/processing (DSP) implemented by the digital signal processing unit 324. One exemplary variation 2700 is shown in FIG. 27. For example, regarding the signal in, the A and B measurement channels can be read by two independent ADCs 2552 and 2554, respectively. The signals sent to ADCs 2552 and 2554 can be interpolated for seamless ranging, as described in detail above in the context of FIGS. 19-22C.

The larger of the two signals and B can be sent to a PLL, such as PLL 2500 described in the context of FIG. 25. Peak detection can be used to make auto-ranging decisions in seamless ranging algorithms, such as algorithm 2200 described in FIGS. 22A and 22c, and/or algorithm 2220 in FIG. 22C. Optional/configurable digital filters 2756 may be applied to the measurement. In one variation, the filter is a cascaded biquad that can be configured for low pass, high pass, band pass, or notch filtering. In some variations, when doing AC/DC measurements, switches 2758 and 2760 can select their upper signals 2758a and 2760a, respectively. This causes the measurement to be multiplied by itself in multiplier 2762 and multiplied by one (i.e., unchanged) in multiplier 2764. After averaging, the top signal 2768 is the RMS measurement reading from A and B. The bottom signal 2770 is the DC reading. Peak detection 2766 can remain the same regardless of what type of measurement is made. Measurements can be converted to appropriate units based on the type of pod and its range.

Regarding variations with PLL 2500, the user can choose which reference signal to use and also set the demodulation harmonic and phase. Two waveforms can be generated from the reference. For example, as shown in FIG. 24, waveforms 1902 and 1904 are 90° out of phase. In variations with lock-in measurement, the switches 2758 and 2760 are select their lower signals, i.e., 2758b and 2760b. After averaging, the top signal 2768 is the Q (quadrature) indication and the bottom signal 2770 is the I (in phase) indication (Equations 2 and 1 above, respectively). Packet builder 2772 can synchronously timestamp signals, synchronized via shared synchronizing clock 302, and buffered them out to the rest of the head 102.

M81 100, 200, and 300 System Integration

Figure 28B:
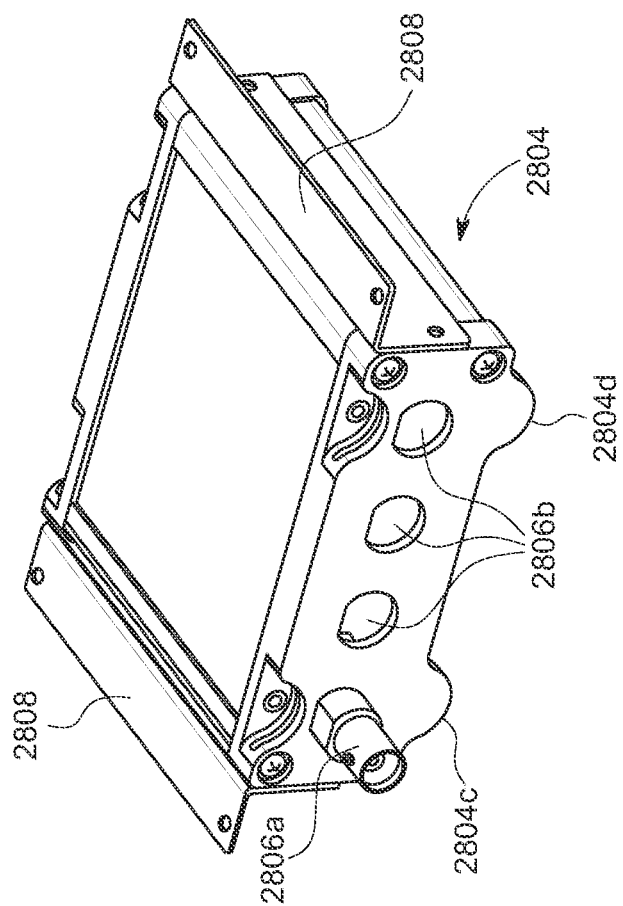
FIG. 28B illustrates a housing for source/measure pods 104.
Figure 28A:
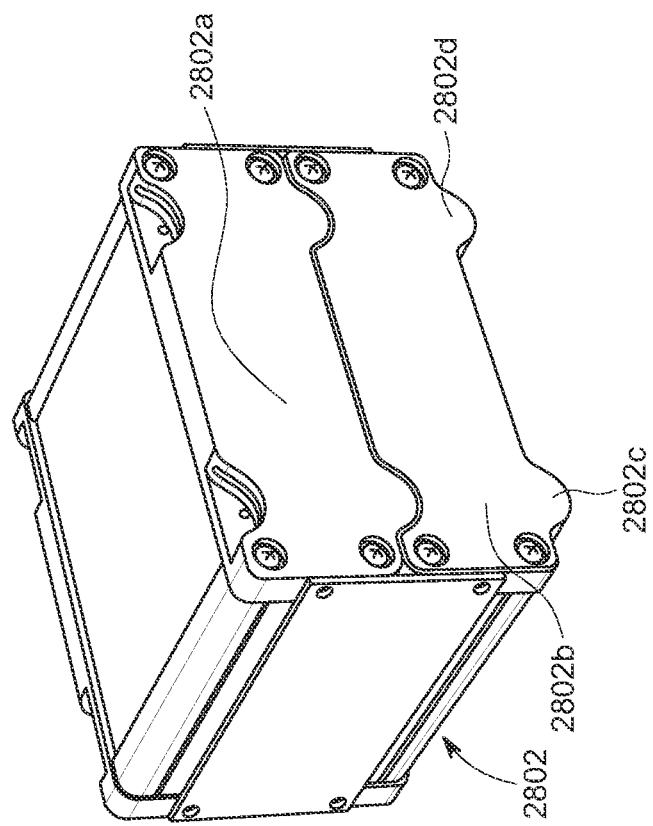
FIG. 28A illustrates a housing for source/measure pods 104.

As integrated systems, variations of M81 100, 200, and 300 variations can include pod mountings, such as mountings 2802 and 2804 shown in FIGS. 28A and 28B, respectively. FIG. 28A shows how the mountings 2802 and 2804 can have two halves (e.g., halves 2802a and 2802b) and fit together in a clamshell configuration. Other configurations are also possible and within the context of the present disclosure. The mountings 2802 and 2804 can comprise materials for electrostatic shielding (e.g., plastic, resin, rubber, etc.) mountings 2802 and 2804 can comprise materials for magnetic shielding such as steel, mu metal, or other magnetic alloys. Pods 104 can stack together and rack mount via housings 2802 and 2804.

These mountings generally include a number of through connections, such as BNC connection 2806a in FIG. 28B. Even though only a BNC connection 2806a is shown, it is to be understood that any number of suitable connections are available. FIG. 28B shows a number of additional through holes 2806b that may accommodate such connections. Through holes 2806b may be occupied by the connections. They may also be vacant and have a cap to prevent internal exposure, as shown in FIG. 28b. Suitable connections include coax type, triax types, etc. As shown in FIG. 28B, mountings 2802 and 2804 may also include slide mounts 2808 for mounting onto a fixture, such as a rack or section of a sample stage (e.g., sample stage 106 in FIG. 1). Although slide mounts 2808 are shown in the figures, it is to be understood than suitable mounting system (e.g., bolt, snap-fit, guide rails, screws, etc.) may be used. FIGS. 28A and 28B also show feet (2802c, 2802d, 2804c, and 2804d) on which the mountings 2802 and 2804 can stand.

Figure 29A:
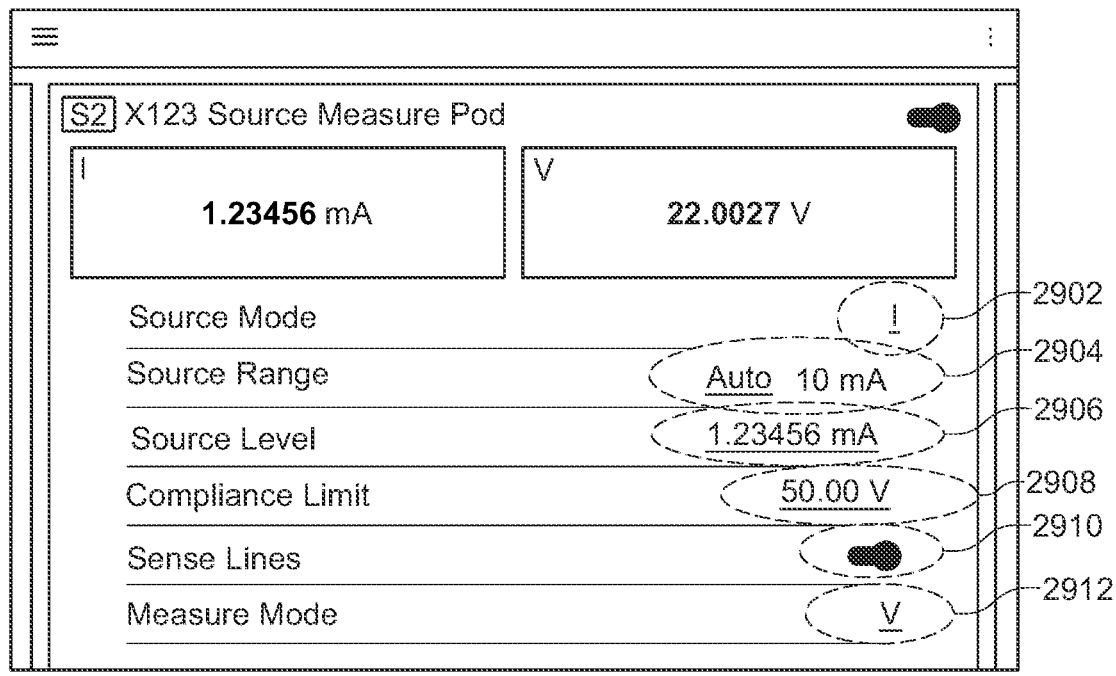
FIG. 29A an exemplary display for head 102.
Figure 29B:
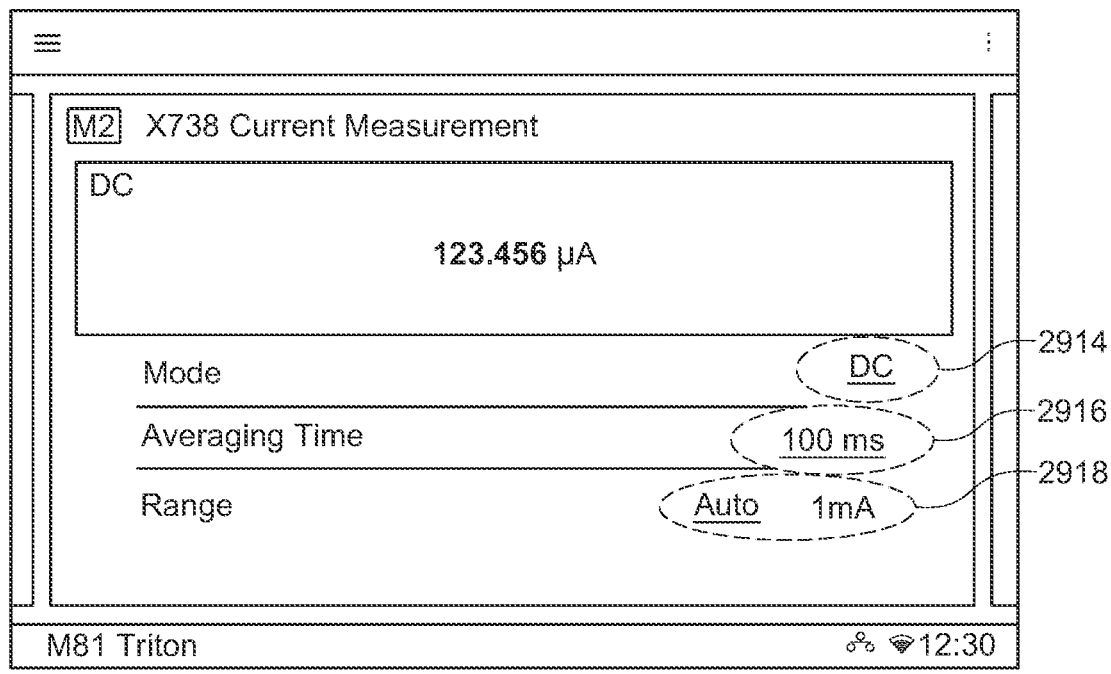
FIG. 29B another exemplary display for head 102.

FIGS. 29A and 29B show detail of touch screen 102c in source (FIG. 29A) and measurement (FIG. 29B) configurations. It is to be understood that, while source and measure configurations are shown separately in FIGS. 29A and 29B, they need not be separate. Source and measurement configurations can be shown at the same time and on the same screen 102c with each other, as well as with other indicators, diagnostics, or information disclosed herein. As an example, head 102 may include an oscilloscope functionality and display a waveform on the same screen 102c as the measure and source displays of FIGS. 29A and 29B.

Since 102c is a touch screen, various elements on FIGS. 29A and 29B may be adjusted by touch input. For example, FIG. 29A shows how the source mode 2902 may be adjusted from touch (e.g., to change from I (current) to V (voltage)). FIG. 29A shows how the source range 2904, source level 2906, compliance limit 2908, sense lines 2910, and measure mode 2912 can all be adjusted by touch. FIG. 29B shows how the measurement mode 2914, averaging time 2916, and range 2918. Additionally, screen 102c can allow input current and voltage (shown in FIGS. 29A and 29B). Generally, any measurements and settings described herein can be viewed and configured via a front panel touch screen 102c, whether explicitly shown in FIGS. 29A and 29B or not.

While various inventive aspects, concepts and features of the inventions may be described and illustrated herein as embodied in combination in the exemplary embodiments, these various aspects, concepts and features may be used in many alternative embodiments, either individually or in various combinations and sub-combinations thereof. Unless expressly excluded herein all such combinations and sub-combinations are intended to be within the scope of the present inventions. Still further, while various alternative embodiments as to the various aspects, concepts and features of the inventions—such as alternative materials, structures, configurations, methods, circuits, devices and components, software, hardware, control logic, alternatives as to form, fit and function, and so on—may be described herein, such descriptions are not intended to be a complete or exhaustive list of available alternative embodiments, whether presently known or later developed. Those skilled in the art may readily adopt one or more of the inventive aspects, concepts or features into additional embodiments and uses within the scope of the present inventions even if such embodiments are not expressly disclosed herein. Additionally, even though some features, concepts or aspects of the inventions may be described herein as being a preferred arrangement or method, such description is not intended to suggest that such feature is required or necessary unless expressly so stated. Still further, exemplary or representative values and ranges may be included to assist in understanding the present disclosure, however, such values and ranges are not to be construed in a limiting sense and are intended to be critical values or ranges only if so expressly stated. Still further, exemplary or representative values and ranges may be included to assist in understanding the present disclosure, however, such values and ranges are not to be construed in a limiting sense and are intended to be critical values or ranges only if so expressly stated. Parameters identified as "approximate" or "about" a specified value are intended to include both the specified value and values within 10% of the specified value, unless expressly stated otherwise. Further, it is to be understood that the drawings accompanying the present application may, but need not, be to scale, and therefore may be understood as teaching various ratios and proportions evident in the drawings. Moreover, while various aspects, features and concepts may be expressly identified herein as being inventive or forming part of an invention, such identification is not intended to be exclusive, but rather there may be inventive aspects, concepts and features that are fully described herein without being expressly identified as such or as part of a specific invention, the inventions instead being set forth in the appended claims. Descriptions of exemplary methods or processes are not limited to inclusion of all steps as being required in all cases, nor is the order that the steps are presented to be construed as required or necessary unless expressly so stated.

We claim:

1. A measurement system comprising:
   a source unit configured to provide a source signal to a sample, the source unit comprising:
   at least one of a voltage source and a current source; and
   a memory configured to store a source calibration;
   a measurement unit configured to acquire from the sample a measurement signal responsive to the source signal, the measurement unit comprising:
   at least one of a voltage measuring unit, a current measuring unit, and a capacitance measuring unit; and
   a memory configured to store a measurement calibration; and
   a control unit comprising:
   a digital signal processing unit;
   a source converter connected between the digital signal processing unit and the source unit;
   a measurement converter connected between the digital signal processing unit and the measurement unit;
   a synchronization unit configured to synchronize clocks of the digital signal processing unit, the source converter, and the measurement converter;
   a calibration unit for calibrating the system; and
   a reference voltage supply configured to supply a common reference voltage for the control unit, wherein the control unit is configured to:
   calibrate a measurement channel against the common reference voltage;
   command the source unit to apply a positive signal in place of the source signal;
   measure, via the calibrated measurement channel, the commanded positive signal to yield a measured positive signal;

command the source unit to apply a negative signal in place of the source signal;
measure, via the calibrated measurement channel, the applied negative signal to yield a measured negative signal;
command the source unit to apply a zero signal in place of the source signal;
measure, via the calibrated measurement channel, the applied zero signal to yield a measured zero signal; and
generate a source unit calibration based on a difference between a first signal and a second signal, wherein:
the first signal comprises at least one of the commanded positive signal, the commanded negative signal, and the commanded zero signal; and
the second signal comprises at least one of the measured positive signal, the measured negative signal, and the measured zero signal.

2. The system of claim 1, wherein the control unit is configured to obtain at least one of:
calibration data from a self-calibration performed by the source unit and the measurement unit;
calibration data from a stored factory calibration;
calibration data from a remote source via the Internet;
calibration data from a user input;
the source calibration data from the source unit; and
the measurement calibration data from the measurement unit.

3. The system of claim 1, wherein the control unit is configured to obtain at least one of:
the source calibration and the measurement calibration periodically;
the source calibration from the memory of the source unit after the source unit is controlled not to provide the source signal to the sample;
the measurement calibration from the memory of the measurement unit after the measurement unit is controlled not to acquire a measurement signal from the sample; and
the source calibration and the measurement calibration concurrently.

4. The system of claim 1, wherein at least one of:
the digital signal processing unit stores calibration data for at least one of the control unit, the source unit, and the measurement unit;
the measurement and the source units are remotely located from the control unit and the digital signal processing unit;
the system comprises a first cable connecting the control unit to the measurement unit and a second cable connecting the control unit to the source unit;
digital signals in at least one of the measurement unit and the source unit are isolated from the control unit;
a measurement interface between the measurement unit and the control unit and a source interface between the source unit and the control unit are isolated from one another within a cable;
the system comprises a plurality of source units;
the system comprises a plurality of measurement units;
the source unit is configured to acquire the measurement signal; and
the measurement unit is configured to provide the source signal.

5. The system of claim 1, wherein the current source is configured to measure a source current associated with the source signal via a sensing resistor and vary a resistance range of the sensing resistor according to a magnitude of the source current.

6. The system of claim 5 further comprising at least one of:
a current source protection unit configured to determine whether the source current exceeds a threshold current and when the source current exceeds the threshold current, alter a feedback element of at least one of the source unit and the measurement unit so that the source current falls below the threshold current; and
a voltage source protection unit configured to determine whether a source voltage exceeds a threshold voltage and when the source voltage exceeds the threshold voltage, alter a feedback element of at least one of the source unit and the measurement unit so that the source voltage falls below the threshold voltage.

7. The system of claim 1, wherein the synchronization unit is configured to synchronize the digital signal processing unit, the source converter, and the measurement converter with respect to an internal clock signal.

8. The system of claim 1, wherein the digital signal processing unit is configured to provide timestamps for at least one of the measurement signal and the source signal.

9. The system of claim 1, wherein at least one of:
the source unit is configured to deactivate non-analog circuitry in response to the source signal being provided; and
the measurement unit is configured to deactivate non-analog circuitry in response to the measurement signal being measured.

10. The system of claim 1, wherein the digital signal processing unit is configured to perform at least one of the following with respect to at least one of the measurement and the source signal:
a lock-in analysis;
an Alternating Current/Direct Current (AC/DC) measurement;
an inductance (L), a capacitance (C), and a resistance (R) (LCR) measurement;
a time/scope domain presentation;
a frequency domain analysis;
a noise analysis;
an AC/DC sourcing;
a control looping; and
providing the source signal from more than one source.

11. The system of claim 1, comprising at least one of:
an interface between the source unit and the control unit comprising low impedance buffered analog signals;
an interface between the measurement unit and the control unit comprising a voltage mode analog signal interface with low impedance transmitting and high impedance receiving circuitry; and
an interface between the measurement unit and the control unit comprising a current mode analog signal interface with high output impedance transmitting and low impedance receiving circuitry.

12. The system of claim 1, wherein at least one of:
the system comprises a power supply is configured to supply power to the control unit, the source unit, and the measurement unit referenced to a common ground;
the system comprises a power supply filter to at least one of the measurement unit and the source unit; and
at least one of the measurement unit and the source unit is powered from at least one of an isolated power converter from the control unit, an isolated external power source, and battery power.

13. The system of claim 1, wherein at least one of the source converter and the measurement converter comprises:
   a gain chain configured to amplify an analog input signal;
   a range selector configured to select a gain between the analog input signal and the multiple analog-to-digital converter (ADC) outputs, wherein each ADC output has a path, and a gain of each output path is made up of gain stages in the gain chain; and
   a mixer configured to combine the multiple ADC outputs into a single mixed output.

14. The system of claim 1, wherein the source converter comprises:
   two or more digital-to-analog converters (DAC) combined to generate one or more frequency components;
   a first path for generating low frequency signals, the first path comprising a first one of the DACs;
   a second path for generating high frequency signals, the second path comprising a second one of the DACs;
   a data processor for processing an input signal;
   a combining circuit configured to combine outputs of the first path and the second path into the source signal;
   a feedback portion configured to sense the source signal; and
   a servo loop configured to employ the feedback portion to maintain the source signal with respect to the input signal.

15. The system of claim 1, wherein the digital signal processing unit is configured to perform lock-in signal processing and wherein the lock-in signal processing unit is configured to at least one of:
   be synchronized with the synchronization unit;
   process at least one of a fundamental frequency and a harmonic frequency; and
   provide a lock-in reference for communication between the control unit and at least one of the source unit and the measurement unit.

16. The system of claim 1, wherein the control unit is configured to measure a parameter of the source signal using a feedback signal that is one of a DC signal and a low frequency AC signal.

17. The system of claim 1, wherein the control unit is configured to assess a type of at least one of the measurement unit and the source unit and configure the digital signal processing unit according to the type.

18. The system of claim 1, further comprising at least one of:
   an enclosure for at least one of the source unit and the measurement unit, the enclosure comprising at least one of electrostatic shielding and magnetic shielding; and
   a configurable display that is configured to display at least one of:
      real time oscilloscope readings; and
      frequency spectrum readings.

19. The system of claim 1, wherein the control unit is configured to perform at least one of:
   a voltage measure mode calibration for a measurement unit by:
      measuring an offset error at the measurement unit;
      storing the offset error in the memory of the measurement unit;
      connecting an amplifier associated with the measurement unit to a reference voltage;
      measuring, via the control unit, a gain error from applying the reference voltage to the amplifier;
      storing the measured gain error in the memory of the measurement unit;
      reading, via the control unit, at least one of the stored gain error from the memory of the measurement unit; and
      applying at least one of the offset error and the gain error to correct a voltage measurement; and
   a current mode measure calibration for the measurement unit by:
      disconnecting input connectors of the control unit;
      connecting input connectors of the measurement unit to ground;
      configuring the measurement unit in a voltage measure mode;
      measuring voltage offset errors of an amplifier via the measurement unit in voltage measure mode;
      applying an analog correction to decrease the measured voltage offset errors;
      switching the measurement unit to a current measure mode and floating inputs to the measurement unit;
      determining, via the control unit, voltage offset errors between the measurement unit and the control unit by configuring the measurement unit in a high current range and measuring a resultant voltage at the control unit;
      adjusting a leakage current until a current measurement of the measurement unit is decreased;
      storing, via the control unit, at least one of the adjusted leakage current and the voltage offset errors in the memory of the measurement unit;
      reading, via the control unit, at least one of the adjusted leakage current and the voltage offset errors; and
      applying at least one of the adjusted leakage current and the voltage offset errors to correct a current measurement of the measurement unit.

20. A method comprising:
providing a source signal to a sample via a source unit comprising:
   at least one of a voltage source and a current source;
   a memory configured to store a source calibration;
acquiring from the sample a measurement signal responsive to the source signal via a measurement unit, the measurement unit comprising:
   at least one of a voltage measuring unit, a current measuring unit, and a capacitance measuring unit;
   a memory configured to store a measurement calibration; and
receiving the measurement signal from the measurement unit by a control unit, the control unit comprising:
   a digital signal processing unit;
   a source converter connected between the digital signal processing unit and the source unit;
   a measurement converter connected between the digital signal processing unit and the measurement unit;
   a synchronization unit configured to synchronize clocks of the digital signal processing unit, the source converter, and the measurement converter;
   a calibration unit for calibrating aspects of the system including the control unit; and
   a reference voltage supply configured to supply a common reference voltage for the control unit;
calibrating, via the control unit, a measurement channel against the common reference voltage;
commanding, via the control unit, the source unit to apply a positive signal in place of the source signal;
measuring, via the calibrated measurement channel, the commanded positive signal to yield a measured positive signal;

commanding, via the control unit, the source unit to apply a negative signal in place of the source signal;

measuring, via the calibrated measurement channel, the applied negative signal to yield a measured negative signal;

commanding, via the control unit, the source unit to apply a zero signal in place of the source signal;

measuring, via the calibrated measurement channel, the applied zero signal to yield a measured zero signal; and generating, via the control unit, a source unit calibration based on a difference between a first signal and a second signal, wherein:

the first signal comprises at least one of the commanded positive signal, the commanded negative signal, and the commanded zero signal; and the second signal comprises at least one of the measured positive signal, the measured negative signal, and the measured zero signal.

* * * * *